United States Patent
Bleeker et al.

(10) Patent No.: US 11,942,302 B2
(45) Date of Patent: Mar. 26, 2024

(54) PULSED CHARGED-PARTICLE BEAM SYSTEM

(71) Applicant: ASML Netherlands B.V., Veldhoven (NL)

(72) Inventors: Arno Jan Bleeker, Westerhoven (NL); Pieter Willem Herman De Jager, Middelbeers (NL); Maikel Robert Goosen, Eindhoven (NL); Erwin Paul Smakman, Eindhoven (NL); Albertus Victor Gerardus Mangnus, Eindhoven (NL); Yan Ren, Eindhoven (NL); Adam Lassise, Den Bosch (NL)

(73) Assignee: ASML Netherlands B.V., Veldhoven (NL)

( * ) Notice: Subject to any disclaimer, the term of this patent is extended or adjusted under 35 U.S.C. 154(b) by 341 days.

(21) Appl. No.: 17/361,119

(22) PCT Filed: Dec. 17, 2019

(86) PCT No.: PCT/EP2019/085706
§ 371 (c)(1),
(2) Date: Jun. 28, 2021

(87) PCT Pub. No.: WO2020/136044
PCT Pub. Date: Jul. 2, 2020

(65) Prior Publication Data
US 2023/0154722 A1 May 18, 2023

Related U.S. Application Data

(60) Provisional application No. 62/942,671, filed on Dec. 2, 2019, provisional application No. 62/786,268, filed on Dec. 28, 2018.

(51) Int. Cl.
*H01J 37/09* (2006.01)
*H01J 37/147* (2006.01)
(Continued)

(52) U.S. Cl.
CPC ........ *H01J 37/1474* (2013.01); *H01J 37/244* (2013.01); *H01J 37/265* (2013.01);
(Continued)

(58) Field of Classification Search
CPC ...... H01J 37/00; H01J 37/0174; H01J 37/244; H01J 37/26; H01J 37/265; H01J 37/28;
(Continued)

(56) References Cited

U.S. PATENT DOCUMENTS

| 2014/0097342 A1 | 4/2014 | Tsuno et al. |
| 2016/0005566 A1 | 1/2016 | Zewail et al. |

(Continued)

FOREIGN PATENT DOCUMENTS

| GB | 2017940 A | 10/1979 |
| JP | S 4913424 | 3/1974 |

(Continued)

OTHER PUBLICATIONS

Hassan, Mohammed Th., "Attomicroscopy: from Femtosecond to Attosecond Electron Microscopy," arxiv.org, Cornell University Library, 201 Olin Library Cornell University Ithaca, NY 14853, Jan. 13, 2018 (Jan. 13, 2018), XP081206280, DOI: 10.1088/1361-6455/AAA 183 (57 pgs.).

(Continued)

*Primary Examiner* — Jason L McCormack
(74) *Attorney, Agent, or Firm* — Finnegan, Henderson, Farabow, Garrett & Dunner, LLP

(57) ABSTRACT

Apparatuses and methods for charged-particle detection may include a deflector system configured to direct charged-particle pulses, a detector having a detection element configured to detect the charged-particle pulses, and a controller having a circuitry configured to control the deflector system to direct a first and second charged-particle pulses to the detection element; obtain first and second timestamps asso- (Continued)

ciated with when the first charged-particle pulse is directed by the deflector system and detected by the detection element, respectively, and third and fourth timestamps associated with when the second charged-particle pulse is directed by the deflector system and detected by the detection element, respectively; and identify a first and second exiting beams based on the first and second timestamps, and the third and fourth timestamps, respectively.

15 Claims, 17 Drawing Sheets

(51) Int. Cl.
    *H01J 37/244*     (2006.01)
    *H01J 37/26*     (2006.01)
    *H01J 37/28*     (2006.01)

(52) U.S. Cl.
    CPC ..... *H01J 37/28* (2013.01); *H01J 2237/24475* (2013.01); *H01J 2237/2448* (2013.01); *H01J 2237/2817* (2013.01)

(58) Field of Classification Search
    CPC ............... H01J 37/04; H01J 37/1472; H01J 2237/24475; H01J 2237/2448; H01J 2237/2817
    USPC ................... 250/306, 307, 310, 311
    See application file for complete search history.

(56) References Cited

U.S. PATENT DOCUMENTS

2016/0225583 A1*   8/2016   Tsuno ................ H01J 37/244
2018/0151326 A1*   5/2018   Kieft .................. H01J 37/28

FOREIGN PATENT DOCUMENTS

TW         200717571       1/2007
WO     WO 2010/136534 A1   12/2010
WO     WO 2018/154800 A1     8/2018

OTHER PUBLICATIONS

International Search Report and Written Opinion issued by the International Searching Authority in related International Patent Application No. PCT/EP2019/085706, dated Jun. 25, 2020 (20 pgs.).

Krieg, D. et al., "First Conceptual Design Studies of an Electron Source for Ultrafast Election Diffraction at Delta," 9th International Particle Accelerator Conference IPAC2018, Vancouver, BC, Canada JACoW Publishing ISBN: 978-3-95458-184-7 (4 pgs.).

Office Action issued by the Intellectual Property Office (IPO) in related Taiwanese Patent Application No. 108147814, dated Dec. 7, 2020 (8 pgs.).

* cited by examiner

PULSED CHARGED-PARTICLE BEAM SYSTEM

CROSS-REFERENCE TO RELATED APPLICATIONS

This application claims priority to International Application No. PCT/EP2019/085706, filed Dec. 17, 2019, and published as WO 2020/136044 A2, which claims priority of U.S. application 62/786,268 which was filed on Dec. 28, 2018, and U.S. application 62/942,671 which was filed on Dec. 2, 2019. The contents of these applications are incorporated herein by reference in their entireties.

TECHNICAL FIELD

The embodiments provided herein disclose a multiple charged-particle beam apparatus, and more particularly a multiple charged-particle beam apparatus including a radio-frequency based source of charged particles.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. As the physical sizes of IC components continue to shrink, accuracy and yield in defect detection become more and more important. Multiple charged-particle beams may be used to increase the inspection throughput; however, productivity and efficiency of beam current usage may be compromised, rendering the inspection tools inadequate for their desired purpose.

Thus, related art systems face limitations in, for example, efficient usage of beam current and maintaining individual beam quality of a multiple charged-particle beam apparatus. Further improvements in the art are desired.

SUMMARY

In one aspect, the present disclosure is directed to a multi-beam apparatus for observing a sample. The multi-beam apparatus may include a deflector configured to form a plurality of deflected charged-particle beams from a primary charged-particle beam comprising a plurality of charged-particle pulses, and a detector configured to detect a plurality of signals generated from a plurality of probe spots formed by the plurality of deflected charged-particle beams. The multi-beam apparatus may further include a controller configured to obtain a first timing information related with formation of a deflected charged-particle beam of the plurality of charged-particle beams, obtain a second timing information related with detection of a signal of the plurality of signals, and associate the signal with the deflected charged-particle beam based on the obtained first and second timing information. The multi-beam apparatus may further include a charged-particle source, an acceleration cavity, and a bunching cavity.

The charged-particle source may comprise a pulsed radio-frequency source having a source frequency in a range of 100 MHz to 10 GHz. The deflector may comprise one or more charged-particle deflectors, each of the one or more charged-particle deflectors forming the plurality of deflected charged-particle beams based on an operating frequency. The deflector and the charged-particle source may be synchronized such that the operating frequency and the source frequency are related by the equation:

$$v1 = \frac{1}{n}(v2)$$

where v1 is the operating frequency, v2 is the source frequency, and n is a positive integer.

The multi-beam apparatus may further include an electron optical system and a charged-particle beam scanning system configured to scan each of the plurality of deflected charged-particle beams on the sample. The electron optical system may comprise one of a single-lens system or a multiple-lens system. The controller may be further configured to communicate with at least one of the deflector, the charged-particle beam scanning system, and the detector. The plurality of probe spots formed by the plurality of deflected charged-particle beams comprise one of a one-dimensional or a two-dimensional pattern. The two-dimensional pattern comprises a Lissajous pattern, a matrix, or an array.

In another aspect, the present disclosure is directed to a method of observing a sample using a multi-beam apparatus. The method may include forming a plurality of deflected charged-particle beams from a primary charged-particle beam comprising a plurality of charged-particle pulses using a deflector, detecting a plurality of signals generated from a plurality of probe spots formed by the plurality of deflected charged-particle beams using a detector. The method may include obtaining a first timing information related with formation of a deflected charged-particle beam of the plurality of charged-particle beams, obtaining a second timing information related with detection of a signal of the plurality of signals, and associating the signal with the deflected charged-particle beam based on the obtained first and second timing information, using a controller.

The method may further include focusing the plurality of deflected charged-particle beams on the sample using an electron optical system, and scanning each of the plurality of deflected charged-particle beams on the sample using a charged-particle beam scanning system.

In yet another aspect, the present disclosure is directed to a controller of a multi-beam apparatus. The controller may include a memory storing a set of instructions, and a processor configured to execute the set of instructions to cause the controller to obtain a first timing information related with formation of a deflected charged-particle beam of a plurality of charged-particle beams, obtain a second timing information related with detection of a signal of a plurality of signals, and associate the signal with the deflected charged-particle beam based on the obtained first and second timing information.

In yet another aspect, the present disclosure is directed to a non-transitory computer readable medium storing a set of instructions that is executable by one or more processors of a multi-beam apparatus to cause the multi-beam apparatus to perform a method to observe a sample. The method may include forming a plurality of deflected charged-particle beams from a primary charged-particle beam comprising a plurality of charged-particle pulses using a deflector, detecting a plurality of signals generated from a plurality of probe spots formed by the plurality of deflected charged-particle beams using a detector. The method may include obtaining a first timing information related with formation of a deflected charged-particle beam of the plurality of charged-particle beams, obtaining a second timing information related with detection of a signal of the plurality of signals, and associating the signal with the deflected charged-particle beam based on the obtained first and second timing information, using a controller. The method may further include focusing the plurality of deflected charged-particle beams on the sample using an electron optical system and scanning each of the plurality of focused deflected charged-particle beams on the sample using a charged-particle beam scanning system.

In yet another aspect, the present disclosure is directed to a multi-beam apparatus. The multi-beam apparatus may include a charged-particle source configured to generate a primary charged-particle beam comprising a plurality of charged-particle pulses, a bunching cavity configured to form a plurality of charged-particle beams from the primary charged-particle beam; and a deflector configured to deflect the plurality of charged-particle beams to form a plurality of probe spots on a sample.

In yet another aspect, the present disclosure is directed to a method for observing a sample in a multi-beam apparatus. The method may include generating a primary charged-particle beam comprising a plurality of charged-particle pulses from a charged-particle source, forming a plurality of charged-particle beams from the primary charged-particle beam, and deflecting the plurality of charged-particle beams to form a plurality of probe spots on a sample using a deflector.

In yet another aspect, the present disclosure is directed to an apparatus comprising a deflector configured to deflect a plurality of pulses of charged particles to a plurality of probe spots on a sample, a detector configured to detect a plurality of signals from the sample that result from the plurality of pulses interacting with the sample, and a controller configured to correlate a particular detected signal to a particular probe spot on the sample based on a correlation between a time that the particular signal generated from the particular probe spot was detected and a time that a particular charged particle pulse forming the particular probe spot was deflected.

In yet another aspect, the present disclosure is directed to a multi-beam apparatus for charged-particle detection. The multi-beam apparatus may include a deflector system configured to direct charged-particle pulses; a detector having a detection element, the detection element configured to detect the charged-particle pulses; and a controller having a circuitry configured to: control the deflector system to direct a first charged-particle pulse and a second charged-particle pulse to the detection element, wherein the first charged-particle pulse is emitted from a first probing spot, and the second charged-particle pulse is emitted from a second probing spot; obtain a first timestamp associated with when the first charged-particle pulse is directed by the deflector system, a second timestamp associated with when the first charged-particle pulse is detected by the detection element, a third timestamp associated with when the second charged-particle pulse is directed by the deflector system, and a fourth timestamp associated with when the second charged-particle pulse is detected by the detection element; and identify a first exiting beam based on the first timestamp and the second timestamp, and a second exiting beam based on the third timestamp and the fourth timestamp.

In yet another aspect, the present disclosure is directed to a method for charged-particle detection in a multi-beam apparatus. The method may include: controlling a deflector system to direct a first charged-particle pulse and a second charged-particle pulse to a detection element of a detector; obtaining, using a controller, a first timestamp associated with when the first charged-particle pulse is directed by the deflector system, a second timestamp associated with when the first charged-particle pulse is detected by the detection element, a third timestamp associated with when the second charged-particle pulse is directed by the deflector system, and a fourth timestamp associated with when the second charged-particle pulse is detected by the detection element; and identifying, using a controller, a first exiting beam based on the first timestamp and the second timestamp, and a second exiting beam based on the third timestamp and the fourth timestamp.

In yet another aspect, the present disclosure is directed to a non-transitory computer readable medium storing a set of instructions that is executable by one or more processors of a multi-beam apparatus to cause the multi-beam apparatus to perform a method for charged-particle detection. The method may include: controlling a deflector system to direct a first charged-particle pulse and a second charged-particle pulse to a detection element of a detector; obtaining, using a controller, a first timestamp associated with when the first charged-particle pulse is directed by the deflector system, a second timestamp associated with when the first charged-particle pulse is detected by the detection element, a third timestamp associated with when the second charged-particle pulse is directed by the deflector system, and a fourth timestamp associated with when the second charged-particle pulse is detected by the detection element; and identifying, using a controller, a first exiting beam based on the first timestamp and the second timestamp, and a second exiting beam based on the third timestamp and the fourth timestamp.

In yet another aspect, the present disclosure is directed to a multi-beam apparatus for reducing interaction of charged particles. The multi-beam apparatus may include a first cluster cavity configured to receive a first set of charged particles to form a first cluster of charged particles; a second cluster cavity configured to receive a second set of charged particles to form a second cluster of charged particles; and a controller having a circuitry configured to cause the first cluster and the second cluster to pass a downstream position in a predetermined time-space order.

In yet another aspect, the present disclosure is directed to a method for reducing interaction of charged particles in a charged-particle beam of a multi-beam apparatus. The method may include: receiving a first set of charged particles in a first cluster cavity to form a first cluster of charged particles; receiving a second set of charged particles in a second cluster cavity to form a second cluster of charged particles; and causing the first cluster and the second cluster to pass a downstream position in a predetermined time-space order.

In yet another aspect, the present disclosure is directed to a non-transitory computer readable medium storing a set of instructions that is executable by one or more processors of a multi-beam apparatus to cause the multi-beam apparatus to perform a method for reducing interaction of charged particles in a charged-particle beam. The method may include: receiving a first set of charged particles in a first cluster cavity to form a first cluster of charged particles; receiving a second set of charged particles in a second cluster cavity to form a second cluster of charged particles; and causing the first cluster and the second cluster to pass a downstream position in a predetermined time-space order.

In yet another aspect, the present disclosure is directed to a multi-beam apparatus. The multi-beam apparatus may include: a first charged-particle source; a second charged-particle source; and at least one deflector system downstream from the first charged-particle source and the second charged-particle source, configured to: receive a first beam of pulsed charged particles from the first charged-particle source and a second beam of pulsed charged particles from the second charged-particle source; and direct the first beam and the second beam in a predetermined time-space order, wherein the first beam and the second beam pass a downstream position in sequence.

In yet another aspect, the present disclosure is directed to a method for providing multiple charged-particle beams in a multi-beam apparatus. The method may include: receiving, in at least one deflector system, a first beam of pulsed charged particles from a first charged-particle source and a second beam of pulsed charged particles from a second charged-particle source; and directing the first beam and the second beam in a predetermined time-space order, wherein the first beam and the second beam pass a downstream position in sequence.

In yet another aspect, the present disclosure is directed to a non-transitory computer readable medium storing a set of instructions that is executable by one or more processors of a multi-beam apparatus to cause the multi-beam apparatus to perform a method for providing multiple charged-particle beams. The method may include: receiving, in at least one deflector system, a first beam of pulsed charged particles from a first charged-particle source and a second beam of pulsed charged particles from a second charged-particle source; and directing the first beam and the second beam in a predetermined time-space order, wherein the first beam and the second beam pass a downstream position in sequence.

DETAILED DESCRIPTION

Figure 1:
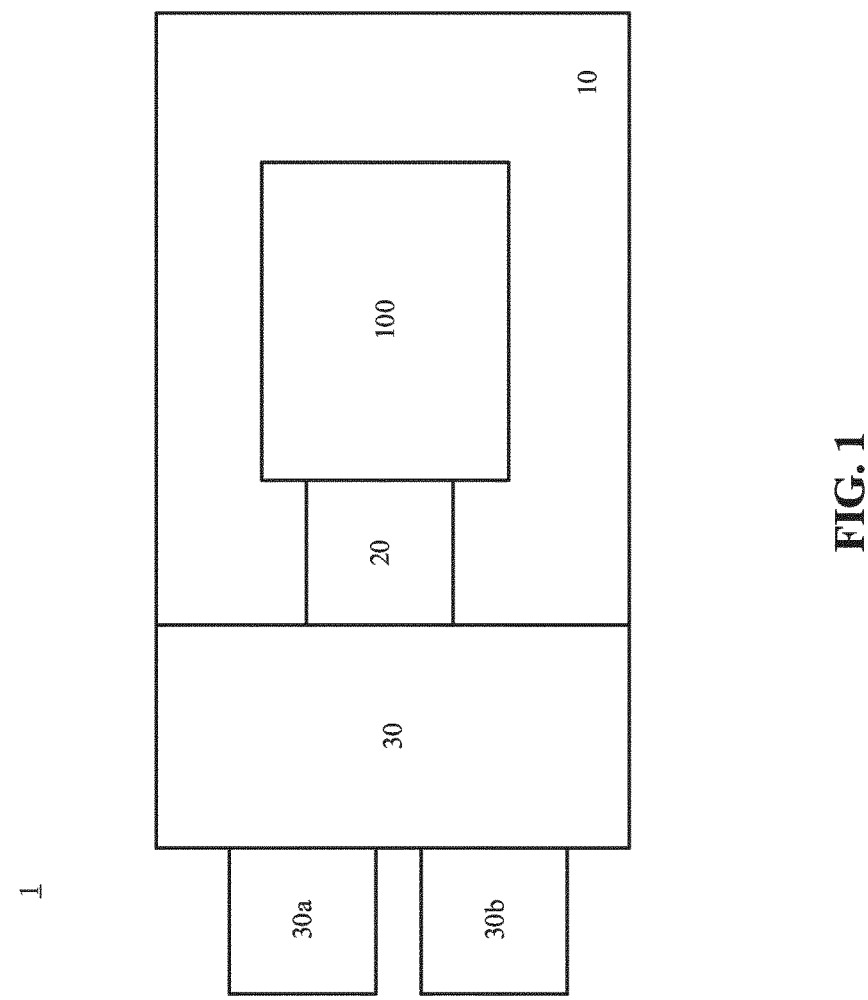
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. For example, although some embodiments are described in the context of utilizing charged-particle beams, the disclosure is not so limited. Other types of charged particle beams may be similarly applied. Furthermore, other imaging systems may be used, such as optical imaging, photo detection, x-ray detection, etc.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than $1/1000$th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

As the geometries shrink and the IC chip industry migrates to three-dimensional (3D) architectures (such as, NAND gates, Fin field-effect transistors (FinFETs), and advanced dynamic random-access memory (DRAM)), finding defects is becoming more challenging and expensive at each lower node. While high process yield is desirable in an IC chip manufacturing facility, it is also essential to maintain a high wafer throughput, defined as the number of wafers processed per hour. High process yields, and high wafer throughput can be impacted by the presence of defects, especially when operator intervention is involved. Thus, detection and identification of micro and nano-sized defects by inspection tools (such as, a SEM) may be essential for maintaining high yields, high throughput, and low cost.

Semiconductor chips are fabricated in an extremely clean and controlled environment that has a very low level of pollutants such as dust, airborne particles, aerosol particles, and chemical vapors. More specifically, a semiconductor cleanroom is required to have a controlled level of contamination that is specified by the number of particles per cubic foot at a specified particle size. A typical chip manufacturing cleanroom contains 1-10 particles per cubic foot of air, each particle being less than 5 um in diameter. For comparison, the ambient air outside in a typical city environment contains approximately 1.25 billion particles per cubic foot, each particle having an average size of ~200 um in diameter. A speck of dust as small as 1 um, on a wafer in process may span across thousands of transistors located on the chip, which could potentially render the entire chip useless. In some cases, a speck of dust on a reticle or a photomask that is used to create repeating patterns on the wafer may cause recurring physical or electrical defects. For example, one or more metal wires connecting transistors in a single chip may overlap or may be undesirably connected through the dust particle, causing a short in the circuit throughout the entire chip. Identifying and characterizing each defect or defect type while maintaining high throughput may improve process yield and product reliability.

One component of improving yield is monitoring the chip making process to ensure that it is producing a sufficient number of functional integrated circuits. One way to monitor the process is to inspect the chip circuit structures at various stages of their formation. Inspection can be carried out using a scanning electron microscope (SEM). A SEM can be used to image these extremely small structures, in effect, taking a "picture" of the structures of the wafer. The image can be used to determine if the structure was formed properly and also if it was formed in the proper location. If the structure is defective, then the process can be adjusted so the defect is less likely to recur.

The working principle of the SEM is similar to a camera. The camera takes a picture by receiving and recording brightness and colors of light reflected or emitted from people or objects. The SEM takes a "picture" by receiving and recording energies of electrons reflected or emitted from the structures. Before taking such a "picture," an electron beam may be provided onto the structures, and when the electrons are reflected or emitted ("exiting") from the structures, a detector of the SEM may receive and record the energies of those electrons to generate an image. To take such a "picture," some SEMs use a single electron beam (referred to as a "single-beam SEM"), while some SEMs use multiple electron beams (referred to as a "multi-beam SEM") to take multiple "pictures" of the wafer. By using multiple electron beams, the SEM may provide more electron beams onto the structures for obtaining these multiple "pictures," resulting in more electrons exiting from the structures. Accordingly, the detector may receive more exiting electrons simultaneously, and generate the image of the structures with a higher efficiency and a faster speed.

Although a multiple charged-particle beam imaging system, such as a multi-beam SEM, may be useful in detecting micro and nano-sized defects while maintaining the high throughput; the overall impact on efficiency of beam usage, structural complexity of the system, and productivity cannot be overlooked. For example, splitting an electron beam to form multiple beamlets using micro-electromechanical systems (MEMS) aperture arrays may result in an inefficient usage of beam electrons because only a portion of the electrons may be allowed to pass through the apertures, while the remaining electrons are blocked off and unutilized. Generating multiple probe spots from multiple electron beams may require additional lenses and components, adding to the structural and operational complexity of the multi-beam apparatus. In particular, the additional lenses may have to be aligned with the system and noise-shielded as well. In addition, maintaining the beam quality for each of the individual beams or beamlets, expressed at least by high peak current, small beam cross-section, and a low beam energy spread within the beam may be challenging.

A routine defect detection and identification operation during wafer inspection using SEM may require dynamic adjustment of magnification and resolution. For example, a low-resolution scan may be performed to locate a defect, and a high-resolution scan may then be performed to identify or characterize the located defect. Such an operation requires manually adjusting scan parameters such as, for example, magnification, focus, field-of-view, beam energy, among other things. Besides manual interference from a skilled operator, the operation may be time consuming and susceptible to judgment error, adversely affecting the throughput and inspection yield.

The charged-particle beam imaging system (e.g., a single-beam SEM or a multi-beam SEM) may use a continuous or pulsed electron beam for scanning. A continuous beam is a continuous stream of electrons, similar to a water stream coming out of a hose. For multi-beam imaging systems that may generate a plurality of beamlets, continuous beamlets are continuous streamlets of electrons, similar to the many water streamlets coming out of a shower head. In contrast, a pulsed beam includes electrons clustered into bunches or pulses, with no electron between each pulse, similar to bullets out of a machine gun. For multi-beam imaging systems that may generate a plurality of beamlets, pulsed beamlets include, in each beamlet, electrons clustered into pulses, similar to bullets coming out of multiple machine guns arrange as an array and all firing at the same time. The charged-particle beam imaging system may use a pulsed charged-particle source to generate a pulsed beam.

In one aspect of the present disclosure, a multi-beam apparatus including a deflector, a detector, and a controller may be used to form multiple charged-particle beams for observing a sample. A high frequency pulsed charged-particle source may generate multiple charged-particle pulses that may be clustered to form bunches, also referred to herein as beams of charged-particle pulses. A deflector may be configured to receive and deflect the beams of high frequency charged-particle pulses and each of the deflected beams may form a probing spot on the sample. Upon interacting with the sample, each charged-particle beam may generate a signal comprising information related with the sample. A detector may be configured to detect the signals generated from the multiple probe spots. The multi-beam apparatus may comprise a controller configured to obtain timing information related with the formation of the deflected charged-particle beams and detection of the signal generated by the corresponding beam. The controller may then associate the detected signal with the deflected charged-particle beam based on the obtained timing information.

Some of the advantages of some embodiments of the claimed multi-beam apparatus include, but are not limited to, efficient beam usage, higher productivity, fast switching between low-resolution and high-resolution inspection, high beam quality, high wafer processing and inspection throughput. In addition, by forming the beams of charged-particle pulses, the number of the beamlets in a unit area may be increased without incurring significant Coulomb effect (explained below) because the pulses of different charged-particle beams may be staggered, thus allowing more efficient utilization of the high frequency pulsed charged-particle source.

The Coulomb effect is an electric interaction between charged particles. In the electric interaction, particles with like charges repel each other, while particles with opposite charges attract each other. In a multi-beam apparatus, the Coulomb effect may occur between beamlets of charged particles. For example, when the beamlets are electron beams, electrons in the beamlets may repel each other when they are too close, thus affecting the travel speeds and directions of each other. That may cause deterioration of the performance of the multi-beam apparatus.

Typically, in a multi-beam apparatus, beamlets may be converged to cross each other and form a common crossover (or "crossover area") before reaching the sample. As demands for imaging throughput increases, the multi-beam apparatus may generate and use more beamlets for scanning. As the number of beamlets increase, more beamlets may cross the common crossover, and the Coulomb effect may become more significant. In a multi-beam apparatus capable of providing a large number of beamlets, the Coulomb effect may become a dominant factor that limits the imaging resolution. When the required energy of the beamlets is fixed, it is extremely challenging to control the Coulomb effect.

Figures 8A, 8B:
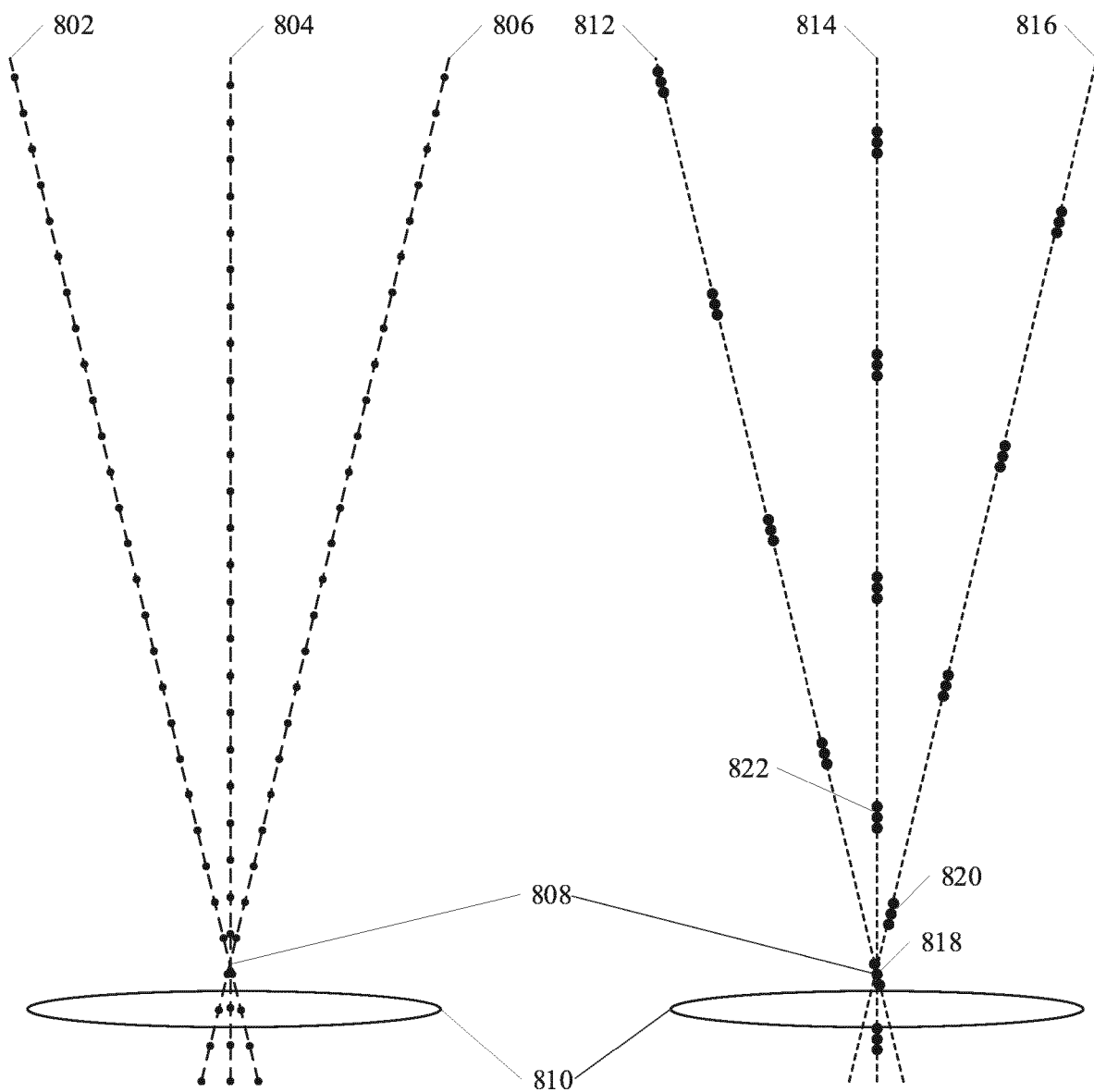
FIGS. 8A-8B illustrate two exemplary methods of controlling charged particles to enter a crossover area in a multi-beam apparatus, consistent with embodiments of the present disclosure.

In another aspect of the present disclosure, a multi-beam apparatus including multiple cluster generators may be used for reducing the Coulomb effect. The cluster generators may be used to generate clusters of charged particles, such as by compressing the pulsed beamlets using cavities having electric fields along the moving direction of the beamlets. Each cluster generator may receive and cluster a beamlet. The cluster generators may be coordinated to release or eject the generated clusters in a predetermined time-space order, such that the clusters of different beamlets may enter the common crossover in sequence (e.g., one by one, with only one or zero cluster being in the common crossover at any point in time), as shown in FIG. 8B. That is, at a given time, there is at most one cluster passing through the common crossover. Such an arrangement may reduce the possibilities of incurring the Coulomb effect and reduce the strength of the Coulomb effect. In an ideal scenario, the strength of the Coulomb effect in a multi-beam apparatus may be reduced to the level of a single-beam apparatus. In addition, such an arrangement may accommodate more beams (e.g., generated from more charged-particle sources) in the multi-beam apparatus, thus significantly increasing the imaging throughput.

Moreover, as more beams are added to pursue faster inspection speeds and better inspection image quality, more challenges may arise. Typically, a single charged-particle source is used for generating charged particles (e.g., electrons), and an array of apertures is used for generating the beams of charged particles. The charged-particle source generates charged particles that are accelerated and shed onto the array of apertures, and the array of apertures may split them into beams. However, several problems would occur if this existing design is used to generate a higher number of beams. Due to the limited capability of the single charged-particle source, the current of the emission of the charged-particles may have an upper limit, which may limit the brightness of the generated inspection image of each beam. To accommodate the increasing demand of high throughputs of the multi-beam apparatus, more beams are needed.

And to generate more beams, the number of the apertures may have to be increased. In that case, more electric connections are needed for those apertures, and electric routing for those apertures becomes significantly more complex. Also, the apertures typically work under high voltages (e.g., 100 V). Because more connections are confined within a limited space, a risk of electric breakdowns between electric connections of the electric routing may greatly increase. Further, as the distances between the apertures shrink, the distance between the generated beams also shrink, which may cause more significant Coulomb effect between the beams.

In another aspect of the present disclosure, a multi-beam apparatus including multiple charged-particle sources (e.g., electron sources), and multiple deflectors may be used for providing multiple charged-particle beams. The charged-particle sources may produce beams of charged particles, and the deflectors may receive, deflect and release them as parallel beams. The deflectors may deflect the received beams in a manner such that the released beams may be more concentrated (e.g., distances between the beams are shortened) yet remain parallel. Because the deflectors may concentrate beams, the charged-particle sources may be spaced more distantly, reducing the complexity of the electric routing and risk of electric breakdowns. No aperture plate is used for producing the beams, further reducing the complexity of the electric routing and risk of electric breakdowns. In such a way, the beams of clusters may be deflected by the deflectors to become more condensed to enable a high and scalable brightness and a uniform current. The multiple deflectors may create a scalable approach to mitigate the Coulomb effect. In some cases, the deflectors may also cluster the beams and release them such that the clusters pass through the crossover area in sequence (e.g., one by one). In such a way, the Coulomb effect may be mitigated because there is at most one cluster passing through the crossover area.

Moreover, in a multi-beam apparatus, more challenges may result from a "cross-talk" problem, in which charged-particles of one beamlet may reach a destination corresponding to another beamlet, as explained below. In a multi-beam apparatus, multiple beamlets may be incident onto an inspected sample, each beamlet forming a spot with a sized cross section (or "spot size"). The beamlets interact with materials of the sample within a region with a depth (referred to as "interaction volume"). An interaction volume of a beamlet may be larger than a spot size of the beamlet. That is, the interaction volumes of the beamlets may overlap. Exiting electrons corresponding to a beamlet may exit from anywhere in the corresponding interaction volume. Due to the overlap between the interaction volumes, the exiting charged-particle beams may have overlaps. Typically, the detector detecting the exiting charged-particle beams may include multiple detection elements (e.g., sub-detectors). Typically, each detection element may detect secondary electrons generated based on a particular beamlet. Because the exiting charged-particle beams may have overlaps, charged-particles of one exiting beam may reach a detection element corresponding to another beamlet, hence incurring the cross-talk problem. This is only one example as to how crosstalk may occur, and crosstalk may occur in several other ways. To accommodate the increasing high throughput demand of the multi-beam apparatus, more beamlets are needed. However, as the number of beamlets increase, the number of corresponding detection elements may also increase, which may cause not only increasing complexity and cost of building the detector system, but also a more significant cross-talk problem.

In another aspect of the present disclosure, a multi-beam apparatus including a first deflector, a second deflector, multiple detectors, and a controller may be used for charged-particle detection. The first deflector may be used for forming a first number of beams of charged-particle pulses. Because the charged-particle pulses are deflected by the first deflector at different times, the pulses of the formed charged-particle beams may reach the inspected sample at different times. Charged-particle beams may exit from the probing spots, which may be deflected by the second deflector to form a second number of exiting charged-particle beams. If the detector can differentiate fine temporal details, the detector may then differentiate which pulse comes from which probing spot based on the times of the pulses of the exiting charged-particle beams arriving at the detector, the times of the pulses entering the second deflector, and the times of the pulses entering the first deflector. By doing so, the needed detection elements may be reduced, the complexity and cost of building the detector may be lowered, and the cross-talk problem may be alleviated. Essentially, this approach converts a spatial problem into a temporal problem.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

While this disclosure uses electrons to describe some embodiments and examples, it is to be understood that any description related to the electrons may be equivalently applicable to any type of charged particles (e.g., ions, protons, subatomic particles, or the like).

FIG. 1 illustrates an exemplary electron beam inspection (EBI) system 1 consistent with embodiments of the present disclosure. EBI system 1 may be used for imaging. As shown in FIG. 1, EBI system 1 includes a main chamber 10, a load/lock chamber 20, an electron beam tool 100, and an equipment front end module (EFEM) 30. Electron beam tool 100 is located within main chamber 10.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 30 may transport the wafers to load/lock chamber 20. Load/lock chamber 20 is connected to a load/lock vacuum pump system (not shown), which removes gas molecules in load/lock chamber 20 to reach a first pressure below the atmospheric pressure. After reaching the first pressure, one or more robotic arms (not shown) may transport the wafer from load/lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 100. Electron beam tool 100 may be a single-beam system or a multi-beam system. While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may be applied to other chambers as well.

Figure 2:
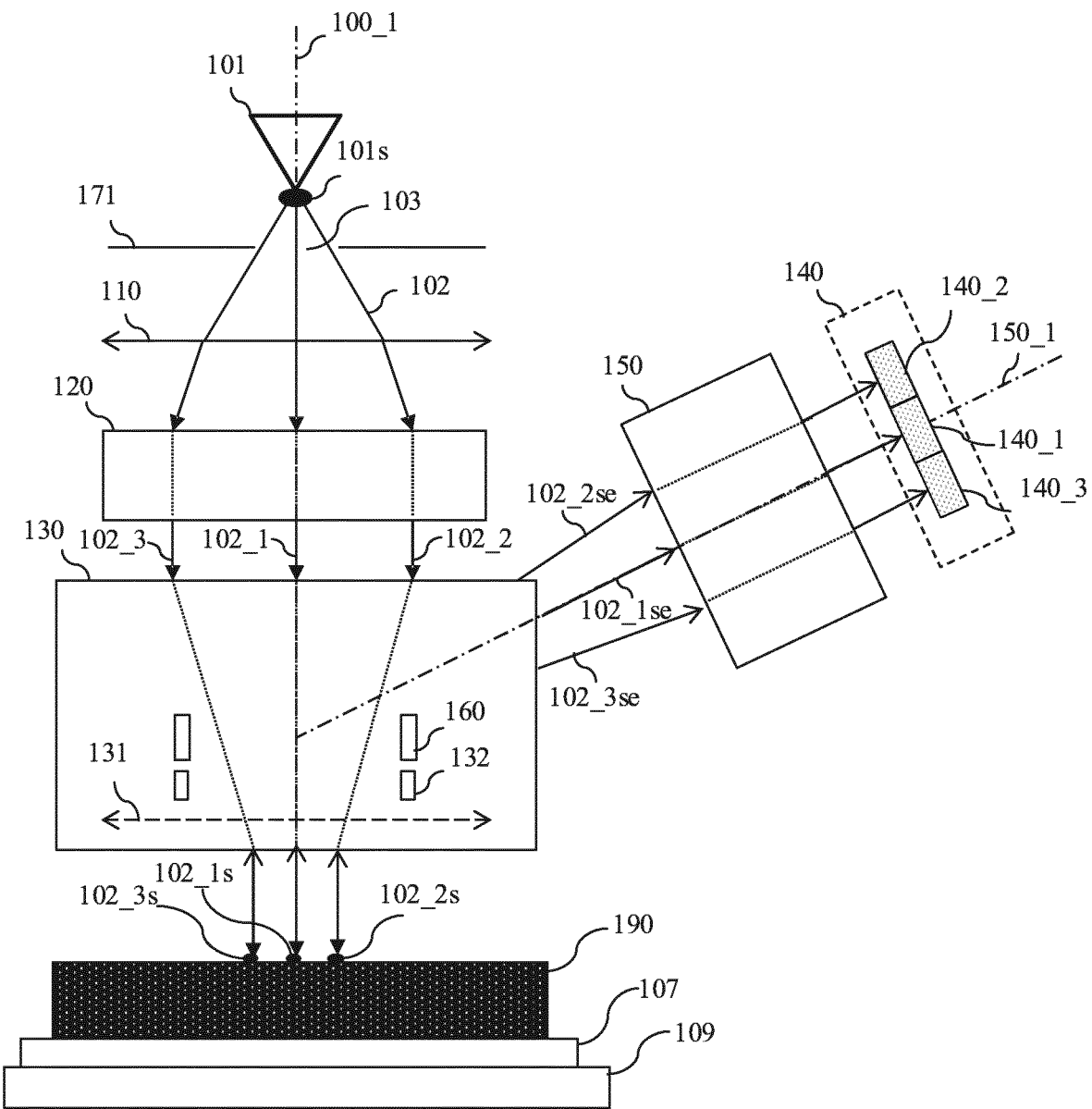
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which is a schematic diagram illustrating an exemplary electron beam tool 100 including a multi-beam inspection tool that is part of the EBI system 1 of FIG. 1, consistent with embodiments of the present disclosure. Multi-beam electron beam tool 100 (also referred to herein as apparatus 100) comprises an electron source 101, a gun aperture plate 171 with a gun aperture 103, a condenser lens 110, a source conversion unit 120, a primary projection system 130, a motorized stage 109, and a sample holder 107 supported by motorized stage 109 to hold a sample 190 (e.g., a wafer or a photomask) to be inspected. Multi-beam electron beam tool 100 may further comprise a secondary projection system 150 and an electron detection device 140. Primary projection system 130 may comprise an objective lens 131. Electron detection device 140 may comprise a plurality of detection elements 140_1, 140_2, and 140_3. A beam separator 160 and a deflection scanning unit 132 may be positioned inside primary projection system 130.

Electron source 101, gun aperture plate 171, condenser lens 110, source conversion unit 120, beam separator 160, deflection scanning unit 132, and primary projection system 130 may be aligned with a primary optical axis 100_1 of apparatus 100. Secondary projection system 150 and electron detection device 140 may be aligned with a secondary optical axis 150_1 of apparatus 100.

Electron source 101 may comprise a cathode (not shown) and an extractor or anode (not shown), in which, during operation, electron source 101 is configured to emit primary electrons from the cathode and the primary electrons are extracted or accelerated by the extractor or the anode to form a primary electron beam 102 that forms a primary beam crossover (virtual or real) 101s. Primary electron beam 102 may be visualized as being emitted from primary beam crossover 101s.

Source conversion unit 120 may comprise an image-forming element array (not shown), an aberration compensator array (not shown), a beam-limit aperture array (not shown), and a pre-bending micro-deflector array (not shown). In some embodiments, the pre-bending micro-deflector array deflects a plurality of primary beamlets 102_1, 102_2, 102_3 of primary electron beam 102 to normally enter the beam-limit aperture array, the image-forming element array, and an aberration compensator array. In some embodiment, condenser lens 110 is designed to focus primary electron beam 102 to become a parallel beam and be normally incident onto source conversion unit 120. The image-forming element array may comprise a plurality of micro-deflectors or micro-lenses to influence the plurality of primary beamlets 102_1, 102_2, 1023 of primary electron beam 102 and to form a plurality of parallel images (virtual or real) of primary beam crossover 101s, one for each of the primary beamlets 102_1, 102_2, and 102_3. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 102_1, 102_2, and 102_3. The astigmatism compensator array may comprise a plurality of micro-stigmators to compensate astigmatism aberrations of the primary beamlets 1021, 102_2, and 102_3. The beam-limit aperture array may be configured to limit diameters of individual primary beamlets 1021, 102_2, and 102_3. FIG. 2 shows three primary beamlets 1021, 102_2, and 102_3 as an example, and it is appreciated that source conversion unit 120 may be configured to form any number of primary beamlets.

Condenser lens 110 is configured to focus primary electron beam 102. Condenser lens 110 may further be configured to adjust electric currents of primary beamlets 102_1, 102_2, and 102_3 downstream from source conversion unit 120 by varying the focusing power of condenser lens 110. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 110. Condenser lens 110 may be an adjustable condenser lens that may be configured so that the position of its first principle plane is adjustable. The adjustable condenser lens may be configured to be magnetic, which may result in off-axis beamlets 102_2 and 102_3 illuminating source conversion unit 120 with rotation angles. The rotation angles change with the focusing power or the position of the first principal plane of the adjustable condenser lens. Condenser lens 110 may be an anti-rotation condenser lens that may be configured to keep the rotation angles unchanged while the focusing power of condenser lens 110 is changed. In some embodiments, condenser lens 110 may be an adjustable anti-rotation condenser lens, in which the rotation angles do not change when a focusing power and a position of a first principal plane of condenser lens 110 are varied.

Objective lens 131 may be configured to focus beamlets 1021, 102_2, and 102_3 onto a sample 190 for inspection and may form, in the current embodiments, three probe spots 102_1s, 102_2s, and 102_3s on the surface of sample 190. Gun aperture plate 171, in operation, is configured to block off peripheral electrons of primary electron beam 102 to reduce Coulomb effect. The Coulomb effect may enlarge the size of each of probe spots 102_1s, 102_2s, and 102_3s of primary beamlets 102_1, 102_2, 102_3, and therefore deteriorate inspection resolution.

Beam separator 160 may, for example, be a Wien filter comprising an electrostatic deflector generating an electrostatic dipole field and a magnetic dipole field (not shown in FIG. 2). In operation, beam separator 160 may be configured to exert an electrostatic force by electrostatic dipole field on individual electrons of primary beamlets 102_1, 102_2, and 102_3. The electrostatic force is equal in magnitude but opposite in direction to the magnetic force exerted by magnetic dipole field of beam separator 160 on the individual electrons. Primary beamlets 102_1, 102_2, and 102_3 may therefore pass at least substantially straight through beam separator 160 with at least substantially zero deflection angles.

Deflection scanning unit 132, in operation, is configured to deflect primary beamlets 102_1, 102_2, and 102_3 to scan probe spots 102_1s, 102_2s, and 102_3s across individual scanning areas in a section of the surface of sample 190. In response to incidence of primary beamlets 102_1, 102_2, and 102_3 on probe spots 102_1s, 102_2s, and 102_3s on sample 190, electrons emerge from sample 190 and generate three secondary electron beams 102_1se, 102_2se, and 102_3se. Each of secondary electron beams 102_1se, 102_2se, and 102_3se typically comprise secondary electrons (having electron energy≤50 eV) and backscattered electrons (having electron energy between 50 eV and the landing energy of primary beamlets 102_1, 102_2, and 102_3). Beam separator 160 is configured to deflect secondary electron beams 102_1se, 102_2se, and 102_3se towards secondary projection system 150. Secondary projection system 150 subsequently focuses secondary electron beams 102_1se, 102_2se, and 102_3se onto detection elements 140_1, 140_2, and 140_3 of electron detection device 140. Detection elements 140_1, 140_2, and 140_3 are arranged to detect corresponding secondary electron beams 102_1se, 102_2se, and 102_3se and generate corresponding signals which are sent to a controller or a signal processing system (not shown), e.g., to construct images of the corresponding scanned areas of sample 190.

In some embodiments, detection elements 140_1, 140_2, and 140_3 detect corresponding secondary electron beams 102_1se, 102_2se, and 102_3se, respectively, and generate corresponding intensity signal outputs (not shown) to an image processing system (not shown). In some embodiments, each of detection elements 140_1, 140_2, and 140_3 may comprise one or more pixels. The intensity signal output of a detection element may be a sum of signals generated by all the pixels within the detection element.

Although FIG. 2 shows that apparatus 100 uses three primary electron beams, it is appreciated that apparatus 100 may use two or more number of primary electron beams. The present disclosure does not limit the number of primary electron beams used in apparatus 100.

Figure 3:
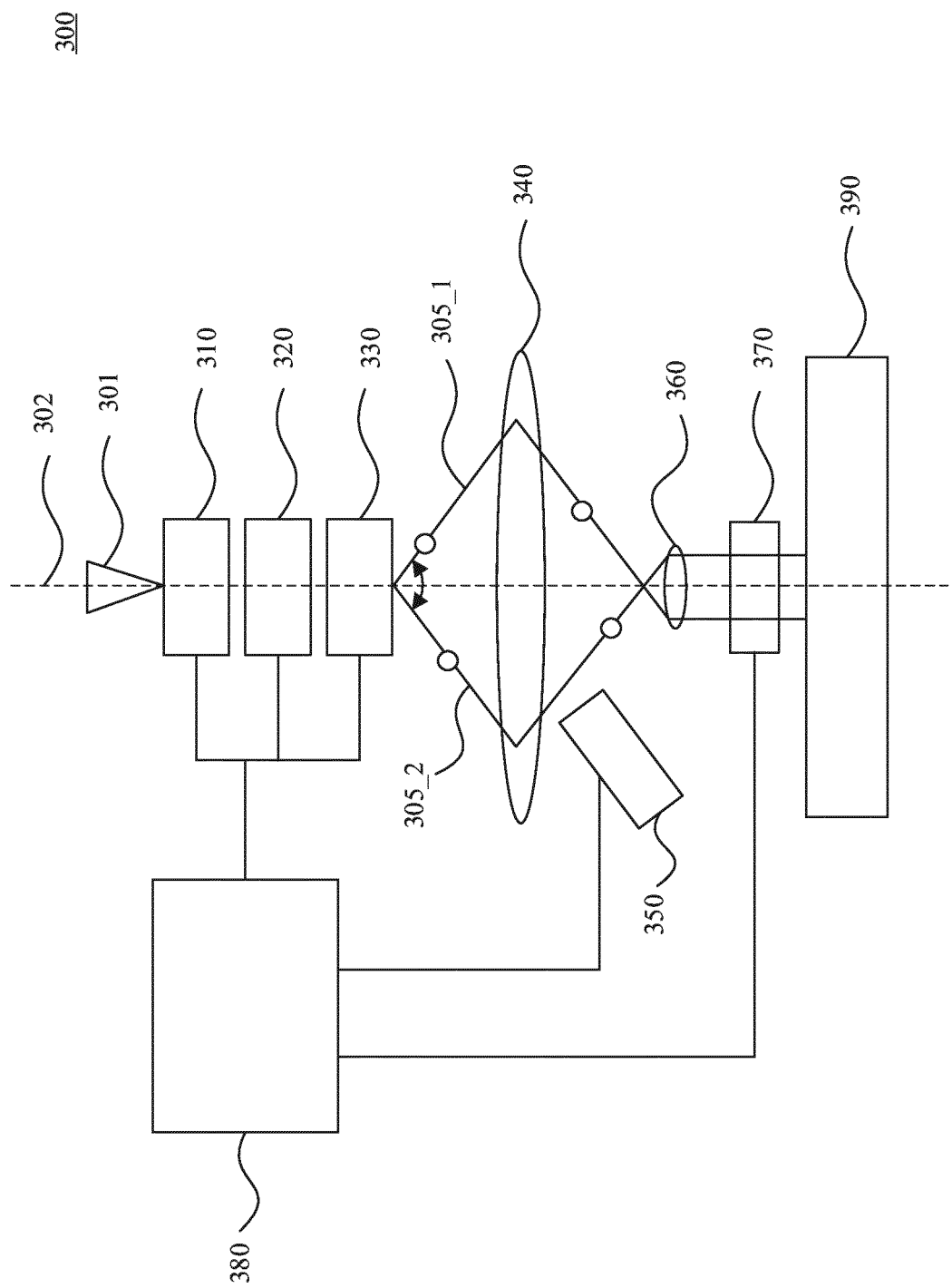
FIG. 3 is a schematic diagram illustrating an exemplary multiple electron beam system using a timing control mechanism in a single-lens configuration, consistent with embodiments of the present disclosure.

Reference is now made to FIG. 3, which illustrates a multi-beam apparatus 300 for observing a sample using a timing control mechanism, consistent with embodiments of the present disclosure. In some embodiments, the multi-beam apparatus 300 may be electron beam tool 100 as shown in FIG. 2. As shown in FIG. 3, multi-beam apparatus 300 may comprise a primary electron source 301, deflected electron beams 305_1 and 305_2, an acceleration cavity 310, a bunching cavity 320, a deflection cavity 330, a condenser lens 340, a detector 350, a primary projection system 360, a beam raster system 370, a controller 380, and a sample 390.

As illustrated in FIG. 3, primary electron source 301, acceleration cavity 310, bunching cavity 320, deflection cavity 330, condenser lens 340, primary projection system 360, beam raster system 370, and sample 390 may be aligned with a primary optical axis 302 of multi-beam apparatus 300.

Primary electron source 301 may be a continuous electron source or a pulsed electron source. In some embodiments, primary electron source 301 of multi-beam apparatus 300 may be electron source 101 of electron beam tool 100, which may be used to generate a continuous electron beam. In some embodiments, primary electron source 301 may be a pulsed electron source, which may be used to generate a pulsed electron beam. Primary electron source 301 can generate charged particle pulses in any of several ways. In some embodiments, primary electron source 301 may be a laser induced pulsed source, such as one that uses a pulsed laser to excite electrons in an emitter and resultantly generate electron pulses. In some embodiments, primary electron source 301 may be a voltage controlled pulsed source, such as one that uses a pulsed voltage to excite electrons and generate electron pulses. In some embodiments, primary electron source 301 may comprise a superconducting radio-frequency (SCRF) photoinjector, a normal conducting radio-frequency (NCRF) photoinjector, or a high voltage direct current photoemission gun (e.g., electron source 101 in FIG. 2) followed by an RF accelerating module photoinjector. Further, primary electron source 301 may be any combination of the above discussed components. In some embodiments, a photoinjector may include a photocathode, an electron gun powered by radio-frequency (RF) or biased at a high voltage, a laser and optical system producing a desired pulse structure, an RF source, and a timing and synchronization system.

High quantum efficiency photocathodes may be useful for the operation of photoinjector driven electron accelerators with high average current and high brightness beams. In some embodiments, the photocathodes for conventional NCRF photoinjectors may comprise metallic photocathodes such as copper (Cu), lead (Pb), or magnesium (Mg). The NCRF photoinjectors may comprise a low duty factor gun (0.1%), or a high duty factor gun (25%). The photocathodes for SCRF photoinjectors may comprise semiconductor photocathodes made of alkali antimonides, bi-alkali antimonides, multi-alkali antimonides, gallium arsenide (GaAs), gallium nitride (GaN), cesium iodide (CsI), cesium telluride (Cs2Te), CsK2Sb, Na2KSb, Cs3Sb, or the like.

In some embodiments, the source frequency, defined herein as the frequency of the RF signal applied to the photoinjector to generate electron pulses may be in the range of 100 MHz to 10 GHz. It is to be appreciated that source frequency may be 1.3 GHz or 3 GHz.

In some embodiments, primary electron source 301 may be a pulsed electron source, and acceleration cavity 310 may receive charged-particle pulses generated by primary electron source 301 and accelerate them to eject a pulsed primary electron beam. In some embodiments, primary electron source 301 may be a continuous electron source, and acceleration cavity 310 may receive a charged-particle stream generated by primary electron source 301 and accelerate them to eject a continuous primary electron beam. For example, acceleration cavity 310 may comprise a linear particle accelerator configured to accelerate charged particles of the received electrons (e.g., electron pulses or a continuous electron stream) to a high speed by subjecting them to a series of oscillating electric potentials along a linear beamline. In a linear accelerator such as acceleration cavity 310, electrons may be accelerated by the action of RF electromagnetic waves. Relatively low energy electrons are injected into acceleration cavity 310 and gain energy as they travel down the structure. In some embodiments, acceleration cavity 310 may include corrugations, diaphragms, or baffles, causing the RF waves to travel at a velocity determined by the corrugations and accelerator dimensions. In most electron linear accelerators, very high frequency waves, usually of wavelength of around 10 cm (i.e. around 3 GHz) are made to propagate down the accelerating structure in the same direction as the electrons. In some embodiments, when primary electron source 301 is a pulsed electron source, the RF wave propagating within acceleration cavity 310 may be matched with the source frequency of the incoming electron pulses from primary electron source 301.

In some embodiments, the electric field component in the RF wave may act on the injected electrons, initially by forming them into a bunch, then accelerating them down the structure of acceleration cavity 310. Each cycle of the RF electric field may increase the energy of the particles so that when they emerge out of acceleration cavity 310, the effect may be the same as if they were accelerated by a static electric field. In some embodiments, acceleration cavity 310 may additionally function as a lens. For example, besides accelerating charged particles or forming them into bunches, acceleration cavity may also divert traveling directions of the charged particles, such as converging them into a downstream component (e.g., bunching cavity 320).

In some embodiments, multi-beam apparatus 300 may comprise bunching cavity 320 (also referred to herein as an RF chopper system) configured to receive and modify the primary electron beam from acceleration cavity 310. For example, when primary electron source 301 is a pulsed electron source, bunching cavity 320 may modify the period of electron pulses. The electron pulses generated by acceleration cavity 310 may be reduced ("compressed"). For example, the electron pulses may be compressed to 100 fs (femtoseconds), or a frequency of 10 THz (terahertz) to allow for fast electron beam imaging. Other electron pulse periods or frequencies may be used, as appropriate. For another example, when primary electron source 301 is a continuous electron source, bunching cavity 320 may generate a pulsed primary electron beam from the received continuous primary electron beam. It should be noted that, when primary electron source 301 is a pulsed electron source, bunching cavity 320 may be optional in multi-beam apparatus 300.

In some embodiments, when primary electron source 301 is a pulsed electron source, an RF chopper system of bunching cavity 320 may "chop" out a fraction of the pulses such that the pulses are at the proper repetition frequency or sub-harmonics thereof. Although FIG. 3 illustrates bunching cavity 320 disposed downstream from acceleration cavity 310, it is to be appreciated that bunching cavity 320 may be disposed upstream from acceleration cavity 310 such that the period of the electron pulses generated by primary electron source 301 may be adjusted to match the frequency of RF waves in acceleration cavity 310. In some embodiments, one or more bunching cavities may be used, as appropriate.

In some embodiments, when primary electron source 301 is a pulsed electron source, bunching cavity 320 may additionally function as a cluster generator. That is, bunching cavity 320 may further group charged-particle pulses into clusters. Each cluster may include one or more consecutive pulses such that intra-cluster distances may be shorter than inter-cluster distances.

In some embodiments, multi-beam apparatus 300 may comprise deflection cavity 330 configured to receive a beam of electron pulses from bunching cavity 320 and deflect individual pulses of the beam to different directions to form a plurality of deflected charged-particle beams, such as deflected electron beams 305_1 and 305_2. Deflected electron beams 305_1 and 305_2 may be similar to one or more of primary beamlets 102_1, 102_2, and 102_3 in FIG. 2. An electron beam, as used herein, may comprise a group or a "bunch" of electron pulses having a frequency (e.g., in a range of 100 MHz to 10 GHz). Deflection cavity 330 may comprise one or more beam deflectors configured to direct the bunches of electron pulses generated by bunching cavity 320. In some embodiments, deflection cavity 330 may receive electron pulses from bunching cavity 320 and deflect individual pulses into a plurality of directions to form deflected electron beams 305_1 and 305_2. It should be noted that any deflector described herein, including deflectors in deflection cavity 330, may direct charged particles (e.g., electrons) to either change their moving directions (via deflection) or keep their moving directions unchanged. That is, the deflectors may apply a "neutral" effect on charged particles when directing them. In some embodiments, the deflectors described herein, including deflectors in deflection cavity 330, may be RF cavities or implementations other than RF cavities (e.g., MEMS deflectors).

In some embodiments, deflection cavity 330 may operate in synchronization with primary electron source 301. In particular, deflection cavity 330 may be operated at an operating frequency synchronous with the source frequency, such that the operating frequency and the source frequency are related based on the equation 1 below:

$$v1 = \frac{1}{n}(v2) \qquad \text{Equation 1}$$

where v1 is the operating frequency, v2 is the source frequency, and n is a positive integer. As used herein, source frequency is the frequency of the RF source or primary electron source 301, operating frequency is the frequency of deflection cavity 330, and n indicates the number of deflected charged-particle beams to be generated. For example, for a source frequency of 4 GHz and n=2, the operating frequency of deflection cavity 330 may be 2 GHz. In other words, if the source frequency is 4 GHz and deflection cavity 330 is operated at 2 GHz, deflection cavity 330 may generate two deflected electron beams, such as 305_1 and 305_2, as illustrated in FIG. 3. The frequency of each of deflected electron beams 305_1 and 305_2 may be 2 GHz. It is to be appreciated that any number of deflected electron beams may be generated, as desired.

In some embodiments, deflected electron beams 305_1 and 305_2 may be deflected symmetrically-off primary optical axis 302, as shown in FIG. 3. For example, 305_1 and 305_2 may be deflected such that the angle subtended by the primary axis of 305_1 and primary axis of 305_2 may be 180° and primary optical axis 302 bisects the subtended angle.

In some embodiments, according to Equation 1, for a source frequency of 4 GHz and the operating frequency of deflection cavity 330 of 1 GHz, four deflected electron beams may be generated, each having a frequency of 1 GHz. In other words, the operating frequency of deflection cavity 330 may be selected based on the number of deflected electron beams desired. Each deflected electron beam (e.g., deflected electron beams 305_1 and 305_2) may travel downstream from deflection cavity 330 towards sample 390 to generate a corresponding probe spot on sample 390.

In some embodiments, multi-beam apparatus 300 may comprise more than one deflection cavities. For example, a second deflection cavity (not shown) configured to generate deflected electron beams may be disposed perpendicular to deflection cavity 330. In such a configuration, the probe spots formed by deflected electron beams generated by second deflection cavity may be perpendicular to probe spots formed by deflected electron beams such as 305_1 and 305_2, generated by deflection cavity 330. Such an arrangement may result in a two-dimensional pattern of probe spots formed on sample 390.

In some embodiments, the number and pattern of probe spots on sample 390 may be determined by, but not limited to, the number of deflectors within deflection cavity 330, the number of deflection cavities, the operating frequency of deflection cavity 330, the spatial arrangement of deflectors or deflection cavities, etc.

In some embodiments, a two-dimensional pattern of probe spots may comprise a square matrix, a rectangular matrix, an array, or a Lissajous pattern. A Lissajous pattern or a Lissajous curve, as used herein, may be defined as the pattern produced by the intersection of two sinusoidal curves, the axes of which are perpendicular to each other. In some embodiments, a one-dimensional pattern of probe spots may be generated, for example, a number of linearly arranged probe spots on sample 390.

In some embodiments, a de-bunching cavity (not illustrated) may be used to de-compress the electron pulses, as appropriate. One or more de-bunching cavities may be employed in multi-beam apparatus 300 to suit the application or sample being investigated.

Referring back to FIG. 3, multi-beam apparatus 300 may comprise condenser lens 340. Condenser lens 340 of multi-beam apparatus 300 is substantially similar to condenser lens 110 of electron beam tool 100 illustrated in FIG. 2. Condenser lens 340 may be positioned downstream from deflection cavity 330 and configured to converge deflected electron beams 305_1 and 305_2, such that they cross-over along primary optical axis 302, on a plane perpendicular to primary optical axis 302. Condenser lens 340 may be configured to focus each of deflected electron beams 305_1 and 305_2. It is appreciated that condenser lens 340 may be configured to focus and converge any number of deflected charged-particle beams as appropriate.

Multi-beam apparatus 300 may comprise detector 350. In some embodiments, detector 350 is similar to detection device 140 of FIG. 2. Detector 350 may be configured to detect, but not limited to, secondary electrons, back-scattered electrons, transmitted electron, X-rays, auger electrons, etc. depending on factors such as the accelerating voltage, sample density, among other things. Secondary electrons, for example, may be generated from the probe spots on sample 390 formed by deflected electron beams 305_1 and 305_2.

In some embodiments, detector 350 may comprise solid-state detectors containing p-n junctions for detecting back-scattered electrons, or an Everhart-Thornley detector for secondary electrons. A secondary electron detector, such as Everhart-Thornley detector may include a scintillator inside a Faraday cage, which is positively charged and configured to attract the secondary electrons. The scintillator may then be used to accelerate the electrons and convert them to light signals before reaching a photomultiplier for amplification. Detector 350 may be positioned at an angle to increase the detection efficiency of detecting secondary electrons.

Figure 4:
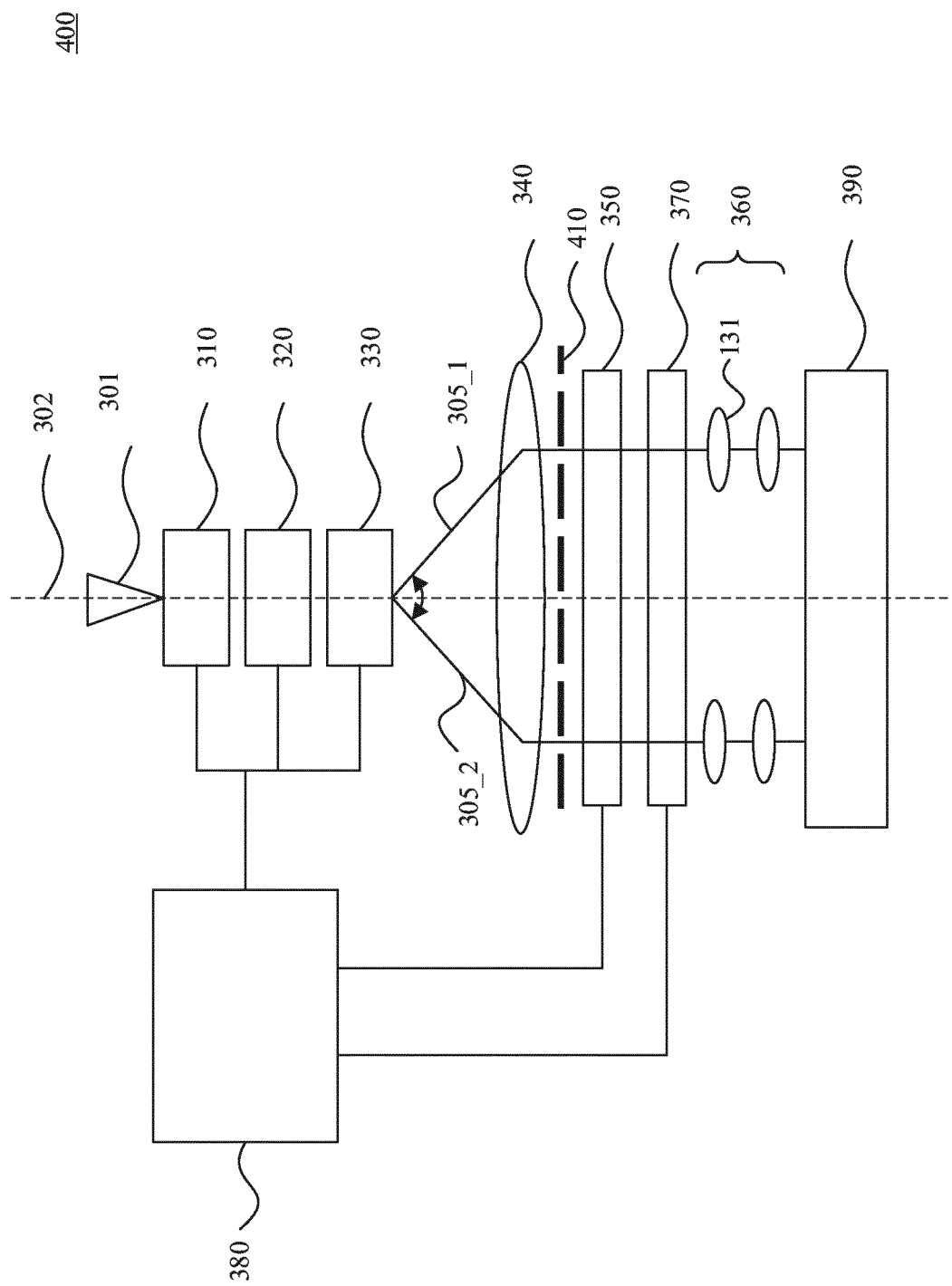
FIG. 4 is a schematic diagram illustrating an exemplary multiple electron beam system using a timing control mechanism in a multiple-lens configuration, consistent with embodiments of the present disclosure.

In some embodiments, multi-beam apparatus 300 may comprise primary projection system 360. Primary projection system 360, also referred to as an electron optical system, may comprise a single-lens system or a multi-lens system. Multi-beam apparatus 300 of FIG. 3 comprises a single-lens system, whereas multi-beam apparatus 400 of FIG. 4 describes a multi-lens system. Primary projection system 360 may include objective lens 131 of FIG. 2. In some embodiments, primary projection system 360 comprising objective lens 131 may be configured to focus each deflected electron beams 305_1 and 305_2 onto sample 390. Primary projection system 360 may comprise more than one objective lens 131, as illustrated in FIG. 4 (described later).

To obtain a higher resolution of images formed by a charged-particle beam (such as, primary electron beam 102 of FIG. 2) objective lens 131 may be an electromagnetic compound lens in which the sample may be immersed in the magnetic field of objective lens 131. In some embodiments, objective lens 131 may include a magnetic lens and an electrostatic lens (not illustrated). The magnetic lens may be configured to focus the charged-particle beam, or each primary beamlet in a multi-beam apparatus (such as, electron beam tool 100 of FIG. 2), at relatively low aberrations to generate relatively small probe spots on a sample. The electrostatic lens may be configured to influence the landing energy of the charged-particle beam or each primary beamlet to ensure that the primary charged-particles land on the sample at a relatively low kinetic energy and pass through the apparatus with a relatively high kinetic energy. In some embodiments, objective lens 131 may be configured to be an "immersion lens." As a result, the sample may be immersed both in an electrostatic field E (electrostatic immersion) of the electrostatic lens and a magnetic field B (magnetic immersion) of the magnetic lens. Electrostatic immersion and magnetic immersion may reduce aberrations of objective lens 131. As electrostatic and magnetic fields get stronger, the aberrations of objective lens 131 may become smaller. Electrostatic field E, however, should be limited to within a safe range in order to avoid discharging or arcing on the sample. Due to this limitation of the field strength of electrostatic field E, further enhancement of the magnetic field strength in an immersion configuration may allow a further reduction in the aberrations of objective lens 131, and thereby improve image resolution.

Referring back to FIG. 3, in some embodiments, deflected electron beams 305_1 and 305_2 may arrive on surface of sample 390, in an at least a substantially perpendicular direction. Magnetic immersion, however, may influence the landing angles of all primary modified beamlets landing on sample 390. In particular, magnetic field B may cause each electron in a modified beamlet to obtain an angular velocity $\theta^{(1)}$, as shown in equation (2) below:

$$r^2\theta^{(1)} = \frac{1}{2}\frac{e}{m}r^2B + C \qquad \text{Equation 2}$$

wherein C is a constant related to an initial angular velocity of the electron, r is a position shift from optical axis of objective lens 131, and e and m are the charge and the mass of the electron, respectively. For the electron to land on sample 390 in a perpendicular manner, angular velocity $\theta^{(1)}$ must be zero on sample 390.

In some embodiments, magnetic lens may be configured to operate in a non-magnetic immersion mode, and magnetic field B is zero (or substantially zero) or below the preset ratio value on sample 390. If an electron enters magnetic field B along a meridional path, its corresponding constant C is zero and its angular velocity $\theta^{(1)}$ will be zero or substantially zero on sample 390. Objective lens 131 may have a real front focal point on its front focal plane. When the chief rays (or center rays) of off-axis deflected electron beams 305_1 and 305_2 enter objective lens 131 along some specific meridional paths, the chief rays can pass through the real front focal point and off-axis deflected electron beams 305_1 and 305_2 can land perpendicular on sample 390. Accordingly, deflected electron beams 305_1 and 305_2 may overlap together on the front focal plane and form a relatively sharp beamlet crossover centering at the real front focal point.

In other embodiments, magnetic lens may be configured to operate in magnetic immersion mode in which magnetic field B is not zero on sample 390. Therefore, angular velocity $\theta^{(1)}$ of an electron may be zero (or substantially zero) on sample 390 if its corresponding constant C is not zero when the electron enters magnetic field B and complies with the condition in equation (3):

$$C = -\frac{1}{2}\frac{e}{m}r^2B \qquad \text{Equation 3}$$

When C is not equal to zero, the electron enters magnetic field B along a skew path and cannot cross primary optical axis before entering magnetic field B. Hence, an electron can perpendicularly land on sample 390 only if entering magnetic field B along a specific skew path, and the electron cannot really cross primary optical axis during passing through magnetic field B. Accordingly, objective lens 131 may have a virtual front focal point. When the chief rays (or center rays) of off-axis deflected electron beams 305_1 and 305_2 enter objective lens 131 along some specific skew paths, they can virtually pass through virtual front focal point and land perpendicular on sample 390. Under this scenario, off-axis deflected electron beams 305_1 and 305_2 are closest to each other on principal plane of objective lens 131, and each off-axis deflected electron beams 305_1 and 305_2 has a radial shift from primary optical axis 302. The deflected electron beams 305_1 and 305_2, therefore only partially overlap with each other on principal plane and form a partial overlap beamlet crossover on principal plane. Moreover, radial shift increases as magnetic field B on sample 390 increases. Current density is lower in the partial overlap beamlet crossover than in the foregoing sharp beamlet crossover. Therefore, the Coulomb interaction effect between deflected electron beams 305_1 and 305_2 in magnetic immersion mode is relatively low, thereby further contributing to the small sizes of probe spots.

In some embodiments, multi-beam apparatus 300 may include beam raster system 370 configured to scan deflected electron beams 305_1 and 305_2 on sample 390. Beam raster system 370 may be positioned downstream from primary projection system 360, as shown in FIG. 3. Alternatively, beam raster system 370 may be positioned between condenser lens 340 and primary projection system 360. Beam raster system 370 may be configured to raster or scan the received deflected electron beams 305_1 and 305_2 on sample 390 in a predefined pattern, as appropriate. In some embodiments, beam raster system 370 may be aligned with primary optical axis 302.

Referring back to FIG. 3, multi-beam apparatus 300 may comprise controller 380 configured to synchronize the relevant components of apparatus 300, such as, but not limited to, RF cavity including acceleration cavity 310, bunching cavity 320, and deflection cavity 330, detection systems including detector 350, and beam raster system 370, etc. In some embodiments, controller 380 may be electronically connected to electron beam tool 100. Controller 380 may be a computer configured to execute various controls of EBI system 1. For example, controller 380 may be connected to various parts of EBI system 1 of FIG. 1, such as source conversion unit 120, electron detection device 140, primary projection system 130, or motorized stage 109. In some embodiments, as explained in further details below, controller 380 may perform various image and signal processing functions. Controller 380 may also generate various control signals to govern operations of the charged particle beam inspection system.

In some embodiments, controller 380 may include one or more processors (not shown). A processor may be an electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 380 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

In some embodiments, controller 380 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to detector 350 through a medium such as an electrical conductor, optical fiber cable, portable storage media, IR, Bluetooth, internet, wireless network, wireless radio, among others, or a combination thereof. In some embodiments, the image acquirer may receive a signal from detector 350 and may construct an image. The image acquirer may thus acquire images of sample 390. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from detector 350. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 390. The acquired images may comprise multiple images of a single imaging area of sample 390 sampled multiple times over a time sequence. The multiple images may be stored in the storage. In some embodiments, controller 380 may be configured to perform image processing steps with the multiple images of the same location of sample 390.

In some embodiments, controller 380 may include measurement circuitries (e.g., analog-to-digital converters) to obtain a distribution of the detected secondary electrons. The electron distribution data collected during a detection time window, in combination with corresponding scan path data of each of deflected electron beams 305_1 and 305_2 incident on the wafer surface, can be used to reconstruct images of the wafer structures under inspection. The reconstructed images can be used to reveal various features of the internal or external structures of sample 390, and thereby can be used to reveal any defects that may exist in the wafer.

In some embodiments, sample 390 may be placed in multi-beam apparatus 300 in a way similar to sample 190 in electron beam tool 100. For example, controller 380 may control motorized stage (e.g., such motorized stage 109 of FIG. 2) to move sample 390 during inspection of sample 390. In some embodiments, controller 380 may enable motorized stage 109 to move sample 390 in a direction continuously at a constant speed. In other embodiments, controller 380 may enable motorized stage 109 to change the speed of the movement of sample 390 overtime depending on the steps of scanning process.

In some embodiments, controller 380 may be configured to control injection by triggering primary electron source 301 and activating acceleration cavity 310 and bunching cavity 320 at appropriate times. Also, beam diagnostic components (not illustrated) including, but not limited to, beam position monitors, current transformers, profile monitors, etc. may be synchronized to the passage of the charged-particle beam with high precision and fine time resolution, defined as "fast timing".

In some embodiments, controller 380 may be a timing controller configured to timestamp control system processes such as, but not limited to, formation of a plurality of deflected charged-particle beams, detection of multiple signals comprising secondary electrons generated from the probe spots, correlating measurements and timing information of formation of deflected electron beams and detection of signals, etc.

In some embodiments, as illustrated in FIG. 3, controller 380 may be configured to communicate with each of acceleration cavity 310, bunching cavity 320, deflection cavity 330, detector 350, and beam raster system 370. In some embodiments, controller 380 may be configured to communicate with and control operation of other components, such as beam optical components, electromagnetic lens, beam collimators, sample stage, position monitors, etc.

In some embodiments, controller 380 may include, but is not limited to, timing circuit components comprising digital and analog circuits, microprocessors, data storage module, communications module including data ports, display module, sequencing circuits, etc. Controller 380 may communicate with an external computer or a processor as well.

Reference is now made to FIG. 4, which illustrates a multi-beam apparatus 400 using a multi-lens system, consistent with embodiments of the present disclosure. Multi-beam apparatus 400 may comprise primary electron source 301, deflected electron beams 305_1 and 3052, acceleration cavity 310, bunching cavity 320, deflection cavity 330, condenser lens 340, detector 350, primary projection system 360, beam raster system 370, controller 380, and sample 390. Multi-beam apparatus 400 may include a beam aperture array 410 comprising a plurality of apertures or holes.

In some embodiments, as shown in FIG. 4, beam aperture array 410 may be placed between condenser lens 340 and detector 350. Beam aperture array 410 may comprise a matrix of uniform apertures, for example, each of the apertures of beam aperture array 410 may be uniform in cross-section, shape, or size. In some embodiments, the apertures may be arranged in a linear, circular, rectangular, spiral, zig-zag, serpentine, triangular pattern, or combinations thereof. In some embodiments, the apertures within beam aperture array 410 may be non-uniform in shape, size or cross-section. It is appreciated that apertures of beam aperture array 410 may be laid out randomly across the array. Other suitable layouts and configurations of the apertures may be used as well.

In some embodiments, beam aperture array 410 may comprise a metal, a ceramic, a plastic, an alloy, a composite, a semiconductor, or any suitable material that is vacuum-compatible and can be processed to form apertures. The apertures of beam aperture array 410 may be fabricated using photolithography, embossing, ultraprecision laser machining, injection molding, mechanical drilling, etc. or any suitable technique.

In some embodiments, the pattern of apertures of beam aperture array 410 may be predefined and the information related with the aperture pattern such as, but not limited to, number, pitch, size, location, arrangement, cross-section, etc. may be retrievably stored in a database or data storage module of controller 380, or the like.

In some embodiments, controller 380 may be configured to synchronize timing and deflection of electron beams based on the aperture pattern. In some embodiments, the operating frequency of deflection cavity 330 may also be adjusted based on the number or pitch of apertures arranged in beam aperture array 410.

As illustrated in FIG. 4, primary projection system 360 may include a plurality of objective lens 131 for each deflected electron beam. Each objective lens 131 may be aligned with primary axis of a corresponding deflected electron beam 305_1 or 305_2. Such a configuration may allow each deflected electron beam (e.g., deflected electron beams 305_1 and 305_2) to be focused and manipulated independently.

The chromatic and spherical aberrations of round lenses may be the main factors limiting resolution in charged-particle beam systems such as multi-beam apparatus 300 of FIG. 3 or multi-beam apparatus of FIG. 4. Astigmatism may result from misalignment or from limitations in manufacturing tolerances and can be compensated by electric or magnetic stigmators. However, in contrast to light optics, the chromatic and spherical aberrations cannot be corrected by lens combinations. Independent of type and geometry of a round lens, the spherical aberration coefficient and the chromatic aberration coefficient are always positive. This fundamental property of electron-optical round lenses is referred to as Scherzer's theorem. As a consequence, the electron beam paths in multi-beam apparatus 300 may be restricted by very small aperture diaphragms. It is to be appreciated that the preconditions for validity of Scherzer's theorem or occurrence of spherical aberration are: round lenses, real images, static fields (time-independent), and no space charge.

Typically, chromatic aberration correction may be obtained using either a monochromator, an electron mirror, or crossed electric and magnetic quadrupoles acting as Wien filters. For spherical aberration correction, it is necessary to break the rotational symmetry. This can be accomplished by using electromagnetic multipole lenses such as, but not limited to, dipoles, quadrupoles, sextupoles, octopoles, etc.

In some embodiments, multi-beam apparatus 400 may use time-varying electric fields (time-dependent) to manipulate and focus each deflected electron beam, thus allowing for correction of spherical aberration. This may enable larger opening angles and larger beam currents to be used, also providing larger field-of-view in electron microscopes, such as multi-beam apparatus 300 of FIG. 3.

Figure 5C:
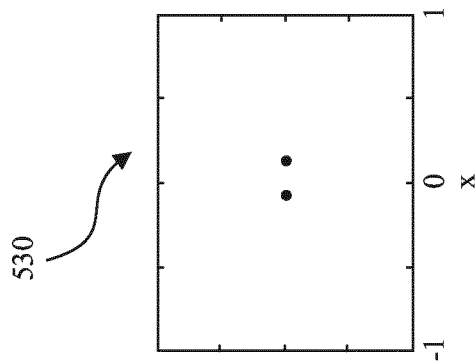
FIGS. 5B and 5C illustrate exemplary high frequency scan patterns for observing samples using a multiple electron beam system, consistent with embodiments of the present disclosure.
Figure 5B:
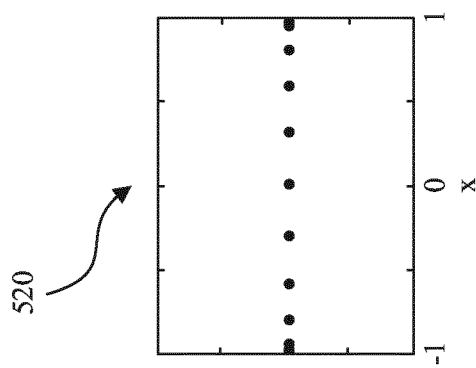
Figure 5A:
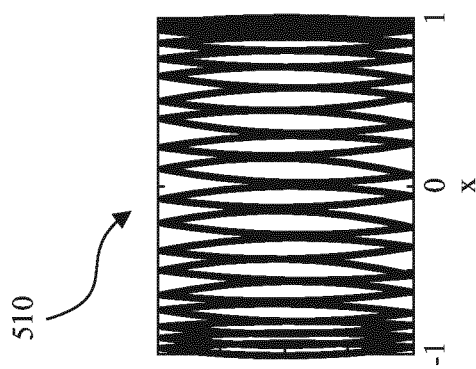
FIG. 5A illustrates an exemplary low frequency scan pattern for observing samples using a multiple electron beam system, consistent with embodiments of the present disclosure.

FIG. 5A illustrates a low frequency scan pattern 510 for observing samples using multi-beam apparatus 300 or 400, consistent with embodiments of the present disclosure. Low frequency scan pattern 510 may comprise a one-dimensional pattern or a two-dimensional pattern. In some embodiments, two-dimensional patterns may include a matrix, an array, or a Lissajous pattern (as illustrated in FIG. 5A), or combinations thereof.

In some embodiments, a low frequency scan as shown in FIG. 5A, comprises multiple probe spots arranged in a pattern forming two sinusoidal curves, the axes of which are mutually perpendicular. Such a scan comprising a plurality of probe spots may be useful in large-area scanning of a sample, such as sample 390.

FIGS. 5B and 5C illustrate high frequency scan patterns 520 and 530, for observing samples using multi-beam apparatus 300 or 400, consistent with embodiments of the present disclosure. Although high frequency scan patterns 520 and 530 are one-dimensional, two-dimensional patterns may also be used. The frequency for high frequency scans may be adjusted by adjusting either the source frequency of accelerated electron pulses, the operating frequency of deflection cavity 330, or both.

Figures 6A, 6B:
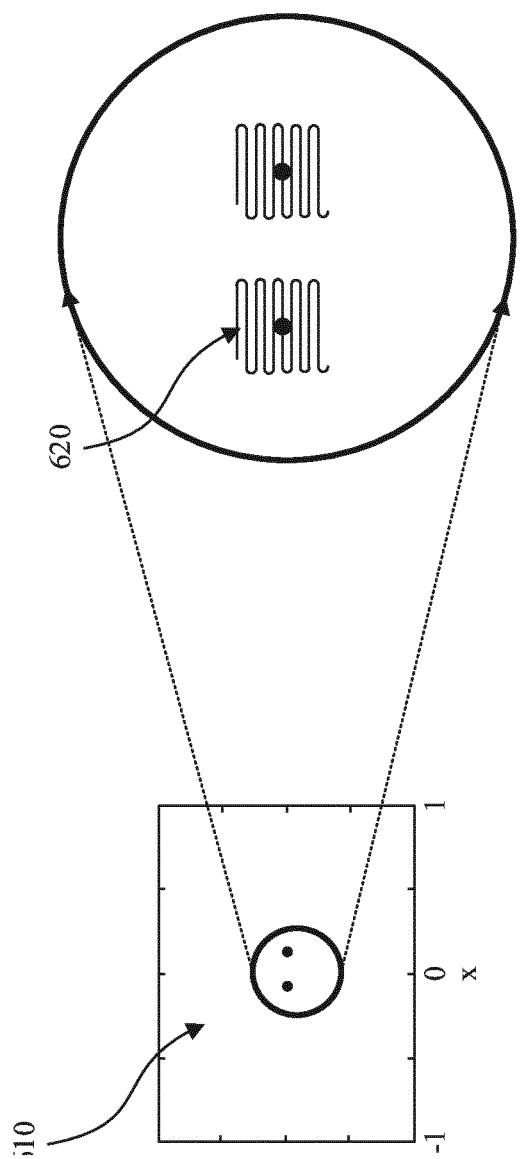
FIGS. 6A and 6B illustrate an adjustable scan frequency pattern for imaging samples using a multiple electron beam system, consistent with embodiments of the present disclosure.

Reference is now made to FIGS. 6A and 6B, which illustrate high frequency scan pattern 610 and low frequency scan pattern 620, respectively, for observing samples using multi-beam apparatus 300 or 400, consistent with embodiments of the present disclosure. FIG. 6A illustrates a one-dimensional high frequency scan pattern 610 with two probe points. FIG. 6B illustrates a two-dimensional low frequency scan pattern 620 performed on each of probe points shown in high frequency scan pattern 610 of FIG. 6A.

In some embodiments, the frequency of the scan may be adjusted by changing the operating frequency of deflection cavity 330, or changing source frequency using RF choppers, or using a de-bunching cavity, or other appropriate means. The scan frequency can be lowered, increased, or quickly switched between low and high, based on the requirement and application. For example, a user may perform a large area scan of sample 390 using low scan frequency to locate a target region of interest or a feature on a wafer, and upon locating the feature, may switch to a high frequency scan for a deeper analysis of the identified feature.

In some embodiments, for example, a user may perform a high frequency scan with fewer points (e.g., high frequency scan pattern 610) to locate a feature on sample 390. The user may add a two-dimensional low frequency scan pattern 620 to locally inspect the identified feature. In some embodiments, low frequency scan pattern 620 may be, but is not limited to, serpentine, circular spirals, rectangular spirals, concentric circles, etc.

The tunability between fast low-resolution inspection and target localization or high-resolution inspection, efficient beam usage, higher productivity, simple modification of existing technology, and high inspection throughput may be some of the advantages of the embodiments of this disclosure.

An image manipulation software may be used to generate an image from the Lissajous pattern to a representative x-y coordinate system, enabled by the timing information obtained by controller 380. In other words, the timing information allows for interpretation of the plurality of signals received from a Lissajous pattern of probe spots corresponding to the region of sample 390 investigated. It is to be appreciated that commonly known and available image manipulation or image processing software/application may be used.

Figure 7:
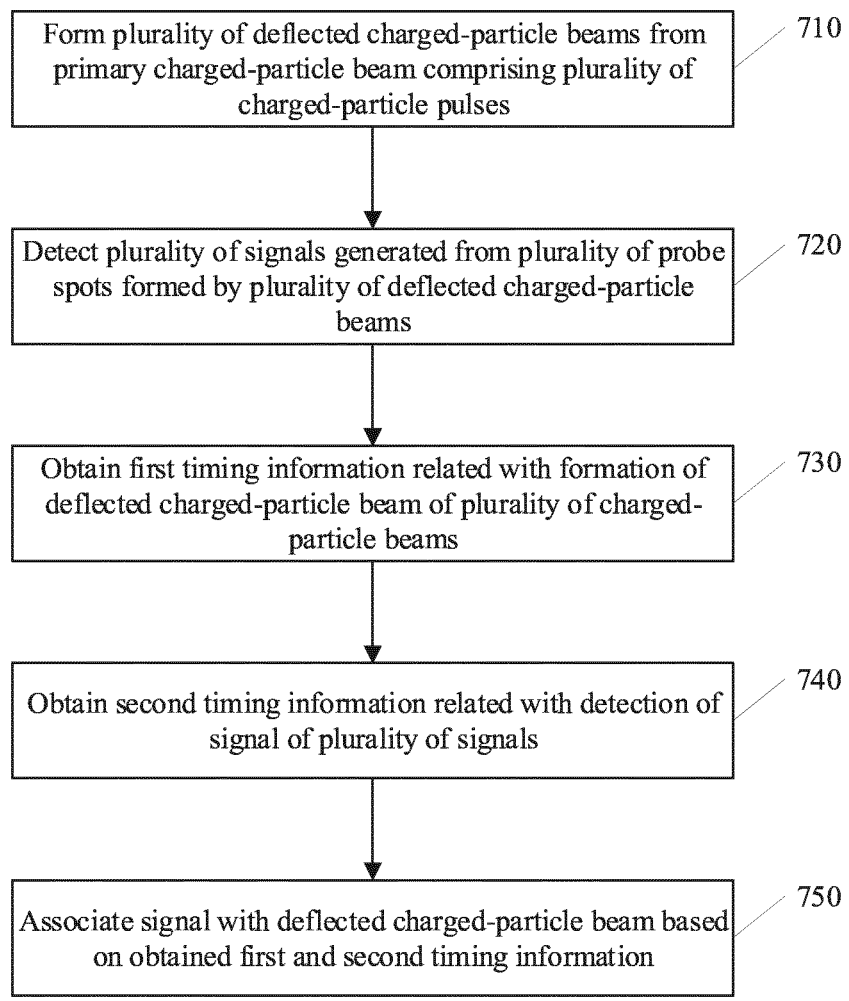
FIG. 7 is a flowchart showing an exemplary method of observing a sample using a multiple electron beam system, consistent with embodiments of the present disclosure.

FIG. 7 is a process flowchart of an exemplary method 700 of observing a sample using a multi-beam apparatus (e.g., multi-beam apparatus 300 of FIG. 3), consistent with embodiments of the present disclosure. The method 700 may include forming a plurality of deflected charged-particle beams; detecting a plurality of signals generated by the plurality of deflected charged-particle beams; and associating timing information related with formation of deflected charged-particle beams and signals.

In step 710, a deflection cavity (e.g., deflection cavity 330 of FIG. 3), also referred to herein as a deflector, may be configured to form a plurality of deflected charged-particle beams from a primary charged-particle beam comprising a plurality of charged-particle pulses. For example, the primary charged-particle beam may be a pulsed electron beam exiting bunching cavity 320 in FIG. 3, and the deflected charged-particle beams may be deflected electron beams 305_1 and 305_2 of FIG. 3. In the context of this disclosure, as described earlier, the deflected charged-particle beams comprise bunches of charged-particle pulses, rather than a continuous beam of charged-particles. The charged-particle pulses may be generated from a primary charged-particle source (e.g., primary electron source 301 of FIG. 3). The primary electron source may comprise, among others, a superconducting radio-frequency photoinjector, a normal conducting radio-frequency photoinjector, a high voltage direct current photoemission gun followed by an RF accelerating module photoinjector, or combinations thereof. The multi-beam apparatus 300 may include an RF cavity or a laser-trigger based cavity including, but not limited to, an acceleration cavity (e.g., acceleration cavity 310 of FIG. 3), a bunching cavity (e.g., bunching cavity 320 of FIG. 3), and the deflection cavity. The RF cavity may include one or more of each of the acceleration, bunching and deflection cavities.

An electron beam formed by the deflection cavity may be characterized as a beam comprising a "bunch" of electron pulses having high frequency. The frequency of the electron pulses of an electron beam may be based on the operating frequency of the deflectors and the source frequency of the RF powered electron source. The electron pulse frequency may be in the range of 100 MHz to 10 GHz.

In some embodiments, a plurality of deflection cavities may be used to generate a plurality of deflected electron beams. For example, a first and a second deflection cavity, each generating two deflected electron beams, may be disposed perpendicular to each other such that a rectangular matrix of four probe spots may be formed on sample 390. It is to be appreciated that a number of combinations of deflection cavities, their arrangement, and operating frequency may be possible as well.

In step 720, a detector (e.g., detector 350 of FIG. 3) may be configured to detect a plurality of signals generated from electrons exiting from a plurality of probe spots formed by the plurality of deflected electron beams. In some embodiments, in response to incidence of primary beamlets (e.g., primary beamlets 1021, 1022, and 102_3 in FIG. 2) on the plurality of probe spots (e.g., probe spots 102_1s, 102_2s, and 102_3s in FIG. 2) on a sample (e.g., sample 190 in FIG. 2), electrons exit from the sample and form exiting electron beams (e.g., secondary electron beams 102_1se, 102_2se, and 102_3se in FIG. 2). The exiting electrons may include, for example, secondary electrons, back-scattered electrons, transmitted electrons, auger electrons, or the like. The exiting electron beams may be deflected (e.g., by beam separator 160 in FIG. 2) towards a detection device (e.g., electron detection device 140 in FIG. 2) through a secondary projection system (e.g., secondary projection system 150 in FIG. 2). Secondary projection system 150 may focus the exiting beams onto the detection device. The detection device may include one or more detection elements (e.g., detection elements 140_1, 140_2, and 140_3 in FIG. 2), which may be arranged to detect corresponding exiting beams and generate corresponding signals that are sent to a controller or a signal processing system (not shown) to construct images of the corresponding scanned areas of the sample.

In step 730, a controller (e.g., controller 380 of FIG. 3) may be configured to obtain a first timing information related with formation of the deflected electron beam of the plurality of deflected electron beams. The controller may be configured to communicate with the deflection cavity to obtain the first timing information. The first timing information may include, but is not limited to, a time of deflection of a charged-particle pulse of the deflected beam or time of deflection, a time of formation of a charged-particle pulse of the primary charged-particle beam, a frequency or a period of the electron beam, or an average number of electron pulses in the beam, etc. For example, the time of deflection of the charged-particle pulse of the deflected charged-particle beam may include a timestamp when a deflector (e.g., deflection cavity 330 in FIG. 2) directs a charged-particle pulse of the deflected charged-particle beam (e.g., a compressed beam exiting bunching cavity 320) into a direction to form a portion of the deflected beam (e.g., deflected electron beam 305_1 in FIG. 2). The first timing information may also include timestamps when the pulses of the pulsed primary electron beam are generated (e.g., by bunching cavity 320 in FIG. 3). If the electron source is a laser induced pulsed source, the first timing information may also include timestamps when a laser illuminates the pulsed source for boosting electron emission. For another example, if a primary electron beam is a continuous beam, the first timing information may include timestamps when an RF cavity converts a portion of the continuous beam into a pulse of electrons. The first timing information may be obtained by the controller controlling the deflector. In some embodiments, the first timing information may be retrievably stored in a data storage module of the controller. It is appreciated that step 730 may occur during or after the forming of a plurality of deflected charged particle beams at step 710.

In step 740, the controller may be configured to obtain a second timing information related with detection of a signal of the plurality of signals from the plurality of probe spots formed by the plurality of deflected electron beams. The controller may be configured to communicate with the detector to obtain timing information including, but not limited to, time of detection of a signal, energy of the electron, etc. The second timing information related with the detection of a signal may be retrievably stored in the data storage module of the controller. The first and the second timing information may be stored in a remote accessible location such as a server, computer, processor, external memory modules, etc. as well, in communication with the controller. It is appreciated that step 740 may occur during or after the detecting the plurality of signals at step 720.

In step 750, the controller may be configured to associate the detected signal and the corresponding deflected electron beam based on the obtained first and second timing information. The timing information related with formation of the deflected electron beam and the detection of the corresponding signal stored in the controller may enable conversion of the plurality of detection signals to a visual representation of the region of sample 390 being investigated, by an image manipulation tool such as, but not limited to an image processing software, an image manipulation application, etc.

In some embodiments, the controller may be configured to obtain timing information through timing signals. A timing signal, as referred to herein, may be an electric pulse, a voltage signal, a current signal, etc. based on the component generating the signal or generated by the clock of the processor of the controller.

The controller may be further configured to synchronize the timing of relevant components of the multi-beam apparatus including, but not limited to, primary electron source, acceleration cavity, deflection cavity, bunching cavity, detector, beam raster system, etc. The timing of injection of pulses into the acceleration cavity, bunching of electron pulses by the bunching cavity, deflection of the formed bunches, etc. may have to be synchronized for an efficient operation of the multi-beam apparatus based on RF powered beams.

Reference is now made to FIGS. 8A-8B, which illustrate two exemplary methods of controlling charged particles to enter a crossover area (or "common area") in a multi-beam apparatus, consistent with embodiments of the present disclosure. FIG. 8A shows a first method of controlling charged particles (e.g., electrons) of beams 802, 804, and 806 to enter a crossover area 808 near an objective lens 810. In some embodiments, objective lens 810 may be objective lens 131 in FIG. 2. FIG. 8A shows beams 802, 804, and 806 as pulsed beams as an example. In some embodiments, beams 802, 804, and 806 may also be continuous beams, in which electrons travel like a stream. For ease of explanation without causing ambiguity, beams 802, 804, and 806 will be described as pulsed beams hereinafter unless specified otherwise. However, it should be noted that any description related to beams 802, 804, and 806 may be equivalently applicable to pulsed beams and continuous beams. The pulses of charged particles are shown as round dots along the direction of beams 802, 804, and 806. Beams 802, 804, and 806 cross each other at crossover area 808. Crossover area 808 is a position in space. In some embodiments, crossover area 808 may be near, on, or in objective lens 810. As can be seen in FIG. 8A, at a given time, there may be more than one beam that crosses crossover area 808, in which charged particles from different beams may come across each other. That is, when beams 802, 804, and 806 are pulsed beams (as shown in FIG. 8A), there is time when more than one pulse of charged particles cross at or are near crossover area 808. When beams 802, 804, and 806 are continuous beams (not shown), there is time when electrons from at least two of beams 802, 804, and 806 cross at or are near crossover area 808. This may lead to significant Coulomb effect.

The Coulomb effect may occur between the beamlets in two directions: a longitudinal direction (i.e., along the travel direction of the charged particles) and a transversal direction (i.e., perpendicular to the travel direction of the charged particles). In a longitudinal direction, the Coulomb effect may occur between charged particles of the same beamlet if they are too close. For example, if a beamlet is a pulsed beamlet in which charged particles are bunched into pulses, the longitudinal Coulomb effect may occur if the pulses are too compressed. In a transversal direction, the Coulomb effect may occur between charged particles of neighboring beamlets if they are too close. For example, if the neighboring beamlets are too close to each other, the transversal Coulomb effect may occur. The longitudinal Coulomb effect may cause the energy of the same-beam charged particles to become less uniform, which may further cause chromatic aberration in generated inspection images. The transversal Coulomb effect may enlarge the cross-sectional size of the beamlet (e.g., due to repelling of the charged particles with like charges). Both the longitudinal and the transversal Coulomb effect may enlarge the sizes of the probing spots on the sample and deteriorate imaging resolution. Typically, the major contribution of the deterioration comes from the transversal Coulomb effect.

For example, in some embodiments, in FIG. 8A, when the multi-beam apparatus provides 50 beams and each beam has a current of 10 nano-Ampere (nA), the Coulomb effect at crossover area 808 may contribute to an enlargement of a spot size for 12.1 nanometer (nm) on a surface of a sample (e.g., a silicon wafer). The spot size may be determined as a line of 50% signal strength enclosing a portion of full width of detected signals ("FW50 method"). Without the Coulomb effect, a beam spot may be of a size 10 nm. With the Coulomb effect, the beam spot may be of a size 15.7 nm. That amounts to about a 60% increase of the spot size. Also, in this example, the Coulomb effect at crossover area 808 may contribute to an increase of energy spread of the pulses for about 0.1 electron volt (eV), as compared with a typical energy spread of 0.5-0.7 eV for a beam in a high-resolution multi-beam SEM. That amounts to 14-20% increase of the energy spread. Due to the Coulomb effect, it could set limits for the multi-beam apparatus in this example to achieve a higher imaging resolution.

FIG. 8B illustrates another method of controlling charged particles of beams 812, 814, and 816 to enter crossover area 808 near objective lens 810. In beams 812, 814, and 816, pulses of charged particles are grouped into clusters (shown as triplet round dots), such as, for example, by acceleration cavity 310 or bunching cavity 320 in FIG. 3. Each cluster may include one or more consecutive pulses such that intra-cluster distances may be shorter than inter-cluster distances. The clusters are released in a predetermined time-space order (e.g., staggering) such that they may enter crossover area 808 in sequence (e.g., one by one, with only one or zero cluster being in crossover area 808 at any point in time). For example, near crossover area 808, a cluster 818 from beam 812 may enter crossover area 808 first, followed by a cluster 820 from beam 816, and then followed by a cluster 822 from beam 814. That is, the number of clusters that simultaneously cross crossover area 808 may be limited. In some embodiments, at a given time, there may be at most N (an integer) cluster crossing crossover area 808. For example, N may be 1. In such cases, the Coulomb effect may be significantly reduced, especially the transversal Coulomb effect.

Figure 9B:
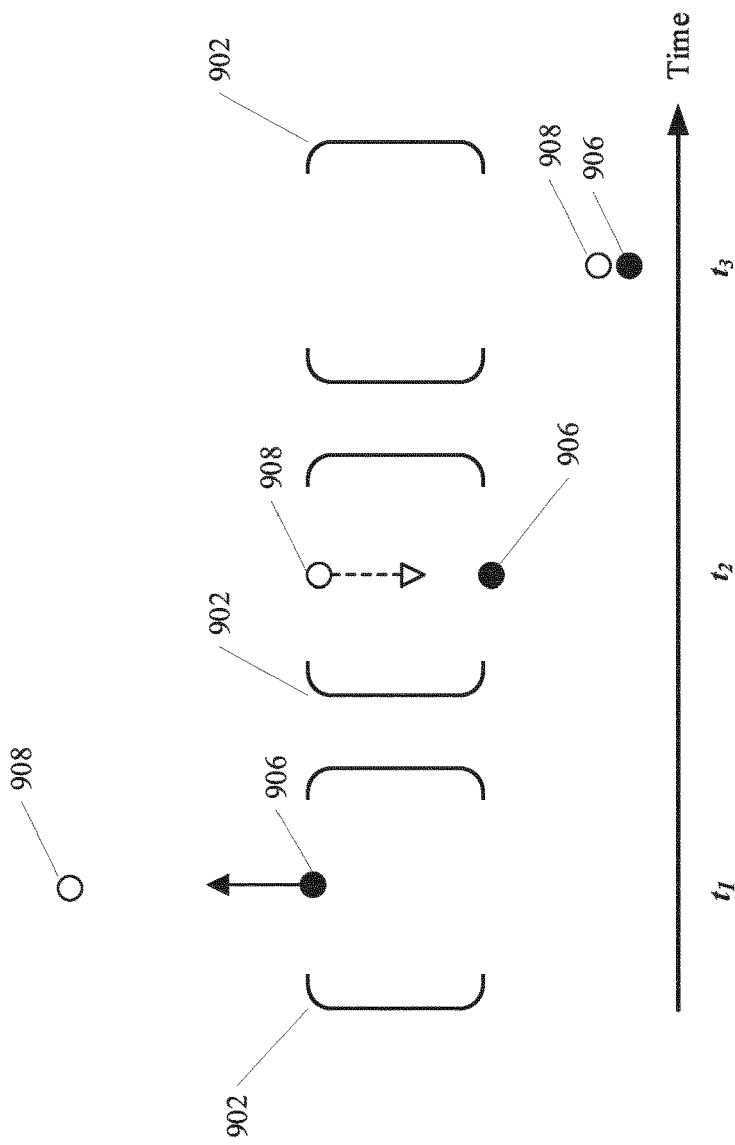
FIGS. 9A-9B illustrate an exemplary cluster generator for clustering charged particles, consistent with embodiments of the present disclosure.
Figure 9A:
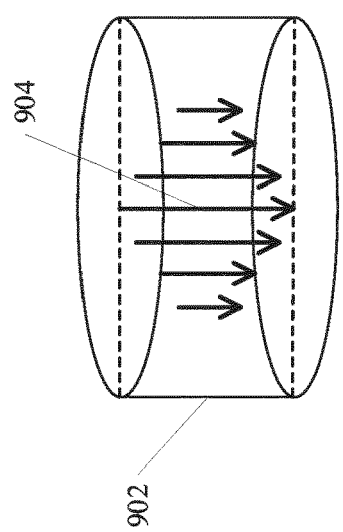

FIGS. 9A-9B illustrate an exemplary cluster generator for clustering charged particles, consistent with embodiments of the present disclosure. In some embodiments, the cluster generator in FIGS. 9A-9B may be acceleration cavity 310 or bunching cavity 320 in FIG. 3. In FIG. 9A, the cluster generator is a cluster cavity 902. It should be noted that the cluster generator may be implemented as forms other than cavities. A dynamic electric field 904 is provided inside cluster cavity 902, the direction of which is represented by the black arrows. Electric field 904 may have a direction parallel to (e.g., along or against) the moving direction of a beam (e.g., beam 812, 814, or 816). That is, electric field 904 may accelerate or decelerate charged particles when it is non-zero. In some embodiments, electric field 904 may change periodically. For example, electric field 904 may be sinusoidal, and its direction may change to be up and down in cycles. It is noted that electric field 904 may vary in any suitable manner for clustering charged particles, and this disclosure does not have limitations on that aspect.

FIG. 9B shows how two charged particles are clustered by cluster cavity 902. In FIG. 9B, vertical sections of cluster cavity 902 are shown along a timeline at three timestamps t1, t2, and t3. Before t1, charged pulses 908 and 906 move downward toward cluster cavity 902, roughly at the same speed. A charged pulse may include one or more charged particles. At t1, charged pulse 906 enters cluster cavity 902, while charged pulse 908 is outside cluster cavity 902. Electric field 904 may be provided to decelerate charged pulse 906, indicated by the solid arrow attached to charged pulse 906. At t2, charged pulse 906 exits or is about to exit cluster cavity 902 with decreased speed, and charged pulse 908 enters cluster cavity 902. At $t_2$, electric field 904 may be provided to accelerate (e.g., by reversing the direction of electric field 904 at $t_1$) or not decelerate (e.g., by setting a zero amplitude for electric field 904) charged pulse 908, indicated by the dashed arrow. By doing so, charged pulse 908 may move faster than charged pulse 906 and close the distance between them. At $t_3$, both charged pulses 906 and 908 exit cluster cavity 902, and charged pulse 908 catches up with charged pulse 906. That is, a cluster of charged pulses 906 and 908 is formed.

In some embodiments, to ensure that the charged pulses in the formed cluster have substantially similar speed, before charged pulse 908 exits cluster cavity 902, electric field 904 may decelerate charged pulse 908 such that when the deceleration stops, charged pulse 908 not only catches up with charged pulse 906, but also has substantially similar speed with charged pulse 906.

In some embodiments, electric field 904 may be provided dynamically (e.g., changing in cycles) such that more than two charged particles may form a cluster. For example, when multiple charged particles enter cluster cavity 902 in sequence, electric field 904 may alternate between a deceleration field and a neutral field (e.g., with a zero amplitude), by which the distances between the charged pulses may decrease and form a cluster when they exit cluster cavity 902.

In some embodiments, a cluster generator (e.g., cluster cavity 902) may receive one beam (e.g., beam 812, 814, or 816) of charged pulses. When the electric field of the cluster generator varies in cycles, the frequency of such cycles may depend on a scan frequency of the multi-beam apparatus and the number of the beams provided by the multi-beam apparatus. For example, when the scan frequency is 10 MHz, and the number of provided beams is 10, the frequency of the electric field of the cluster generator may be set to be higher than 100 MHz (e.g., to the order of 1 GHz).

Figure 10:
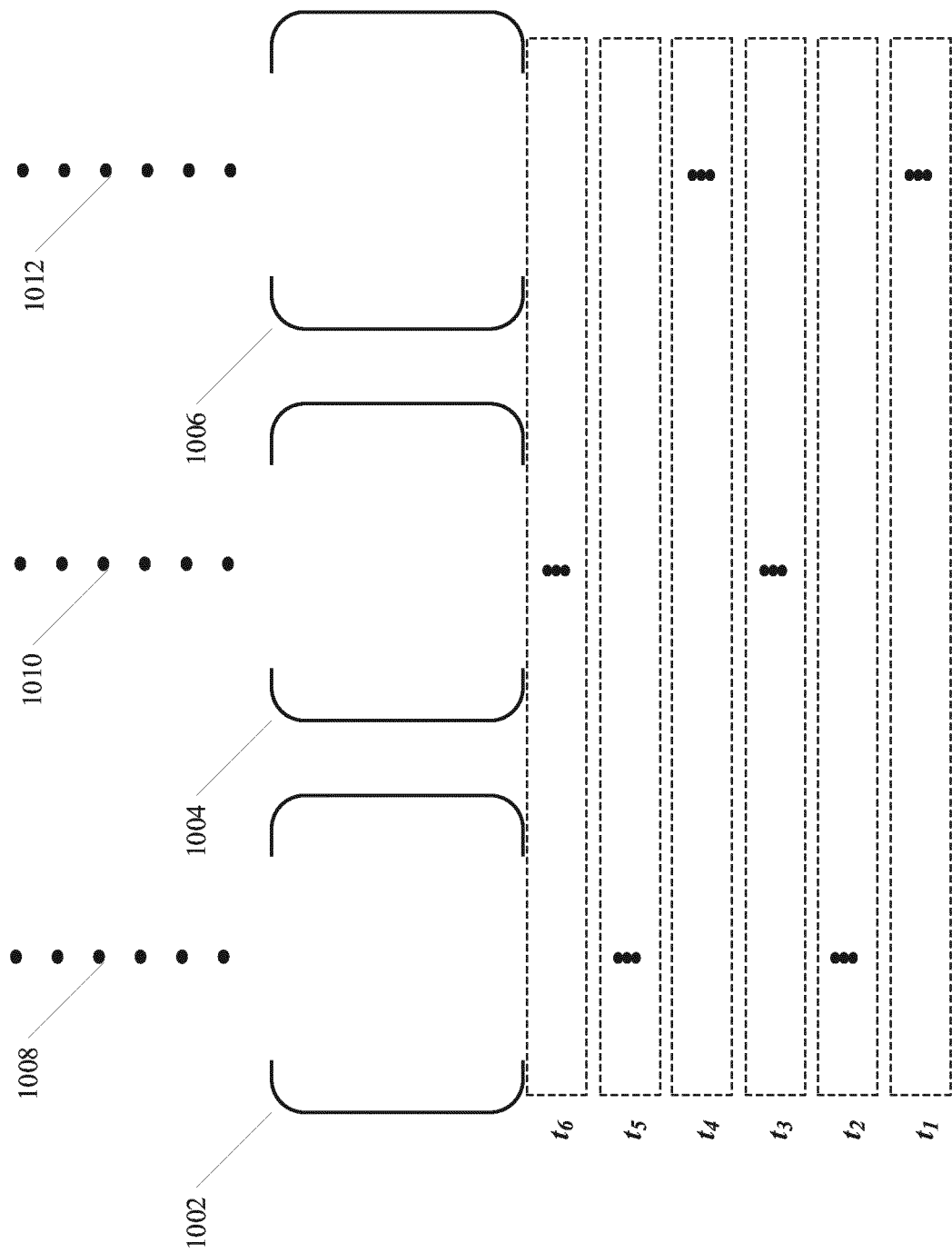
FIG. 10 illustrates an exemplary set of cluster generators releasing charged-particle clusters in a time-space order, consistent with embodiments of the present disclosure.

To achieve the time-space order of clusters as shown in FIG. 8B, multiple cluster generators may be used for clustering multiple beams. FIG. 10 illustrates an exemplary set of cluster generators releasing charged-particle clusters in a time-space order, consistent with embodiments of the present disclosure. In FIG. 10, the cluster generators may be cluster cavities 1002, 1004, and 1006 similar to cluster cavity 902. Cluster cavities 1002, 1004, and 1006 receive charged-particle beams 1008, 1010, and 1012 (shown as discrete black dots), respectively. Each of cluster cavities 1002, 1004, and 1006 may turn its received beam into clusters (shown as triplet black dots) and release or eject the clusters in accordance with a time-space order. For example, FIG. 10 shows six timestamps t1 to t6, with t1 being the earliest one and t6 being the latest one. In some embodiments, the intervals between t1 to t6 may be equal. In some embodiments, cluster cavities 1002, 1004, and 1006 may release clusters in an alternate way. For example, at t1, cluster cavity 1006 releases a cluster. At t2, cluster cavity 1002 releases a cluster. At t3, cluster cavity 1004 releases a cluster. At t4, cluster cavity 1006 releases a cluster. At t5, cluster cavity 1002 releases a cluster. At t6, cluster cavity 1004 releases a cluster. In addition, the longitudinal distance between the released clusters may also be equal. The longitudinal distance is the difference of positions along the moving direction of the clusters. For example, the longitudinal distances between the clusters released from t1 to t6 may be equal, as indicated by the equidistant dashed boxes enclosing each cluster in FIG. 10. In some embodiments, the time-space order may be the temporal and spatial relationship between the released clusters as shown and described in FIG. 10.

Although FIG. 10 shows that cluster cavities 1002, 1004, and 1006 are positioned in a line, it should be noted that this is an example embodiment only, and other positional or spatial arrangements of the cluster cavities are possible. For example, they may be positioned along a line, in a triangle, have different relative longitudinal distances (e.g., not positioned on the same plane), or any spatial configuration in three-dimensional space. It should also be noted that the number of the cluster cavities may depend on the number of beams provided by the multi-beam apparatus and not be limited to three, as shown in FIG. 10.

Figure 11:
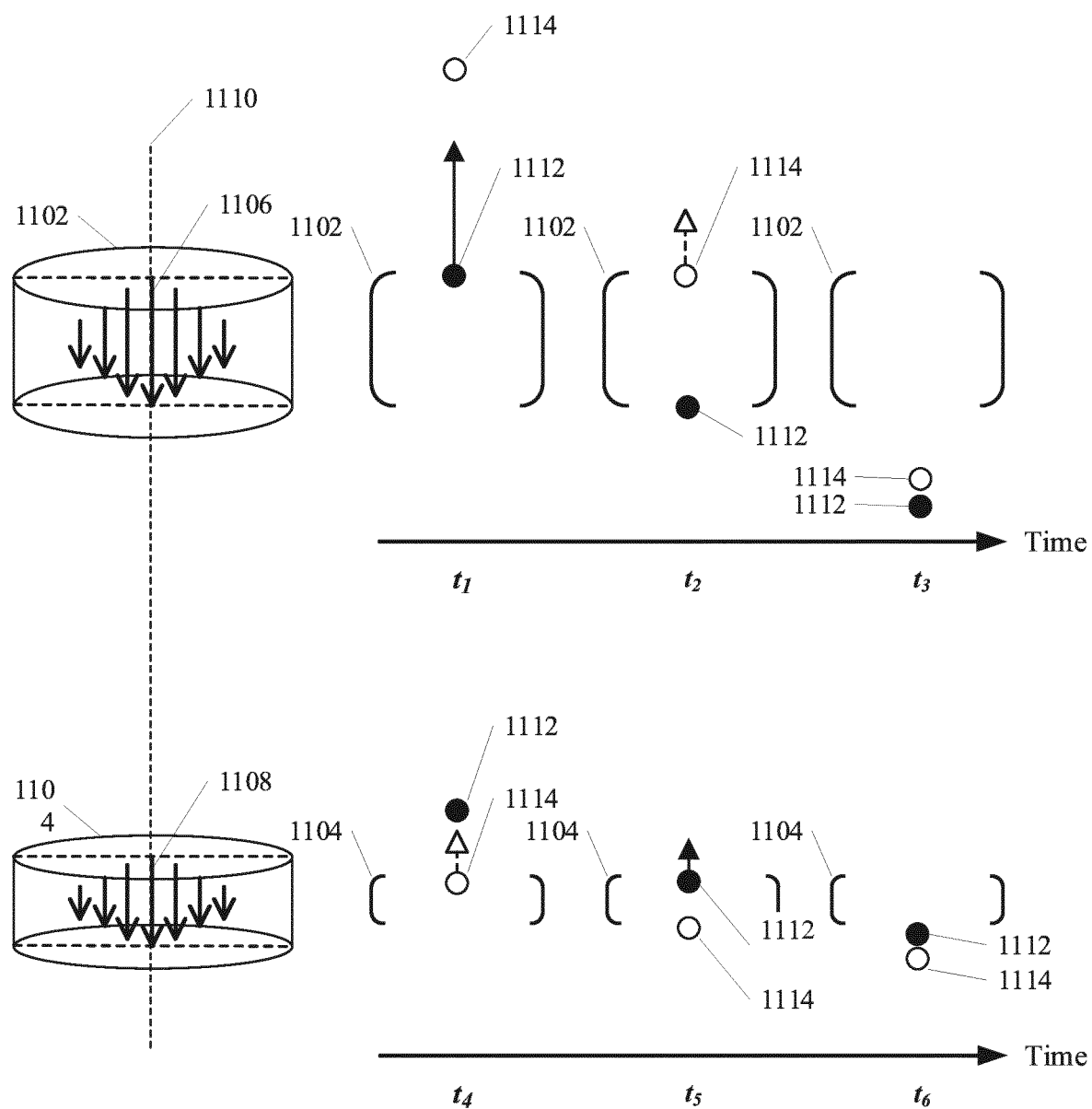
FIG. 11 illustrates an exemplary arrangement of first and second cluster generators for clustering charged particles, consistent with embodiments of the present disclosure.

In some embodiments, besides the implementations of FIGS. 9A-10, the charged particles may be grouped into clusters using different manners. FIG. 11 illustrates an exemplary arrangement of first and second cluster generators for clustering charged particles, consistent with embodiments of the present disclosure. FIG. 11 shows a cluster cavity 1102 and a cluster cavity 1104 as the first cluster generator and the second cluster generator, respectively. Cluster cavity 1102 is provided with a dynamic electric field 1106. Cluster cavity 1104 is provided with a dynamic electric field 1108. In some embodiments, cluster cavities 1102 and 1104 may be implemented similar to cluster cavity 902 in FIGS. 9A-9B, and electric fields 1106 and 1108 may be implemented similar to electric field 904. In FIG. 11, cluster cavity 1104 may be arranged as downstream from cluster cavity 1102. In some embodiments, cluster cavities 1102 and 1104 may be arranged coaxially about an axis 1110, such that a beam may enter and exit them along its path. Cluster cavities 1102 and 1104 may have the same or different features or configurations (e.g., sizes, height, diameters, geometries, or the like). For example, maximum amplitudes and frequencies of electric fields 1106 and 1108 may be the same or different.

In FIG. 11, a charged pulse 1112 and a charged pulse 1114 may be clustered in the following way. Vertical sections of cluster cavity 1102 are shown along a timeline at three timestamps t1, t2, and t3. Vertical sections of cluster cavity 1104 are shown along a timeline at three timestamps t4, t5, and t6, with t4 being later than t3. Before t1, charged pulses 1112 and 1114 move downward toward cluster cavity 1102, roughly at the same speed. At t1, charged pulse 1112 enters cluster cavity 1102, while charged pulse 1114 is outside cluster cavity 1102. Electric field 1106 may be provided to decelerate charged pulse 1112, indicated by the solid arrow attached to charged pulse 1112. At t2, charged pulse 1112 exits or is about to exit cluster cavity 1102 with decreased speed, and charged pulse 1114 enters cluster cavity 1102. At t2, electric field 1106 may be provided to decelerate or not accelerate charged pulse 1114, indicated by the dashed arrow. For example, at t2, the direction of electric field 1106 may be the same as at t1, and its amplitude may be smaller than that at t1. By doing so, charged pulse 1114 may move faster than charged pulse 1112 and close the distance between them. At t3, both charged pulses 1112 and 1114 exit cluster cavity 1102, and charged pulse 1114 catches up with charged pulse 1112. That is, a cluster of charged pulses 1112 and 1114 is formed.

In some embodiments, at t3, the speed of charged pulse 1114 may be still higher than that of charged pulse 1112, and the formed cluster may disperse again after a certain amount of time. In those cases, the energy spread (e.g., longitudinal energy spread) of the cluster may be enlarged. For reducing the energy spread, cluster cavity 1104 may be used to equalize the speeds of charged pulses 1112 and 1114 after the cluster is formed. In some embodiments, cluster cavity 1104 may be arranged at a position such that, before t (when the cluster reaches cluster cavity 1104), second charged pulse 1114 has surpassed charged pulse 1112 along the path of the cluster. At $t_4$, charged pulse 1114 enters cluster cavity 1104, while charged pulse 1112 is outside cluster cavity 1104. Electric field 1108 may be provided to decelerate charged pulse 1114, indicated by the dashed arrow attached to charged pulse 1114. At $t_5$, charged pulse 1114 exits or is about to exit cluster cavity 1104 with decreased speed, and charged pulse 1112 enters cluster cavity 1104. At $t_5$, electric field 1108 may be provided to decelerate or not accelerate charged pulse 1112, indicated by the solid arrow. For example, at $t_5$, the direction of electric field 1108 may be the same as at $t_4$, and its amplitude may be smaller than that at $t_4$. By doing so, charged pulse 1112 may move faster than charged pulse 1114 such that the distance between them become close, and the speeds of them become substantially similar when electric field 1108 stops decelerating charged pulse 1112. At $t_6$, both charged pulses 1112 and 1114 exit cluster cavity 1104, and charged pulse 1114 not only catches up with charged pulse 1112, but also has substantially similar speed with charged pulse 1112. That is, a cluster of charged pulses 1112 and 1114 having substantially similar speed is formed. The charged pulses in a cluster may be deemed as having substantially similar speed when the relative speed between the charged pulses is zero or within a predetermined percentage (e.g., 1%, 3%, 5%, 10%, or any reasonable percentage).

In some embodiments, electric fields 1106 and 1108 may be provided dynamically (e.g., changing in cycles) such that more than two charged particles may form a cluster. For example, when multiple charged particles enter first and second cluster cavities 1102 and 1104 in sequence, electric fields 1106 and 1108 may alternate between a deceleration field and a neutral field (e.g., with a zero amplitude), by which the distances between the charged pulses may decrease and form a cluster when they exit first and second cluster cavities 1102 and 1104. The frequencies of electric fields 1106 and 1108 may depend on a scan frequency of the multi-beam apparatus and the number of the beams provided by the multi-beam apparatus. It should be noted that, electric fields 1106 and 1108 may also have other implementations, such as applying an acceleration field for accelerating charged pulse 1114 in cluster cavity 1102 or accelerating charged pulse 1112 in second cluster cavity 1114, similar to cluster cavity 902. This disclosure does not limit on that aspect as long as the speeds of the charged pulses of the generated clusters may be adjusted to be substantially similar.

In some embodiments, stray charged particles may exist near the formed cluster, which may enlarge the energy spread (e.g., transversal energy spread) of the cluster. Stray charged particles are charged particles not clustered by the cluster generators. In some embodiments, a filtering system may be used to remove or reduce the stray charged particles.

Figure 12:
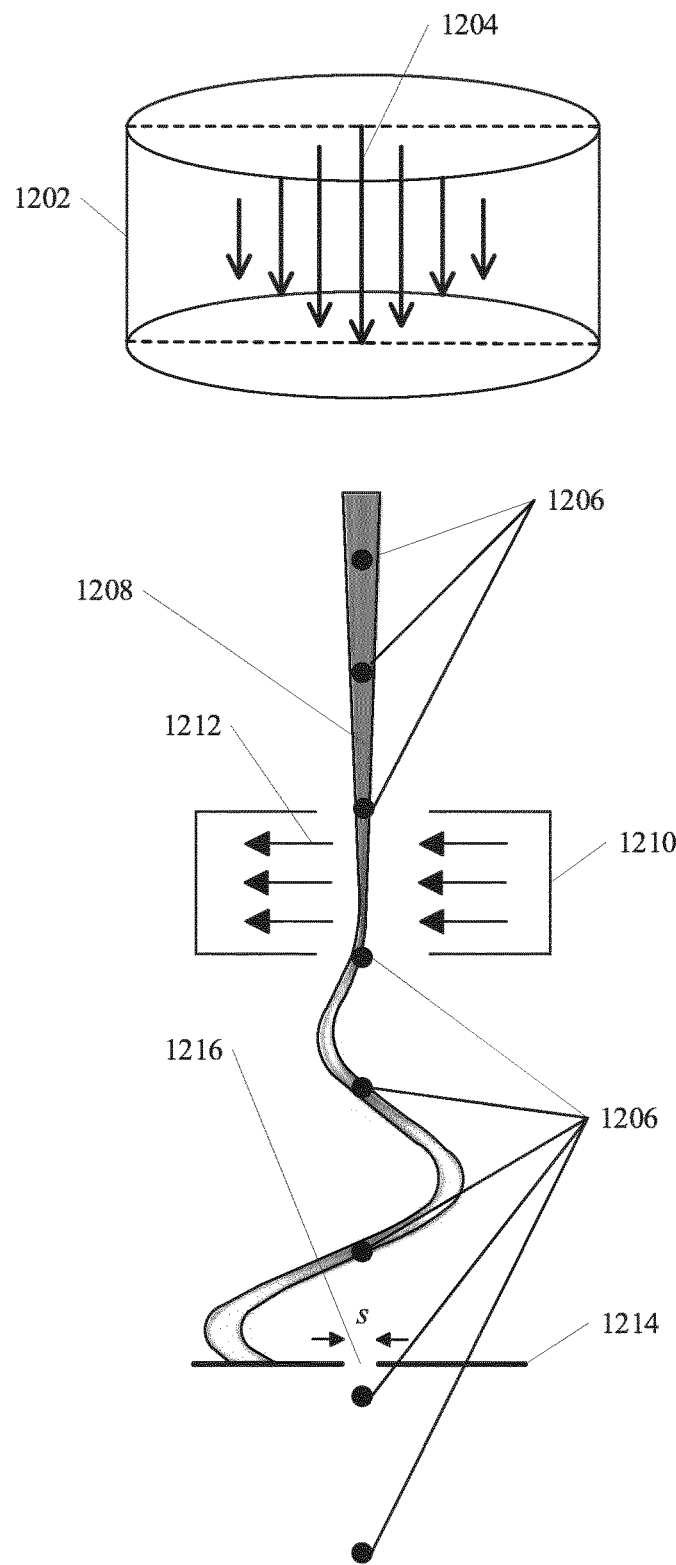
FIG. 12 illustrates an exemplary arrangement of a cluster generator and a filtering system for reducing stray charged particles, consistent with embodiments of the present disclosure.

FIG. 12 illustrate an exemplary arrangement of a cluster generator 1202 and a filtering system for reducing stray charged particles, consistent with embodiments of the present disclosure. The cluster generator 1202 may be implemented similar to cluster cavities 902, 1002, 1004, and 1006, or 1102 and 1104 in FIGS. 9A-11. Cluster generator 1202 may be provided with a dynamic electric field 1204 for clustering charged particles. Electric field 1204 may be implemented similar to electric fields 904, 1106, or 1108. Cluster generator 1202 may receive beams of charged particles and generate clusters 1206, indicated by round dots downstream from cluster generator 1202. Stray charged particles 1208 may exist around the generated clusters, indicated by a grayscale band.

The filtering system may include a filter cavity 1210 arranged downstream from cluster generator 1202. In some embodiments, cluster generator 1202 and filter cavity 1210 may be arranged coaxially about the path of clusters 1206. Filter cavity 1210 may be provided with a dynamic electromagnetic field 1212 for deflecting stray charged particles 1208. An "electromagnetic field" may include a pure electric field, a pure magnetic field, or a combination of an electric field and a magnetic field. Electromagnetic field 1212 may be configured to not affect the moving direction of clusters 1206. In some embodiments, electromagnetic field 1212 may be a dynamic electric field, a dynamic magnetic field, or a combination of them. For example, electromagnetic field 1212 may be configured such that, when a cluster enters filter cavity 1210, the moving direction of the cluster may be kept unchanged (e.g., by setting a zero amplitude of electromagnetic field 1212). When stray charged particles 1208 enters filter cavity 1210, electromagnetic field 1212 may be set as non-zero and deflect the moving directions of the stray charged particles 1208. For example, as shown in FIG. 12, clusters 1206 may move along a downward direction without being affected by electromagnetic field 1212 when passing through filter cavity 1210. However, stray charged particles 1208 may be deflected to the left or right by electromagnetic field 1212 when passing through filter cavity 1210, and may be blocked or absorbed by a wall of filter cavity 1210.

In some embodiments, the direction of electromagnetic field 1212 may change perpendicular to the moving direction of cluster 1206. For example, electromagnetic field 1212 may be a dynamic electric field, the direction of which changes perpendicular to the moving direction of clusters 1206. For another example, electromagnetic field 1212 may be a dynamic magnetic field, the direction of which changes perpendicular to the moving direction of clusters. In some embodiments, the frequency of electromagnetic field 1212 may depend on distances between clusters 1206, a frequency of cluster generator 1202 (which further depend on the scan frequency of the multi-beam apparatus and the number of beams provided by the multi-beam apparatus), strength or amplitude of electromagnetic field 1212, the speeds of clusters 1206 and stray charged particles 1208, the number or density of stray charged particles 1208, or the like.

In some embodiments, to further remove the deflected charged particles 1208, the filtering system may further include an aperture plate 1214 downstream from filter cavity 1210. In some embodiments, aperture plate 1214 may include an aperture 1216 on the path of clusters 1206. Cluster generator 1202, filter cavity 1210, and aperture 1216 may be arranged coaxially about the path of clusters 1206. Aperture 1216 may have a size S that allows clusters 1206 to pass and block all or majority of the stray charged particles 1208. As shown in FIG. 12, the deflected stray charged particles 1208 are blocked by aperture plate 1214, and cluster 1206 may pass through aperture 1216. By doing so, transversal energy spread of clusters 1206 may be significantly reduced. In some embodiments, by applying the filtering system, the energy spread of the clusters introduced by the cluster generator (e.g., cluster generator 1202) may be reduced to about 0.1 eV.

It should be noted that embodiments in FIGS. 10-12 may be modified, combined, or rearranged such that elements of them may be combined in any manner for actual applications. For example, additional cluster cavities (e.g., cavity 1104 in FIG. 11) may be arranged downstream from cluster cavities (e.g., cluster cavities 1002, 1004, and 1006 in FIG. 10), respectively. For another example, filtering systems (e.g., including at least one of filter cavity 1210 and aperture plate 1214) may be arranged downstream from cluster cavities 1002, 1004, and 1006 in FIG. 10 or cluster cavity 1104 in FIG. 11, respectively. For another example, filter cavity 1210 may be arranged between cluster cavity 1102 and cluster cavity 1104, and aperture plate 1214 may be arranged as downstream from cluster cavity 1104 in FIG. 11. Other variations and modifications are also possible, and this disclosure does not limit on that aspect.

Figure 13:
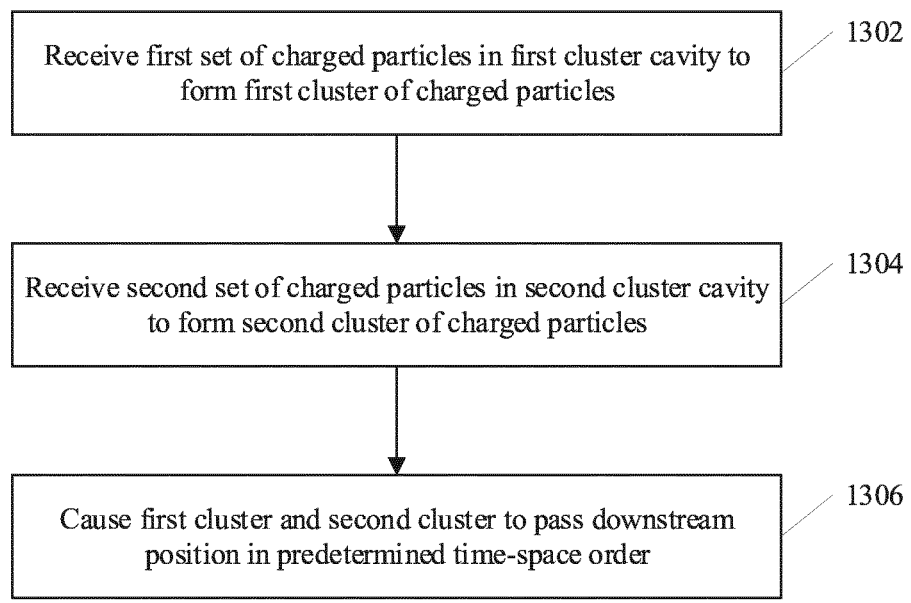
FIG. 13 is a flowchart showing an exemplary method of reducing interaction of charged particles in a charged-particle beam of a multi-beam apparatus, consistent with embodiments of the present disclosure.

FIG. 13 is a flowchart showing an exemplary method 1300 of reducing interaction of charged particles in a charged-particle beam of a multi-beam apparatus, consistent with embodiments of the present disclosure. Method 1300 may be performed by a controller that may be coupled with a charged particle beam apparatus (e.g., EBI system 1). For example, the controller may be controller 380 in FIGS. 3-4. The controller may be programmed to implement method 1300.

At step 1302, a first cluster cavity receives a first set of charged particles to form a first cluster of charged particles. At step 1304, a second cluster cavity receives a second set of charged particles to form a second cluster of charged particles. In some embodiments, the first set of charged particles and the second set of charged particles may be charged-particle pulses. In some embodiments, the first set of charged particles and the second set of charged particles may be continuous charged-particle streams.

In some embodiments, the first cluster cavity may be provided with a first dynamic electric field, and the second cluster cavity may be provided with a second dynamic electric field. In some embodiments, the first cluster cavity may be one of cluster cavities 1002, 1004, and 1006 in FIG. 10 (e.g., cluster cavity 1002), and the first beam may be a corresponding beam of beams 1008, 1010, and 1012 (e.g., beam 1008). The second cluster cavity may be another one of cluster cavities 1002, 1004, and 1006 in FIG. 10 (e.g., cluster cavity 1004), and the second beam may be a corresponding beam of beams 1008, 1010, and 1012 (e.g., beam 1010).

In some embodiments, the controller may control a direction of the first dynamic electric field to change parallel to a direction of the first beam, and a direction of the second dynamic electric field to change parallel to a direction of the second beam. For example, the first and second dynamic electric fields may change in a direction as shown and described in FIGS. 9A-9B. In some embodiments, the controller may control at least one of the direction of the first dynamic electric field or the direction of the second dynamic electric field to change in a first cycle. For example, the direction of the first dynamic electric field, the direction of the second dynamic electric field, or both may be changed periodically. In some embodiments, the first cycle may be determined based on at least one of a scan frequency of the multi-beam apparatus or a number of the beams.

Still referring to FIG. 13, at step 1304, the first cluster cavity forms a first cluster of charged particles using at least two charged particles in the first beam and at least the first dynamic electric field, and the second cluster cavity forms a second cluster of charged particles using at least two charged particles in the second beam and at least the second dynamic electric field. In some embodiments, the first cluster may be the released cluster at t2 in FIG. 10, and the second cluster may be the released cluster at t3 in FIG. 10. The first and second clusters may be formed in a way as shown and described in FIGS. 9A-12.

In some embodiments, the at least two charged particles may include the first charged particle (e.g., charged particle 906 in FIG. 9B) and the second charged particle (e.g., charged particle 908 in FIG. 9B). The controller may cause the first dynamic electric field (e.g., electric field 904 in FIG. 9B) to decelerate a first charged particle before a second charged particle enters the first cluster cavity (e.g., as what occurs at t1 in FIG. 9B). When the second charged particle enters the first cluster cavity, the controller may control the first dynamic electric field for causing the second charged particle to move faster than the first charged particle. For example, the controller may control the first dynamic electric field to accelerate the second charged particle, as what occurs at t2 in FIG. 9B. For another example, the controller may control the first dynamic electric field to neither accelerate nor decelerate the second charged particle, such as by setting an amplitude of the first dynamic electric field to be zero. For another example, the controller may control the first dynamic electric field to decelerate the second charged particle in a lesser degree than decelerating the first charged particle, as what occurs at t2 in FIG. 11.

In some embodiments, to reduce energy spread of the formed clusters, additional cluster cavities may be used to uniformize the moving speeds of the charged particles in the clusters. For example, the moving speeds of the charged particles of the same cluster may be uniformized in accordance with a manner shown and described in FIG. 11. In some embodiments, when forming the first cluster, the controller may receive the first cluster in a third cluster cavity (e.g., cluster cavity 1104 in FIG. 11) downstream from the first cluster cavity (e.g., cluster cavity 1102 in FIG. 11). The first cluster may be formed by the first cluster cavity. The controller may cause the first charged particle (e.g., charged particle 1112 in FIG. 11) and the second charged particle (e.g., charged particle 1114 in FIG. 11) to move in a substantially similar speed (e.g., an equal speed or different speeds within a predetermined range) using a third dynamic electric field (e.g., electric field 1108 in FIG. 11) in the third cluster cavity, as what occurs at t4-t6 shown and described in FIG. 11. For example, the controller may cause the third dynamic electric field to decelerate the second charged particle (e.g., charged particle 1114) to move at the substantially similar speed, as what occurs at t4 in FIG. 11. In some embodiments, the controller may coordinate the third dynamic electric field and the first dynamic electric field to change. For example, the controller may control a direction of the third dynamic electric field (e.g., electric field 1108 in FIG. 11) to change parallel to a direction of the first beam (e.g., a downward direction along axis 1110 in FIG. 11). In some embodiments, the controller may change the direction of the third dynamic electric field in a second cycle. For example, the second cycle (e.g., a cycle of electric field 1108) may be different from or the same as the first cycle (e.g., a cycle of electric field 1106), as shown and described in FIG. 11. In some embodiments, the controller may determine the second cycle based on at least one of the scan frequency of the multi-beam apparatus, the number of the beams, or the first cycle. It should be noted that the uniformization approach of the moving speeds of the charged particles in the first cluster is also applicable to the second cluster for uniformizing the moving speeds of the charged particles in the second cluster.

In some embodiments, to reduce energy spread of the formed clusters, a filtering system may be used to remove or reduce stray charged particles near the clusters. For example, the stray charged particles may be removed or reduced in accordance with a manner as shown and described in FIG. 12. In some embodiments, a filter cavity (e.g., filter cavity 1210) downstream from the first cluster cavity (e.g., cluster generator 1202) may receive the cluster (e.g., one of clusters 1206) and a first stray charged particle (e.g., one of stray charged particles 1208). A dynamic electromagnetic field (e.g., electromagnetic field 1212) in the filter cavity may filter the first stray charged particle. In some embodiments, the dynamic electromagnetic field may include at least one of a third dynamic electric field or a dynamic magnetic field. The third dynamic electric field may be different from the first and second dynamic electric fields (e.g., electric fields 1106 and 1108, respectively). In some embodiments, the controller may cause a direction of the dynamic electromagnetic field (e.g., electromagnetic field 1212) to change perpendicular to the direction of the first beam. For example, for filtering the first stray charged particle, when the first cluster is in the filter cavity (e.g., when the cluster is passing through the filter cavity), the controller may cause the dynamic electromagnetic field not to direct the cluster, such as by setting its amplitude to be zero. When the cluster is not in the filter cavity (e.g., before the cluster entering the filter cavity or after the cluster exiting the filter cavity), the controller may cause the dynamic electromagnetic field to direct the first stray charged particle away from the direction of the first beam, as shown and described in FIG. 12. In some embodiments, the controller may coordinate the dynamic electromagnetic field (e.g., electromagnetic field 1212) and the first dynamic electric field (e.g., electric field 1204) to change. For example, the controller may change the direction of the dynamic electromagnetic field in a third cycle. The third cycle may be different from or the same as the first and second cycles. In some embodiments, the controller may determine the third cycle based on at least one of the scan frequency of the multi-beam apparatus, the number of the beams, the first cycle, or the second cycle.

In some embodiments, for further reducing the energy spread of the formed clusters, the filtering system may further include an aperture plate to remove more stray charged particles. For example, as shown and described in FIG. 12, an aperture plate (e.g., aperture plate 1214) having an aperture (e.g., aperture 1216) downstream from the filter cavity (e.g., filter cavity 1210) may filter a second stray charged particle. The second stray charged particle may be different from the first stray charged particle. In some embodiments, the filter cavity and the aperture plate may be upstream or downstream from the third cluster cavity. For example, the filter cavity (e.g., filter cavity 1210) and the aperture plate (e.g., aperture plate 1214) may be positioned between the first cluster cavity (e.g., cluster cavity 1102 in FIG. 11) and the third cluster cavity (e.g., cluster cavity 1104 in FIG. 11). For another example, both the filter cavity (e.g., filter cavity 1210) and the aperture plate (e.g., aperture plate 1214) may be positioned downstream from the third cluster cavity (e.g., cluster cavity 1104 in FIG. 11). In some embodiments, the third cluster cavity may be between the filter cavity and the aperture plate. For example, the third cluster cavity (e.g., cluster cavity 1104 in FIG. 11) may be positioned downstream from the filter cavity (e.g., filter cavity 1210) and upstream from the aperture plate (e.g., aperture plate 1214). It should be noted that the filtering approach for the stray charged particles (e.g., the first and second stray charged particles) is also applicable to the second cluster for removing or reducing the stray charged particles in the second cluster.

Still referring to FIG. 13, at step 1306, the controller causes the first cluster and the second cluster to pass a downstream position in a predetermined time-space order. The downstream position may be a crossover area (e.g., crossover area 808 in FIGS. 8A-8B). In some embodiments, the crossover area may be determined as a position that may achieve small (e.g., as small as possible within condition constraints) aberrations of an objective lens (e.g., objective lens 810 in FIGS. 8A-8B). For example, the controller may control the first and second cluster cavities to release the first and the second clusters in the predetermined time-space order. In some embodiments, the predetermined time-space order may include that the first cluster and the second cluster pass the downstream position in sequence. In some embodiments, the predetermined time-space order may be that at most one of the first cluster and the second cluster passes the downstream position at any time. In some embodiments, the downstream position may be near or in an objective lens in the multi-beam apparatus. For example, the downstream position may be crossover area 808 near objective lens 810 in FIGS. 8A-8B. In some embodiments, the downstream position may be deemed as "near" the objective lens when it is located outside of the objective lens in the order of millimeters (e.g., smaller than or equal to 20 millimeters).

In some embodiments, at steps 1302-1304, a plurality of cluster cavities may receive respective sets of charged particles in each cluster cavity to form a plurality of beams, and each beam may include clusters of charged particles. Further, at step 1306, the controller may cause the clusters of the plurality of beams to pass the downstream position in the predetermined time-space order. Moreover, in some cases, the predetermined time-space order at step 1306 may be that the clusters of the plurality of beams pass the downstream position in non-overlapping sequence. For example, the predetermined time-space order may be that at most one of the clusters of the plurality of beams passes the downstream position at any time.

In some embodiments, the controller may coordinate the first dynamic electric field and the second dynamic electric field to change. For example, the controller may coordinate the electric field of cluster cavity 1002 and the electric field of cluster cavity 1004 to change such that the first cluster released at t2 and the second cluster released at t3 may be in a time-space order shown in FIG. 10. In some embodiments, the controller may cause the first cluster to exit the first cluster cavity and the second cluster to exit the second cluster cavity in an alternate manner, and the first cluster and the second cluster pass the downstream position in the alternate manner. For example, as shown and described in FIG. 10, the first cluster exits the first cluster cavity (e.g., cluster cavity 1002) at t2 before the second cluster exits the second cluster cavity (e.g., cluster cavity 1104) at t3, in an alternate manner. That is, the first and second cluster cavities may release the first and second clusters in sequence (e.g., one by one). The first cluster and the second cluster may pass the downstream position (e.g., crossover area 808 in FIG. 8B) in the same alternate manner. That is, if the second cluster follows the first cluster when exiting the first and second cluster cavities, the second cluster would also follow the first cluster when passing the downstream position.

Figure 14:
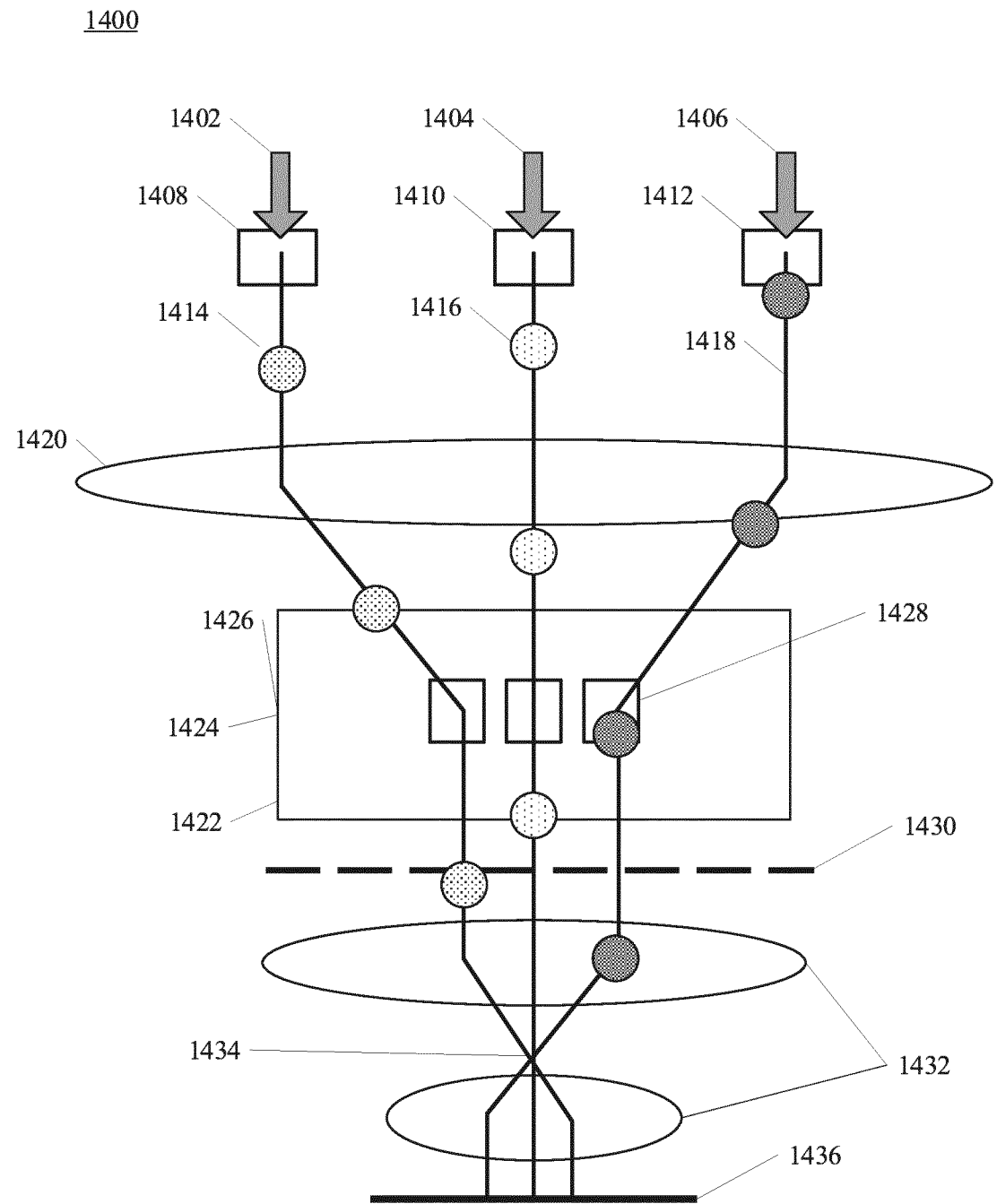
FIG. 14 illustrates an exemplary multi-beam apparatus for providing multiple charged-particle beams, consistent with embodiments of the present disclosure.

Reference is now made to FIG. 14. FIG. 14 illustrates an exemplary multi-beam apparatus 1400 for providing multiple charged-particle beams, consistent with embodiments of the present disclosure. In FIG. 14, charged-particle sources 1402, 1404, and 1406 are configured to generate pulsed bunches of charged particles (e.g., electrons), forming beams 1414, 1416, and 1418. In some embodiments, beams 1414, 1416, and 1418 may be pulsed, such as beams 802, 804, and 806 in FIG. 8A. In some embodiments, beams 1414, 1416, and 1418 may be clustered, such as beams 812, 814, and 816 in FIG. 8B. Each beam is indicated by circles with different shades in FIG. 11. In some embodiments, each of charged-particle sources 1402, 1404, and 1406 may be primary electron source 101 in FIG. 2 or primary electron source 301 in FIGS. 3-4. Charged-particle sources 1402, 1404, and 1406 may match with deflectors 1408, 1410, and 1412, respectively. Deflectors 1408, 1410, and 1412 may deflect beams 1414, 1416, and 1418 to make them converged as they approach charged-particle accelerator 1420.

A charged-particle accelerator 1420 (e.g., acceleration cavity 310 in FIGS. 3-4) receives beams 1414, 1416, and 1418 and accelerates the charged particles to increase their energy, and eject them towards beam concentrator 1422. In some embodiments, beam concentrator 1422 may function as a combination of acceleration cavity 310, bunching cavity 320, and deflection cavity 330 in FIGS. 3-4, capable of accelerating the charged-particle beams (e.g., beams 1414, 1416, and 1418) and converging each beam toward beam concentrator 1422. Beam concentrator 1422 may include multiple deflectors (e.g., radio-frequency cavities or MEMS deflectors) implemented similar to deflection cavity 330, including deflectors 1424, 1426, and 1428. In some embodiments, the deflectors may be arranged to form an array. In some embodiments, each deflector may receive and deflect a beam in a manner that the beams exiting beam concentrator 1422 become parallel again. For example, in FIG. 14, deflector 1424, 1426, and 1428 can receive and deflect beams 1414, 1416, and 1418, respectively, although it is appreciated that a deflector (e.g., deflector 1426) on the optical axis of multi-beam apparatus 1400 may not perform any deflection. In some embodiments, a deflector may receive more than one beam. In some embodiments, deflector 1424, 1426, and 1428 may be MEMS deflectors. In some embodiments, deflector 1424, 1426, and 1428 may be electric cavities (e.g., RF cavities) that are provided with dynamic electric fields. For example, the dynamic electric fields may be similar to electromagnetic field 1212 in FIG. 12 that change perpendicular to the moving direction of a beam. The dynamic electric fields may change deflection angles of beams 1414, 1416, and 1418. Beams 1414, 1416, and 1418 may eventually reach a surface of a sample 1436 after being projected by projection lenses 1432.

Deflectors 1424, 1426, and 1428 may deflect beams 1414, 1416, and 1418 such that the outgoing beams 1414, 1416, and 1418 from deflectors 1424, 1426, and 1428 may be parallel, and distances between them may be shorter than distances between charged-particle sources 1402, 1404, and 1406. For example, as shown in FIG. 14, the distances between charged-particle sources 1402, 1404, and 1406 are greater than the distances between beams 1414, 1416, and 1418 exiting deflectors 1424, 1426, and 1428. Such a design may integrate more charged-particle sources into a multi-beam apparatus for providing more beams to accommodate the increasing demands of imaging throughput and brightness, yet avoiding the problems of complex designs of electric routing for an aperture plate (functioning as a beam splitter) because no aperture plate may be used (replaced by the deflectors), and the problems of increasing risks of electric breakdowns because the electric routing of the charged-particle sources now have greater distances in between.

Also, deflectors 1424, 1426, and 1428 may release beams 1414, 1416, and 1418 in a predetermined time-space order to reduce the Coulomb effect. For example, deflectors 1424, 1426, and 1428 may release pulses or clusters in an alternate manner (e.g., one by one), such that a pulse or cluster may exit deflectors 1424, 1426, and 1428 in sequence (e.g., one at a time). The predetermined time-space order may be in a manner as shown and described in FIG. 10. Beams 1414, 1416, and 1418 may be converged downstream from at a crossover area 1434 near projection lenses 1432. Crossover area 1434 may be similar to crossover area 808 in FIGS. 8A-8B. Projection lenses 1432 may be similar to objective lens 810 in FIGS. 8A-8B. For example, a controller (e.g., controller 380 in FIGS. 3-4) may coordinate deflectors 1424, 1426, and 1428 (e.g., RF cavities or MEMS deflectors) and determine one of deflectors 1424, 1426, and 1428 to deflect a beam towards crossover area 1434. The controller may control deflectors 1424, 1426, and 1428 to release pulses or clusters in sequence (e.g., one pulse or cluster being released at a time), and the pulses or clusters may pass crossover area 1434 in sequence (e.g., one by one, with only one or zero cluster being in crossover area 1434 at any point in time). As shown in FIG. 14, the distances between beams 1414, 1416, and 1418 after exiting deflectors 1424, 1426, and 1428 are more concentrated than distances between them before entering accelerator 1420, in which more concentrated beams may contribute to higher brightness of the beams and higher throughput of the multi-beam apparatus 1400. Also, by deflecting beams 1414, 1416, and 1418 such that pulses or clusters of beams 1414, 1416, and 1418 pass through crossover area 1434 in sequence (e.g., one by one), the Coulomb effect may be significantly reduced because there is at most one pulse or cluster passing crossover area 1434.

In some embodiments, deflectors 1424, 1426, and 1428 may be created out of a slab or module. For example, deflectors 1424, 1426, and 1428 may be created as cavities on the slab or module. Power supply may be connected to deflectors 1424, 1426, and 1428 for providing a dynamic electric field in each deflector. For example, an AC voltage may be provided to each of the deflectors in beam concentrator 1422. The dynamic electric field may change in cycles, such as sinusoidally. In some embodiments, the cycle may depend on symmetry of beam concentrator 1422, symmetry of the deflectors, or material choices of the deflectors. Although deflectors 1424, 1426, and 1428 are shown as equidistant and placed in a line in FIG. 14, it should be noted that any number of deflectors may be configured at any position in three-dimensional space. For example, four deflectors may be arranged in beam concentrator 1422 if there are four charged-particle sources. For another example, the deflectors may be placed at different planes (i.e., they are at different longitudinal distances along the direction of the beams).

In some embodiments, beam concentrator 1422 may further include cluster generators (not shown in FIG. 14) for clustering beams 1414, 1416, and 1418. For example, the cluster generators may be separate components implemented similar to cluster cavities 1002, 1004, and 1006 in FIG. 10. The cluster generators may be arranged upstream or downstream from deflectors 1424, 1426, and 1428. That is, the beams may be clustered before being deflected or be deflected before being clustered. In some embodiments, a cluster generator and a deflector (e.g., one of deflectors 1424, 1426, and 1428) may be implemented as a single component, such as a single electric cavity provided with two different dynamic electric fields (e.g., a longitudinal dynamic electric field for clustering and a transversal dynamic electric field for deflecting), in which the single component may generate clusters and deflect them into different paths to form different beams of clusters, effectively making multiple beams out of a single component. In some embodiments, the number of beams and their paths may depend on parameters (e.g., frequencies) of at least one of the deflectors (e.g., deflectors 1424, 1426, and 1428) or the cluster generators.

In some embodiments, accelerator 1420 may be optional for multi-beam apparatus 1400. In some embodiments, the relative positions of charged-particle accelerator 1420 and deflector and concentrator 1422 may be switched. That is, the clusters may be formed before being accelerated.

In some embodiments, an aperture array 1430 may be arranged downstream from beam concentrator 1422 for further filtering beams 1414, 1416, and 1418 (e.g., by removing stray charged particles in a manner similar to aperture plate 1214 in FIG. 12), by which imaging aberrations may be reduced. In some embodiments, aperture array 1430 may be a MEMS aperture array. In some embodiments, aperture array 1430 may be optional (i.e., may be omitted) for multi-beam apparatus 1400.

By using multiple charged-particle sources matched with multiple deflectors, multi-beam apparatus 1400 may provide a higher number of beams, higher throughput, scalable brightness (e.g., by adding or reducing charged-particle sources as needed), limited Coulomb effect, lower risks of electric breakdowns, and less complexity and costs for building the system.

Figure 15:
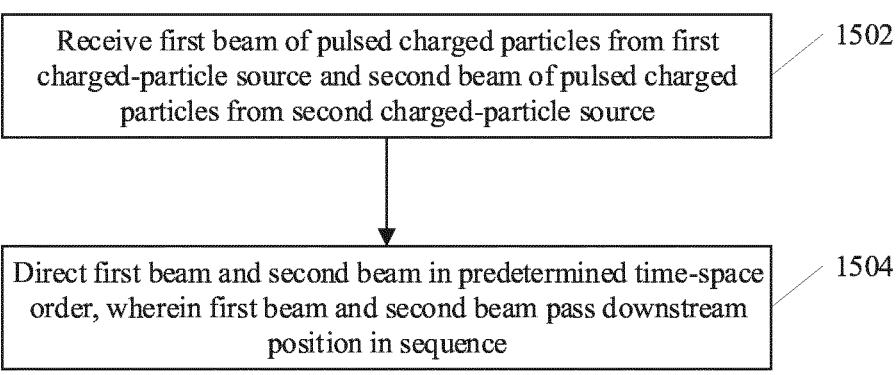
FIG. 15 is a flowchart showing an exemplary method of providing multiple charged-particle beams in a multi-beam apparatus, consistent with embodiments of the present disclosure.

FIG. 15 is a flowchart showing an exemplary method 1500 of providing multiple charged-particle beams in a multi-beam apparatus, consistent with embodiments of the present disclosure. Method 1500 may be performed by a controller that may be coupled with a charged particle beam apparatus (e.g., multi-beam apparatus 1400). For example, the controller may be controller 380 in FIG. 34. The controller may be programmed to implement method 1500.

At step 1502, at least one deflector system receives a first beam of pulsed charged particles from a first charged-particle source and a second beam of pulsed charged particles from a second charged-particle source. For example, the at least one deflector system may be one or more of deflectors 1424, 1426, and 1428 in FIG. 14. For example, the first and second charged-particle sources may be charged-particle sources 1402 and 1404, respectively. The first and second beams may be, for example, beams 1414 and 1416, respectively. In some embodiments, the at least one deflector system may include a radio-frequency cavity deflector. For example, the at least one deflector system may include deflection cavity 330 in FIGS. 3-4.

In some embodiments, the first charged-particle source and the second charged-particle source may be charged-particle pulse generators. For example, a pulse generator may include a charged-particle emitter and a pulse laser generator. When the first charged-particle source and the second charged-particle source are the charged-particle pulse generators, the first beam and the second beam may be pulsed beams of charged particles. In some embodiments, the first beam and the second beam may be clustered, such as in a way as shown and described in FIGS. 8B-13. In those embodiments, the first beam and the second beam may be beams of clustered charged particles before entering the at least one deflector system.

In some embodiments, the at least one deflector system may include multiple deflectors, and each deflector may receive one beam of charged-particles. For example, the at least one deflector system may include a first deflector (e.g., deflector 1424) and a second deflector (e.g., deflector 1426) and may receive the first beam (e.g., beam 1414) in the first deflector and the second beam (e.g., beam 1416) in the second deflector. In some embodiments, if the deflector responds sufficiently fast, it may deflect beams from different charged-particle sources. In some embodiments, the at least one deflector system may include one or more deflectors, and each deflector may receive one or more beams of charged particles. For example, the at least one deflector system may include a single deflector, and the single deflector may receive the first beam and the second beam.

The at least one deflector system may be arranged in the three-dimensional space in any suitable manner for deflecting the beams. For example, when the at least one deflector system includes the first deflector and the second deflector, the first deflector and the second deflector may be arranged to be on a same plane. The plane may be perpendicular to paths of the beams before entering them, such as shown and described in FIG. 14. For another example, when the at least one deflector system includes the first deflector and the second deflector, the first deflector and the second deflector may be arranged to be on different planes.

Still referring to FIG. 15, at step 1504, the at least one deflector system deflects the first beam and the second beam in a predetermined time-space order. The first beam and the second beam pass a downstream position in an alternate matter (e.g., in sequence). In some embodiments, the downstream position may be crossover area 1434 in FIG. 14. For example, the at least one deflector system may deflect the first beam and the second beam in a way as shown and described in FIG. 14.

In some embodiments, the predetermined time-space order may include that a distance between the first beam and the second beam decreases after the first beam and the second beam are released. For example, as shown in FIG. 14, the first beam and the second beam may be beams 1414 and 1416, respectively, and the distance between beams 1414 and 1416 before they enter deflectors 1424 and 1426, respectively, is greater than the distance between them after they exit deflectors 1424 and 1426, respectively. In some embodiments, the predetermined time-space order may include that the first beam and the second beam are parallel after the first beam and the second beam are released. For example, as shown in FIG. 14, the first beam and the second beam may be beams 1414 and 1416, respectively, they are parallel after exiting deflectors 1424 and 1426, respectively.

In some embodiments, the at least one deflector system may release pulses or clusters from the first beam and the second beam in sequence. For example, as shown in FIG. 14, deflectors 1424 and 1426 may release pulses or clusters of beams 1414 and 1416 in sequence, in which deflector 1424 releases a pulse or cluster of beam 1414 first (as indicated by a dense-dotted circle downstream from deflector 1424), and deflector 1426 releases a pulse or cluster of beam 1416 second (as indicated by a sparse-dotted circle downstream from deflector 1426). In some embodiments, the at least one deflector system may release at most one pulse or cluster at a given time. That is, the pulses or clusters of different beams may be released one by one. In some embodiments, the at least one deflector system may direct the first beam in a first direction and the second beam in a second direction. For example, as shown in FIG. 14, deflector 1424 may deflect beam 1414 in a first direction (indicated by a large angle between the directions of beam 1414 before entering and after exiting deflector 1424), and deflector 1426 may deflect beam 1416 in a second direction (indicated by a substantially zero angle between the directions of beam 1416 before entering and after exiting deflector 1426).

In some embodiments, after the first beam and the second beam are released, an aperture plate (e.g., an aperture plate providing aperture array 1430) downstream from the at least one deflector system may receive them. The aperture plate may include a first aperture and a second aperture. The first aperture may receive the first beam, and the second aperture may receive the second beam.

In some embodiments, the at least one deflector system may not only deflect the received beams, but also cluster them into beams of clusters. For example, the at least one deflector system may be provided with clustering electric fields (e.g., electric field 904, 1106, 1108, or 1204 in FIGS. 9-12) in addition to deflecting electric fields (e.g., electromagnetic field 1212 in FIG. 12), and the received beams may be clustered while being deflected. For example, the at least one deflector system may form a first cluster of charged particles using the first beam and a second cluster of charged particles using the second beam. The at least one deflector system may then release the first cluster and the second cluster in the predetermined time-space order. In some embodiments, the at least one deflector system may release the first cluster and the second cluster in sequence, and the first cluster and the second cluster may pass the downstream position in sequence.

Figure 16C:
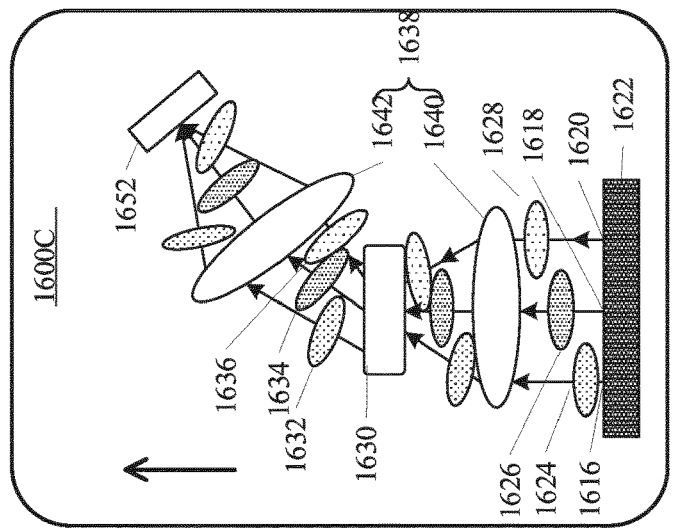
FIGS. 16A-16C illustrate exemplary subsystems of a multi-beam apparatus for charged-particle detection, consistent with embodiments of the present disclosure.
Figure 16B:
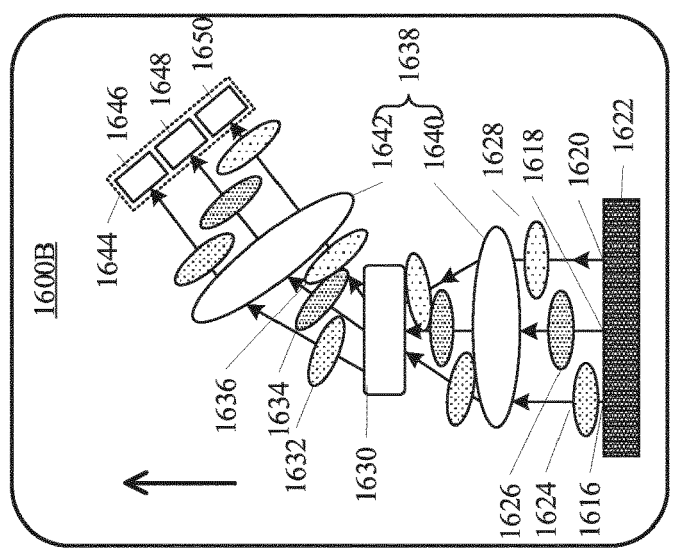
Figure 16A:
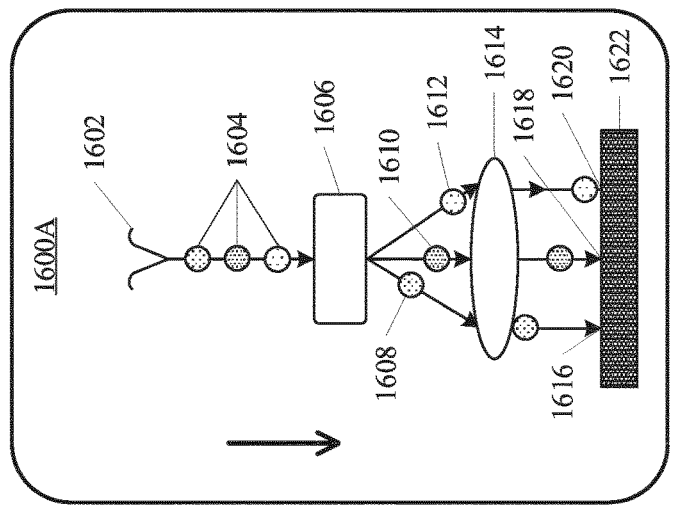

Reference is now made to FIGS. 16A-16C, which illustrate exemplary subsystems 1600A-1600C of a multi-beam apparatus for charged-particle detection, consistent with embodiments of the present disclosure. The multi-beam apparatus may be, for example, the multiple electron beam system in FIG. 3 or FIG. 4.

FIG. 16A is a schematic diagram of an exemplary subsystem 1600A of a multi-beam apparatus. In some embodiments, the charged particles may be electrons. Subsystem 1600A may include at least primary electron source 1602, a first deflector 1606, and a first projection lens system 1614. Primary electron source 1602 may emit primary electrons.

In some embodiments, primary electron source 1602 may be primary electron source 301 in FIGS. 3-4. In some embodiments, primary electron source 1602 may include multiple charged-particle sources, such as charged-particle sources 1402, 1404, and 1406. The primary electrons may be bunched (e.g., by bunching cavity 320 in FIGS. 3-4) into multiple primary electron pulses, including pulses 1604. Pulses 1604 may be accelerated and projected along directions indicated by arrows in FIG. 16A. In some embodiments, pulses 1604 may be clustered, such as beams 812, 814, and 816 as showed in FIG. 8B. For ease of explanation without causing ambiguity, pulses 1604 described hereinafter include clustered electrons or un-clustered electrons unless explicitly specified. [01%] In some embodiments, first deflector 1606 may be a MEMS deflector. In some embodiments, first deflector 1606 may be a radio-frequency cavity deflector. In some embodiments, first deflector 1606 may be deflection cavity 330 in FIGS. 3-4 or one or more of deflectors 1424, 1426, and 1428 in FIG. 14. First deflector 1606 may deflect pulses 1604 to form a first number (e.g., an integer N1) of deflected electron pulse beams, including incident beams 1608, 1610, and 1612, pulses of which are indicated by circles of different shades in FIG. 16A. For example, the leading pulse of pulses 1604 is deflected to form incident beam 1612, the trailing pulse of pulses 1604 is deflected to form incident beam 1608, and the intermediate pulse of pulses 1604 may be deflected (or allowed to pass through) to form incident beam 1610. It can be seen from FIG. 16A that pulses 1604 are deflected by first deflector 1606 at different timestamps. Such timestamps (e.g., timestamps of entering first deflector 1606 or timestamps of being directed by first deflector 1606) may be recorded by a controller (e.g., controller 380 in FIGS. 3-4) as first timing information. The first timing information may further include any information related with formation of deflected electron beams including incident beams 1608, 1610, and 1612.

In some embodiments, first projection lens system 1614 may include at least one of condenser lens 340, primary projection system 360, or beam raster system 370 in FIGS. 3-4. First projection lens system 1614 may project and focus the N1 deflected electron beams onto a sample 1622, including incident beams 1608, 1610, and 1612. The cross-sections of the N1 deflected electron beams on the surface of sample 1622 form the N1 probing spots, including probing spots 1616, 1618, and 1620, corresponding to incident beams 1608, 1610, and 1612, respectively.

FIG. 16B is a schematic diagram of an exemplary subsystem 1600B of the multi-beam apparatus. Subsystem 1600B may include at least second deflector 1630, second projection lens system 1638, and detector 1644. As shown in FIG. 16A, incident beams 1608, 1610, and 1612 may be incident onto sample 1622 at probing spots 1616, 1618, and 1620 and interact in corresponding interaction volumes (not shown) under the surface of sample 1622. Reflected or emitted electrons ("exiting electrons"), including secondary electrons ("SEs") and backscattered electrons ("BSEs"), may exit from the interaction volumes along directions indicated by arrows in FIG. 16B and form initial exiting beams 1624, 1626, and 1628. Initial exiting beams 1624, 1626, and 1628 exit from probing spots 1616, 1618, and 1620, respectively.

As shown in FIG. 16B, the pulses (indicated as ellipses of different shades) of initial exiting beams 1624, 1626, and 1628 have larger cross-section than pulses 1604, indicating that the exiting electrons may exit from anywhere in the interaction volumes that are larger than the probing spots. This may lead to the cross-talk problem.

In some embodiments, second deflector 1630 may be a MEMS deflector. In some embodiments, second deflector 1630 may be a radio-frequency cavity deflector. In some embodiments, second deflector 1630 may be a deflection cavity similar to deflection cavity 330 in FIGS. 3-4 or one or more of deflectors 1424, 1426, and 1428 in FIG. 14. Second deflector 1630 may deflect the N1 initial exiting beams (including initial exiting beams 1624, 1626, and 1628) to form a second number (e.g., an integer N2) of deflected exiting beams, including deflected exiting beams 1632, 1634, and 1636, indicated as ellipses of different shades. Initial exiting beams 1624, 1626, and 1628 may be deflected to form deflected exiting beams 1632, 1634, and 1636, respectively. For example, the pulses in initial exiting beam 1624 may be deflected to form deflected exiting beam 1632, the pulses in initial exiting beam 1626 may be deflected to form deflected exiting beam 1634, and the pulses in initial exiting beam 1628 may be deflected to form deflected exiting beam 1636. In some embodiments, the N2 deflected exiting beams may be smaller than or equal to the N1 deflected exiting beams. In other words, pulses of different initial exiting beams may be deflected into the same deflected exiting beam. For example, the pulses in initial exiting beam 1628 and at least one pulse of another initial exiting beam (not shown) may be deflected to form deflected exiting beam 1636.

It can be seen from FIGS. 16A-16B that the pulses of initial exiting beams 1624, 1626, and 1628 leave the surface of sample 1622 in a sequence the same as pulses 1604. For example, the leading pulse of pulses 1604 firstly reaches sample 1622 at probing spot 1620, from which a pulse of initial exiting beam 1628 firstly leaves sample 1622. The intermediate pulse of pulses 1604 secondly reaches sample 1622 at probing spot 1618, from which a pulse of initial exiting beam 1626 secondly leaves sample 1622. The trailing pulse of pulses 1604 thirdly reaches sample 1622 at probing spot 1616, from which a pulse of initial exiting beam 1624 thirdly leaves sample 1622. That is, the pulses of initial exiting beams 1624, 1626, and 1628 enter second deflector 1630 at different timestamps, in the same order as pulses of the respectively corresponding incident beams that hit sample 1622. Such timestamps (e.g., timestamps of entering second deflector 1630 or timestamps of being directed by second deflector 1630) may be recorded by the controller (e.g., controller 380 in FIGS. 3-4) as second timing information. The second timing information may further include any information related with arrival of the initial exiting beams (including initial exiting beams 1624, 1626, and 1628) at second deflector 1630.

In some embodiments, second projection lens system 1638 may include at least one of a condenser lens 1640 or a secondary projection system 1642. In some embodiments, condenser lens 1640 may be similar to condenser lens 340. In some embodiments, secondary projection system 1642 may be similar to first projection lens system 1614. In some embodiments, condenser lens 1640 may be omitted. In some embodiments, second projection lens system 1638 may include components beyond condenser lens 1640 and secondary projection system 1642. In some embodiments, second projection lens system 1638 may share one or more components with first projection lens system 1614. In some embodiments, second projection lens system 1638 may be first projection lens system 1614 itself.

Second projection lens system 1638 may project and focus the N2 deflected exiting beams (including deflected exiting beams 1632, 1634, and 1636) onto a surface of detector 1644. Detector 1644 may include a third number (e.g., an integer N3) of detection elements corresponding to the N2 exiting beams, including detection elements 1646, 1648, and 1650. Detection elements may be units or sub-detectors of the same detector, or individual detectors of a detector array. In some embodiments, detector 1644 may be similar to electron detection device 140 in FIG. 2 or detector 350 in FIGS. 3-4. In some embodiments, detector 1644 may be a detector array. In some embodiments, detection elements 1646, 1648, and 1650 may be detection elements 140_2, 140_1, and 140_3, respectively.

Each detection element may detect a deflected exiting beam. For example, detection elements 1646, 1648, and 1650 may detect deflected exiting beams 1632, 1634, and 1636, respectively. Because the pulses of the deflected exiting beams do not arrive at detector 1644 simultaneously, in some embodiments, the number (e.g., N3) of the detection elements may be smaller than or equal to the number (e.g., N2) of the deflected exiting beams. That is, one detection element may detect pulses of different deflected exiting beams. For example, detection element 1650 may detect pulses of deflected exiting beam 1636 and pulses of another deflected exiting beam (not shown). By reducing the number of detection elements, the complexity and cost of building the multi-beam apparatus may be further lowered. In an embodiment, N3 may be as small as 1, as shown in FIG. 16C. That is, all deflected exiting beams may be detected by a single detection element.

It can be seen from FIGS. 16A and 16B that the pulses of deflected exiting beams 1632, 1634, and 1636 arrive at the surface of detector 1644 in a sequence the same as the pulses of incident beams reaching sample 1622 and the pulses of initial exiting beams reaching second deflector 1630. For example, the leading pulse of pulses 1604 firstly reaches sample 1622 at probing spot 1620, from which a pulse of initial exiting beam 1628 firstly leaves sample 1622, and a pulse of deflected exiting beam 1636 firstly reaches detection element 1650. The intermediate pulse of pulses 1604 secondly reaches sample 1622 at probing spot 1618, from which a pulse of initial exiting beam 1626 secondly leaves sample 1622, and a pulse of deflected exiting beam 1634 secondly reaches detection element 1648. The trailing pulse of pulses 1604 thirdly reaches sample 1622 at probing spot 1616, from which a pulse of initial exiting beam 1624 thirdly leaves sample 1622, and a pulse of deflected beam 1632 thirdly reaches detection element 1646. That is, the pulses of deflected exiting beams 1632, 1634, and 1636 enter detector 1644 at different timestamps. Such timestamps (e.g., timestamps of entering detector 1644 or timestamps of being detected by any detection element of detector 1644) may be recorded by the controller (e.g., controller 380 in FIGS. 3-4) as third timing information. The third timing information may further include any information related with arrival of the deflected exiting beams (including deflected exiting beams 1632, 1634, and 1636) at detector 1644.

Because the pulses of the deflected exiting beams arrive at detector 1644 at different timestamps, although the cross-section of them overlaps, they do not interfere with each other, and thus the issues related to cross-talk may be greatly alleviated. For example, when a pulse reaches detector 1644, there may be more than one responding detection elements that generate signals, similar to a cross-talk situation. However, based on the priori knowledge that the pulses reach detector 1644 one at a time no matter which exiting beam they are from, the controller may determine deposited charge or energy of the responding detection elements, and further identify the detection element ("arrival detection element") with the most deposited charge or energy as the actual arrival position where the pulse reaches. After identifying the arrival detection element that the pulse reaches, the controller may further determine a travel distance of the pulse between second deflector 1630 and the arrival detection element by, for example, inquiring a database storing predetermined distances between second deflector 1630 and the detection elements of detector 1644.

Based on the first timing information (e.g., the timestamps of pulses 1604 arriving at first deflector system 1606), the second timing information (e.g., the timestamps of the pulses of initial exiting beams 1624, 1626, and 1628 arriving at second deflector 1630), and the third timing information (e.g., the timestamps of deflected exiting beams 1632, 1634, and 1636 arriving at detector 1644), the controller may determine which pulse comes from which deflected exiting beam, which initial exiting beam, and which incident beam.

For example, the multi-beam apparatus (including subsystems 1600A and 1600B) may operate in a vacuum, in which the travel speed of electrons may be substantially constant. Also, the relative distances between different components of the multi-beam apparatus may be predetermined or measured, such as the distance between first deflector system 1606 and the surface of sample 1622, the distance between the surface of sample 1622 and second deflector 1630, and the distances between second deflector 1630 and surfaces of the detection elements of detector 1644. Because of the substantial constant travel speed of the electrons and the known distances, for a pulse of electrons, its first timing information, second timing information, and third timing information may be related. For example, for a pulse from incident beam 1608, initial exiting beam 1624, and deflected exiting beam 1632, the difference between its arrival time at second deflector 1630 and its arrival time at first deflector system 1606 may be a quotient of a sum of the distance between first deflector system 1606 and the surface of sample 1622 (e.g., probing spot 1616) and the distance between the surface of sample 1622 (e.g., probing spot 1616) and second deflector 1630 divided by the travel speed of electrons. For another example, for the same pulse in the previous example, the difference between its arrival time at detector 1644 and its arrival time at second deflector 1630 may be a quotient of a sum of the distance between the surface of sample 1622 (e.g., probing spot 1616) and second deflector 1630 and the distance between second deflector 1630 and the surface of detector 1644 divided by the travel speed of electrons. By finding arrival times related by the above relationships among the first, second, and third timing information, the controller may differentiate different initial exiting beams, and thus may be able to generate SEM images respectively associated with the differentiated initial exiting beams. It should be noted that the above-mentioned relationships between the travel speed, the known distances between components of the multi-beam apparatus, and the first, second, and third timing information are examples only, and this disclosure does not limit that aspect.

In some embodiments, the number (e.g., N3) of the detection elements and the number (e.g., N2) of the deflected exiting beams may depend on temporal resolution of detector 1644. It should be noted that the longitudinal time spread of the pulses (i.e., the time consumed for all electrons in a pulse to reach a surface perpendicular to a path of the pulse) may be so small (e.g., smaller than 0.5 picosecond) that the longitudinal time spread of the same pulse may be deemed as substantially zero compared with a difference between arrival times of any two consecutive pulses.

FIG. 16C is a schematic diagram of an exemplary subsystem 1600C of the multi-beam apparatus. Subsystem 1600C is the same as subsystem 1600B except that subsystem 1600C includes a detector 1652, in which one detection element may receive pulses from more than one deflected exiting beams. In some embodiments, the number (e.g., N3) of detection elements of detector 1652 may be one. For example, if detector 1652 has only one detection element with sufficiently high temporal resolution, even though second deflector 1630 deflects all deflected exiting beams to the detection element, detector 1652 may still be able to differentiate arrival times of all the pulses, and further differentiate which pulse comes from which initial exiting beam.

In some embodiments, electrons having different energies may be further directed by second deflector 1630 into different detectors or detection elements. Typically, SEs have lower energy (e.g., smaller than 50 eV) than BSEs, and may result better SEM image resolution to show fine surface structures. Though BSEs have higher energies and may result worse SEM image resolution, it may reflect information of deeper structures under the surface. Therefore, it may be beneficial to differentiate SEs and BSEs for SEM image generation. In a substantial vacuum environment, the energy of electrons may be dominantly in the form of kinetic energy. As long as an electron has substantially no energy dissipation (e.g., due to collision with other particles, electric accelerations, electric decelerations, or the like), the electron may travel at a substantially constant speed. The higher the energy of the electron, the higher the travel speed the electron may have. That is, for the same pulse (including SEs and BSEs) of an initial exiting beam, the arrival times of SEs may lag the arrival times of BSEs, the difference of which may be represented as an "intra-pulse" temporal gap. The intra-pulse temporal gap may be smaller than an "inter-pulse" temporal gap between arrival times of different pulses, based on which the controller may determine whether two arrival times are associated with electrons of the same pulse or different pulses. If the controller determines that a temporal gap of arrival times is smaller enough (e.g., smaller than or equal to a predetermined threshold) to be deem as an intra-pulse gap, the controller may further determine that the first arrival electrons are BSEs and the second arrival electrons are SEs. In some embodiments, based on such determination, the controller may control the second deflector 1630 to deflect the SEs and the BSEs within the same pulse into different detection elements of detector 1644. Based on the separately detected SEs and BSEs, SEM images for different purposes may be generated accordingly.

In some embodiments, a Wien filter may also be used for separating SEs and BSEs such that SEs and BSEs may reach different detection elements. For example, the Wien filter may be positioned downstream from second deflector 1630 and act as a stand-alone SE/BSE separator. That is, second deflector 1630 does not deflect SEs and BSEs in this example. For another example, the Wien filter may be positioned upstream or downstream from second deflector 1630 and cooperate with second deflector 1630 for further separating the SEs and BSEs. That is, SEs and BSEs may be deflected or separated by second deflector 1630 and the Wien filter in this example.

Figure 17:
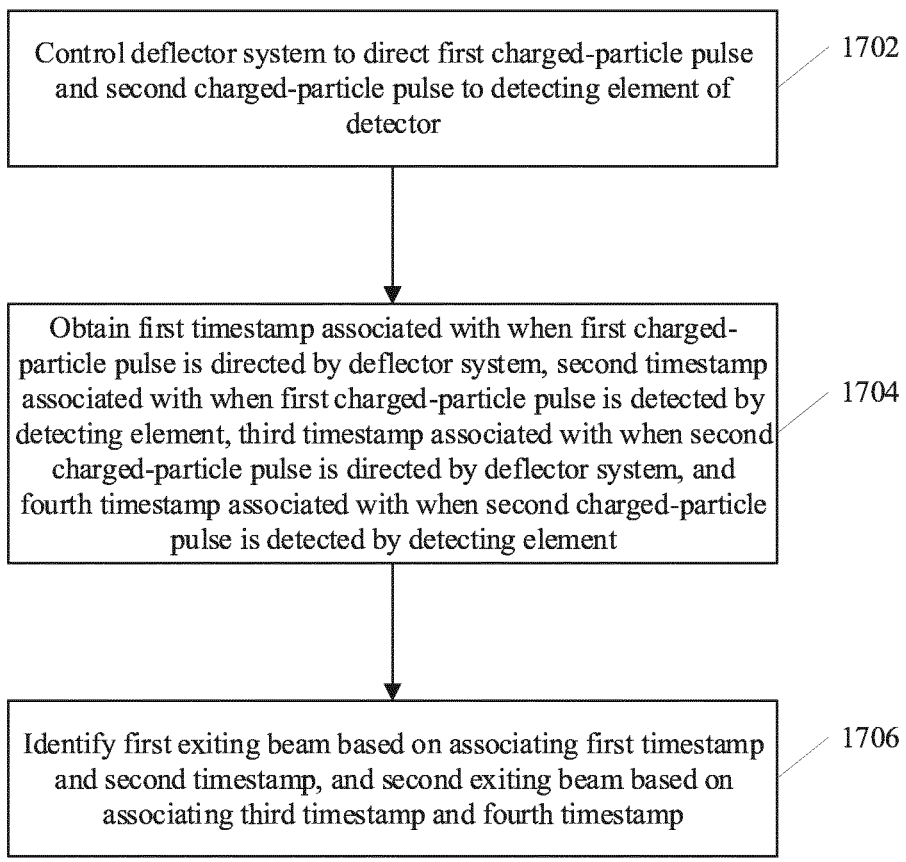
FIG. 17 is a flowchart showing an exemplary method for charged-particle detection using a multi-beam apparatus, consistent with embodiments of the present disclosure.

FIG. 17 is a flowchart showing an exemplary method 1700 for charged-particle detection using a multi-beam apparatus, consistent with embodiments of the present disclosure. Method 1700 may be performed by a controller that may be coupled with a charged particle beam apparatus (e.g., EBI system 1). For example, the controller may be controller 380 in FIG. 34. The controller may be programmed to implement method 1700.

At step 1702, the controller controls a deflector system to direct a first charged-particle pulse and a second charged-particle pulse to a detection element of a detector. The first charged-particle pulse may be emitted from a first probing spot. The second charged-particle pulse may be emitted from a second probing spot. In some embodiments, the charged particles may be electrons. For example, the deflector system may be second deflector 1630 in FIG. 16B. The first and second charged-particle pulses may be any two pulses of deflected exiting beams (e.g., deflected exiting beams 1632, 1634, and 1636 in FIG. 16B). For example, the first charged-particle pulse may be a pulse of deflected exiting beam 1632, and the second charged-particle pulse may be a pulse of deflected exiting beam 1634. The detector may be detector 1644 or detector 1652 in FIGS. 16B-16C. The detection element may be any of detection elements 1646, 1648, and 1650. The first and second probing spots may be any two of probing spots 1616, 1618, and 1620 in FIGS. 16A-16C, such as, for example, probing spots 1616 and 1618, respectively.

In some embodiments, the controller may control the deflector system to direct a first number (e.g., an integer N1) of charged-particle pulses (e.g., including the first and second charged-particle pulses) to a second number (e.g., an integer N2) of detection elements of the detector. For example, as shown in FIGS. 16B-16C, the controller may control second deflector 1630 to direct N1 charged particle pulses from deflected exiting beams 1632, 1634, and 1636 to N2 detection elements of detector 1644. In some embodiments, N1 may be greater than or equal to N2. In some embodiments, N2 may be greater than or equal to one. For example, as shown in FIG. 16C, N2 may be 1.

At step 1704, the controller obtains first timestamp associated with when the first charged-particle pulse is directed by the deflector system, second timestamp associated with when the first charged-particle pulse is detected by the detection element, third timestamp associated with when the second charged-particle pulse is directed by the deflector system, and fourth timestamp associated with when the second charged-particle pulse is detected by the detection element. For example, the first and third time stamps may be included in the second timing information described in association with FIGS. 16A-16C. The second and fourth timestamps may be included in the third timing information described in association with FIGS. 16A-16C.

In some embodiments, any one of the first or second charged-particle pulses may include at least one of SEs or BSEs. In some embodiments, using the deflector system (e.g., second deflector 1630), at least one of a pulse of SEs or a pulse of BSEs may be formed based on time of the SEs and the BSEs arriving at the deflector system. For example, second deflector 1630 may deflect SEs and BSEs based on the in-pulse temporal gap as described in parts associated with FIG. 16B. In some embodiments, the controller may obtain at least one of a first signal generated from the pulse of SEs or a second signal generated from the pulse of BSEs. In some embodiments, the first signal and the second signal may be generated by different detection elements (e.g., detection elements 1646, 1648, and 1650). For example, the detector may include a first detection element (e.g., detection element 1646) generating the first signal and a second detection element (e.g., detection element 1648) generating the second signal. In some embodiments, the first signal and the second signal may be generated by the same detection element (e.g., detector 1652). For example, the first signal and the second signal are generated at different timestamps by the detector 1652.

Still referring to FIG. 17, at step 1706, the controller identifies a first exiting beam based on associating the first timestamp and the second timestamp, and a second exiting beam based on associating the third timestamp and the fourth timestamp. For example, the controller may identify the first exiting beam starting from probing spot 1616, passing through second deflector 1630, and arriving at detection element 1646 based on at least the first and second timestamps. The controller may also identify the second exiting beam starting from probing spot 1618, passing through second deflector 1630, and arriving at detection element 1648 based on at least the third and fourth timestamps.

In some embodiments, before controlling the deflector system to direct the first and second charged-particle pulses, the controller may control an incident deflector system to form a first incident charged-particle pulse and a second incident charged-particle pulse. The controller may further obtain fifth timestamp associated with when the first incident charged-particle pulse is formed, and a sixth timestamp associated with when the second incident charged-particle pulse is formed. The controller may then identify the first exiting beam based on associating the first timestamp, the second timestamp, and the fifth timestamp, and the second exiting beam based on associating the third timestamp, the fourth timestamp, and the sixth timestamp. The first and second incident charged-particle pulses may be incident at the first and second probing spots (e.g., probing sports 1616 and 1618), respectively, on a surface of a sample. For example, the incident deflector system may be first deflector system 1606 in FIG. 16A. The first and second incident charged-particle pulses may be any two incident charged-particle pulses of incident beams, such as incident beams 1608, 1610, and 1612 in FIG. 16A.

In some embodiments, the incident deflector system may be the deflector system. In some embodiments, the incident deflector system may not be the deflector system. In some embodiments, the controller may communicate with at least one of the deflector system, the incident deflector system, or the detector. In some embodiments, at least one of the deflector system (e.g., second deflector 1630) or the incident deflector system (e.g., first deflector system 1606) may include a radio-frequency cavity deflector.

In some embodiments, using an electron optical system, the first and second charged-particle pulses may be focused on the detection element. For example, the electron optical system may be second projection lens system 1638 in FIGS. 16B-16C. In some embodiments, the deflector system (e.g., second deflector 1630) may be upstream from the electron optical system. In some embodiments, the deflector system may be downstream from the electron optical system. In some embodiments, the deflector system may be in the electron optical system. For example, as shown in FIGS. 16B-16C, second projection lens system 1638 may include second deflector 1630 and secondary projection system 1642, and second deflector 1630 is between condenser lens 1640 and secondary projection system 1642.

The embodiments may further be described using the following clauses:

1. A multi-beam apparatus for observing a sample, comprising:

a deflector configured to form a plurality of deflected charged-particle beams from a primary charged-particle beam comprising a plurality of charged-particle pulses;

a detector configured to detect a plurality of signals generated from a plurality of probe spots formed by the plurality of deflected charged-particle beams; and a controller configured to:

obtain a first timing information related with formation of a deflected charged-particle beam of the plurality of charged-particle beams;

obtain a second timing information related with detection of a signal of the plurality of signals; and associate the signal with the deflected charged-particle beam based on the obtained first and second timing information.

2. The multi-beam apparatus of clause 1, further comprising a charged-particle source, an acceleration cavity, and a bunching cavity.

3. The multi-beam apparatus of clause 2, wherein the charged-particle source comprises a pulsed radio-frequency source having a source frequency in a range of 100 MHz to 10 GHz.

4. The multi-beam apparatus of any one of clauses 1-3, wherein the deflector comprises one or more charged-particle deflectors, each of the one or more charged-particle deflectors forming the plurality of deflected charged-particle beams based on an operating frequency.

5. The multi-beam apparatus of clause 4, wherein the deflector is synchronized with the charged-particle source such that the operating frequency and the source frequency are related by the equation:

$$v1 = \frac{1}{n}(v2)$$

where v1 is the operating frequency, v2 is the source frequency, and n is a positive integer.

6. The multi-beam apparatus of any one of clauses 1-5, further comprising:

an electron optical system; and a charged-particle beam scanning system configured to scan each of the plurality of deflected charged-particle beams on the sample.

7. The multi-beam apparatus of clause 6, wherein the electron optical system comprises one of a single-lens system or a multiple-lens system.

8. The multi-beam apparatus of any one of clauses 6 and 7, wherein the controller is further configured to communicate with at least one of the deflector, the charged-particle beam scanning system, and the detector.

9. The multi-beam apparatus of any one of clauses 1-8, wherein the plurality of probe spots formed by the plurality of deflected charged-particle beams comprise one of a one-dimensional or a two-dimensional pattern.

10. The multi-beam apparatus of clause 9, wherein the two-dimensional pattern comprises a Lissajous pattern, a matrix, or an array.

11. The multi-beam apparatus of any of preceding clauses, wherein the first time information comprises at least one of a time of deflection of a charged-particle pulse of the deflected charged-particle beam, a time of formation of a charged-particle pulse of the primary charged-particle beam, a frequency or a period of the deflected charged-particle beam, or an average number of electron pulses in the deflected charged-particle beam.

12. The multi-beam apparatus of clause 11, wherein the time of deflection of the charged-particle pulse of the deflected charged-particle beam comprises a timestamp when the deflector directs the charged-particle pulse of the deflected charged-particle beam into a direction to form a portion of the deflected charged-particle beam.

13. A method for observing a sample in a multi-beam apparatus, the method comprising:

forming, using a deflector, a plurality of deflected charged-particle beams from a primary charged-particle beam comprising a plurality of charged-particle pulses;

detecting, using a detector, a plurality of signals generated from a plurality of probe spots formed by the plurality of deflected charged-particle beams;

obtaining, using a controller, a first timing information related with formation of a deflected charged-particle beam of the plurality of charged-particle beams, and a second timing information related with detection of a signal of the plurality of signals; and associating, using the controller, the signal with the deflected charged-particle beam based on the obtained first and second timing information.

14. The method of clause 13, wherein a pulsed radio-frequency charged-particle source is configured to generate the plurality of charged-particle pulses having a source frequency in a range of 100 MHz to 10 GHz.

15. The method of any one of clauses 13 and 14, wherein the deflector comprises one or more charged-particle deflectors, each of the one or more charged-particle deflectors forming the plurality of deflected charged-particle beams based on an operating frequency.

16. The method of clause 11, wherein the deflector is synchronized with the charged-particle source such that the operating frequency and the source frequency are related by the equation:

$$v1 = \frac{1}{n}(v2)$$

where v1 is the operating frequency, v2 is the source frequency, and n is a positive integer.

17. The method of any one of clauses 13-16, further comprising focusing the plurality of deflected charged-particle beams on the sample using an electron optical system.

18. The method of any one of clauses 13-17, further comprising scanning each of the plurality of deflected charged-particle beams on the sample using a charged-particle beam scanning system.

19. The method of any one of clauses 18, further comprising communicating, via the controller, with at least one of the deflector, the charged-particle beam scanning system, and the detector.

20. The method of any one of clauses 13-19, wherein the plurality of probe spots formed by the plurality of deflected charged-particle beams comprise one of a one-dimensional or a two-dimensional pattern.

21. The method of clause 20, wherein the two-dimensional pattern comprises a Lissajous pattern, a matrix, or an array.

22. The method of any of clauses 13-21, wherein the first time information comprises at least one of time of formation of the deflected charged-particle beam, a frequency or a period of the deflected charged-particle beam, or an average number of electron pulses in the deflected charged-particle beam.

23. The method of clause 22, wherein the time of formation of the deflected charged-particle beam comprises a timestamp when the deflector directs a charged-particle pulse into a direction to form the deflected charged-particle beam.

24. A controller of a multi-beam apparatus, comprising:
a memory storing a set of instructions; and
a processor configured to execute the set of instructions to cause the controller to:
obtain a first timing information related with formation of a deflected charged-particle beam of a plurality of charged-particle beams;
obtain a second timing information related with detection of a signal of a plurality of signals; and
associate the signal with the deflected charged-particle beam based on the obtained first and second timing information.

25. A non-transitory computer readable medium storing a set of instructions that is executable by one or more processors of a multi-beam apparatus to cause the multi-beam apparatus to perform a method to observe a sample, the method comprising:
forming a plurality of deflected charged-particle beams from a primary charged-particle beam comprising a plurality of charged-particle pulses;
detecting a plurality of signals generated from a plurality of probe spots formed by the plurality of deflected charged-particle beams;
obtaining a first timing information related with formation of a deflected charged-particle beam of the plurality of charged-particle beams, and a second timing information related with detection of a signal of the plurality of signals; and
associating the signal with the deflected charged-particle beam based on the obtained first and second timing information.

26. The non-transitory computer readable medium of clause 25, wherein the set of instructions that is executable by one or more processors of a multi-beam apparatus cause the multi-beam apparatus to further perform:
focusing the plurality of deflected charged-particle beams on the sample using an electron optical system; and
scanning each of the plurality of focused deflected charged-particle beams on the sample using a charged-particle beam scanning system.
modify the associated beam current of each of the plurality of beamlets; and
focus each of the plurality of beamlets on a focal plane.

27. A multi-beam apparatus comprising:
a charged-particle source configured to generate a primary charged-particle beam comprising a plurality of charged-particle pulses;
a bunching cavity configured to form a plurality of charged-particle beams from the primary charged-particle beam; and
a deflector configured to deflect the plurality of charged-particle beams to form a plurality of probe spots on a sample.

28. The apparatus of clause 27, further comprising a detector configured to detect a plurality of signals generated from the plurality of probe spots formed by the plurality of deflected charged-particle beams.

29. The apparatus of any one of clauses 27 and 28, further comprising a controller configured to:
obtain a first timing information related with formation of the deflected charged-particle beam of the plurality of charged-particle beams;
obtain a second timing information related with detection of a signal of the plurality of signals; and
associate the signal with the deflected charged-particle beam based on the obtained first and second timing information.

30. The apparatus of clause 29, wherein the first time information comprises at least one of time of formation of the deflected charged-particle beam, a frequency or a period of the deflected charged-particle beam, or an average number of electron pulses in the deflected charged-particle beam.

31. The apparatus of clause 30, wherein the time of formation of the deflected charged-particle beam comprises a timestamp when the deflector directs a charged-particle pulse into a direction to form the deflected charged-particle beam.

32. The apparatus of any one of clauses 27-29, wherein the charged-particle source comprises a pulsed radio-frequency source having a source frequency in a range of 100 MHz to 10 GHz.

33. The apparatus of any one of clauses 27-32, wherein the deflector comprises one or more charged-particle deflectors, each of the one or more charged-particle deflectors deflecting the plurality of charged-particle beams based on an operating frequency.

34. A method for observing a sample in a multi-beam apparatus, the method comprising:
generating a primary charged-particle beam comprising a plurality of charged-particle pulses from a charged-particle source;
forming, using a bunching cavity, a plurality of charged-particle beams from the primary charged-particle beam; and
deflecting, using a deflector, the plurality of charged-particle beams to form a plurality of probe spots on a sample.

35. The method of clause 34, further comprising detecting the plurality of signals generated from the plurality of probe spots formed by the plurality of deflected charged-particle beams.

36. The method of any one of clauses 34 and 35, further comprising:
obtaining, using a controller, a first timing information related with formation of the deflected charged-particle beam of the plurality of charged-particle beams;
obtaining, using the controller, a second timing information related with detection of a signal of the plurality of signals; and
associating, using the controller, the signal with the deflected charged-particle beam based on the obtained first and second timing information.

37. The method of clause 36, wherein the first time information comprises at least one of time of formation of the deflected charged-particle beam, a frequency or a period of the deflected charged-particle beam, or an average number of electron pulses in the deflected charged-particle beam.

38. The method of clause 37, wherein the time of formation of the deflected charged-particle beam comprises a timestamp when the deflector directs a charged-particle pulse into a direction to form the deflected charged-particle beam.

39. The method of any one of clauses 34-36, wherein the charged-particle source comprises a pulsed radio-frequency source configured to generate the plurality of charged-particle pulses having a source frequency in a range of 100 MHz to 10 GHz 40. The method of any one of clauses 34-39, wherein the deflector comprises one or more charged-particle deflectors, each of the one or more charged-particle deflectors deflecting the plurality of charged-particle beams based on an operating frequency.

41. An apparatus for observing a sample, comprising:
a deflector configured to deflect a plurality of pulses of charged particles to a plurality of probe spots on a sample;

a detector configured to detect a plurality of signals from the sample that result from the plurality of pulses interacting with the sample; and a controller configured to correlate a particular detected signal to a particular probe spot on the sample based on a correlation between a time that the particular signal generated from the particular probe spot was detected and a time that a particular charged particle pulse forming the particular probe spot was deflected.

42. The apparatus of clause 41, further comprising a charged particle source, an acceleration cavity, and a bunching cavity.

43. The apparatus of clause 42, wherein the charged-particle source comprises a pulsed radio-frequency source having a source frequency in a range of 100 MHz to 10 GHz.

44. The apparatus of any one of clauses 41-43, wherein the deflector comprises one or more charged-particle deflectors, each of the one or more charged-particle deflectors deflecting the plurality of pulses of charged particles based on an operating frequency.

45. The apparatus of clause 44, the deflector is synchronized with the charged-particle source such that the operating frequency and the source frequency are related by the equation:

$$v1 = \frac{1}{n}(v2)$$

where v1 is the operating frequency, v2 is the source frequency, and n is a positive integer.

46. The apparatus of any one of clauses 41-45, further comprising:

an electron optical system; and a charged particle beam scanning system configured to scan each of the plurality of deflected pulses of charged particles on the sample.

47. The apparatus of clause 46, wherein the electron optical system comprises one of a single-lens system or a multiple-lens system.

48. The apparatus of any one of clauses 46 and 47, wherein the controller is further configured to communicate with at least one of the deflector, the charged-particle beam scanning system, and the detector.

49. A multi-beam apparatus for charged-particle detection, comprising:

a deflector system configured to direct charged-particle pulses;

a detector having a detection element, the detection element configured to detect the charged-particle pulses; and a controller having a circuitry configured to:

control the deflector system to direct a first charged-particle pulse and a second charged-particle pulse to the detection element, wherein the first charged-particle pulse is emitted from a first probing spot, and the second charged-particle pulse is emitted from a second probing spot;

obtain a first timestamp associated with when the first charged-particle pulse is directed by the deflector system, a second timestamp associated with when the first charged-particle pulse is detected by the detection element, a third timestamp associated with when the second charged-particle pulse is directed by the deflector system, and a fourth timestamp associated with when the second charged-particle pulse is detected by the detection element; and identify a first exiting beam based on the first timestamp and the second timestamp, and a second exiting beam based on the third timestamp and the fourth timestamp.

50. The multi-beam apparatus of clause 49, wherein the circuitry configured to control the deflector system to direct the first charged-particle pulse and the second charged-particle pulse is further configured to:

control the deflector system to direct N charged-particle pulses to M detection elements of the detector, wherein the N charged-particle pulses comprise the first charged-particle pulse and the second charged-particle pulse, and wherein N and M are integers.

51. The multi-beam apparatus of clause 50, wherein the N is greater than or equal to M.

52. The multi-beam apparatus of any one of clauses 50-51, wherein M is greater than or equal to one.

53. The multi-beam apparatus of clause 51, wherein N is equal to one.

54. The multi-beam apparatus of any one of clauses 50-52, wherein the circuitry is further configured to:

before controlling the deflector system to direct the first charged-particle pulse and the second charged-particle pulse, control an incident deflector system to form a first incident charged-particle pulse and a second incident charged-particle pulse, wherein the first incident charged-particle pulse is configured to be incident at the first probing spot on a surface of a sample, and the second incident charged-particle pulse is configured to be incident at the second probing spot on the surface of the sample;

obtain fifth timestamp associated with forming of the first incident charged-particle pulse, and a sixth timestamp associated with forming of the second incident charged-particle pulse; and identify the first exiting beam based on the first timestamp, the second timestamp, and the fifth timestamp, and the second exiting beam based on the third timestamp, the fourth timestamp, and the sixth timestamp.

55. The multi-beam apparatus of clause 54, wherein the circuitry is further configured to communicate with at least one of the deflector system, the incident deflector system, or the detector.

56. The multi-beam apparatus of any one of clauses 54-55, wherein at least one of the deflector system or the deflector system comprises a radio-frequency cavity deflector.

57. The multi-beam apparatus of any one of clauses 49-56, wherein any one of the first charged-particle pulse and the second charged-particle pulse comprises at least one of secondary electrons or backscattered electrons.

58. The multi-beam apparatus of clause 57, wherein the deflector system is further configured to form at least one of a pulse of secondary electrons or a pulse of backscattered electrons based on time of the secondary electrons and the backscattered electrons arriving at the deflector system.

59. The multi-beam apparatus of clause 58, wherein the circuitry is further configured to obtain at least one of a first signal generated from the pulse of secondary electrons or a second signal generated from the pulse of backscattered electrons.

60. The multi-beam apparatus of clause 59, wherein the detector comprises a first detection element configured to generate the first signal and a second detection element configured to generate the second signal.

61. The multi-beam apparatus of clause 59, wherein the detection element is configured to generate the first signal and the second signal are generated at different timestamps.

62. The multi-beam apparatus of any one of clauses 49-63, further comprising:

an electron optical system configured to focus the first charged-particle pulse and the second charged-particle pulse on the detection element.

63. The multi-beam apparatus of clause 62, wherein the deflector system is upstream from the electron optical system.

64. The multi-beam apparatus of clause 62, wherein the deflector system is downstream from the electron optical system.

65. The multi-beam apparatus of clause 62, wherein the deflector system is in the electron optical system.

66. A method for charged-particle detection in a multi-beam apparatus, the method comprising:
controlling a deflector system to direct a first charged-particle pulse and a second charged-particle pulse to a detection element of a detector;
obtaining, using a controller, a first timestamp associated with when the first charged-particle pulse is directed by the deflector system, a second timestamp associated with when the first charged-particle pulse is detected by the detection element, a third timestamp associated with when the second charged-particle pulse is directed by the deflector system, and a fourth timestamp associated with when the second charged-particle pulse is detected by the detection element; and
identifying, using a controller, a first exiting beam based on the first timestamp and the second timestamp, and a second exiting beam based on the third timestamp and the fourth timestamp.

67. The method of clause 66, wherein the first charged-particle is emitted from a first probing spot, and the second charged-particle is emitted from a second probing spot.

68. The method of any of clauses 66-67, wherein controlling the deflector system to direct the first charged-particle pulse and the second charged-particle pulse comprises:
controlling the deflector system to direct N charged-particle pulses to M detection elements of the detector, wherein the N charged-particle pulses comprise the first charged-particle pulse and the second charged-particle pulse, and wherein N and M are integers.

69. The method of clause 68, wherein N is greater than or equal to M.

70. The method of any one of clauses 68-69, wherein M is greater than or equal to one.

71. The method of clause 69, wherein N is equal to one.

72. The method of any one of clauses 66-70, further comprising:
before controlling the deflector system to direct the first charged-particle pulse and the second charged-particle pulse, controlling an incident deflector system to form a first incident charged-particle pulse and a second incident charged-particle pulse, wherein the first incident charged-particle pulse is configured to be incident at the first probing spot on a surface of a sample, and the second incident charged-particle pulse is configured to be incident at the second probing spot on the surface of the sample;
obtaining fifth timestamp associated with when the first incident charged-particle pulse is formed, and a sixth timestamp associated with when the second incident charged-particle pulse is formed; and
identifying the first exiting beam based on the first timestamp, the second timestamp, and the fifth timestamp, and the second exiting beam based on the third timestamp, the fourth timestamp, and the sixth timestamp.

73. The method of clause 72, further comprising:
communicating, by the controller, with at least one of the deflector system, the incident deflector system, or the detector.

74. The method of any one of clauses 72-73, wherein at least one of the deflector system or the incident deflector system comprises a radio-frequency cavity deflector.

75. The method of any one of clauses 66-74, wherein any one of the first charged-particle pulse and the second charged-particle pulse comprises at least one of secondary electrons or backscattered electrons.

76. The method of clause 75, further comprising:
forming, using the deflector system, at least one of a pulse of secondary electrons or a pulse of backscattered electrons based on time of the secondary electrons and the backscattered electrons arriving at the deflector system.

77. The method of clause 76, further comprising:
obtaining at least one of a first signal generated from the pulse of secondary electrons or a second signal generated from the pulse of backscattered electrons.

78. The method of clause 77, wherein the detector comprises a first detection element generating the first signal and a second detection element generating the second signal.

79. The method of clause 77, wherein the first signal and the second signal are generated at different timestamps by the detection element.

80. The method of any one of clauses 66-79, further comprising:
focusing the first charged-particle pulse and the second charged-particle pulse on the detection element using an electron optical system.

81. The method of any one of clauses 80, wherein the deflector system is upstream from the electron optical system.

82. The method of any one of clauses 80, wherein the deflector system is downstream from the electron optical system.

83. The method of any one of clauses 80, wherein the deflector system is in the electron optical system.

84. A non-transitory computer readable medium storing a set of instructions that is executable by one or more processors of a multi-beam apparatus to cause the multi-beam apparatus to perform a method for charged-particle detection, the method comprising:
controlling a deflector system to direct a first charged-particle pulse and a second charged-particle pulse to a detection element of a detector;
obtaining, using a controller, first timestamp associated with when the first charged-particle pulse is directed by the deflector system, second timestamp associated with when the first charged-particle pulse is detected by the detection element, third timestamp associated with when the second charged-particle pulse is directed by the deflector system, and fourth timestamp associated with when the second charged-particle pulse is detected by the detection element; and
identifying, using a controller, a first exiting beam based on associating the first timestamp and the second timestamp, and a second exiting beam based on associating the third timestamp and the fourth timestamp.

85. A multi-beam apparatus for reducing interaction of charged particles, the apparatus comprising:
a first cluster cavity configured to receive a first set of charged particles to form a first cluster of charged particles;
a second cluster cavity configured to receive a second set of charged particles to form a second cluster of charged particles; and a controller having a circuitry configured to cause the first cluster and the second cluster to pass a downstream position in a predetermined time-space order.

86. The multi-beam apparatus of clause 85, wherein the first set of charged particles and the second set of charged particles comprise charged-particle pulses.

87. The multi-beam apparatus of clause 85, wherein the first set of charged particles and the second set of charged particles comprise a continuous charged-particle stream.

88. The multi-beam apparatus of any of clauses 85-87, wherein the predetermined time-space order comprises that the first cluster and the second cluster pass the downstream position in sequence.

89. The multi-beam apparatus of clause 88, wherein the predetermined time-space order comprises that at most one of the first cluster and the second cluster passes the downstream position at any time.

90. The multi-beam apparatus of any of clauses 85-89, further comprising:
a plurality of cluster cavities configured to receive respective sets of charged particles by each cluster cavity to form a plurality of beams, wherein
each beam comprises clusters of charged particles, and
the controller is configured to cause the clusters of the plurality of beams to pass the downstream position in the predetermined time-space order.

91. The multi-beam apparatus of clause 90, wherein the predetermined time-space order comprises that the clusters of the plurality of beams pass the downstream position in non-overlapping sequence.

92. The multi-beam apparatus of clause 91, wherein the predetermined time-space order comprises that at most one of the clusters of the plurality of beams passes the downstream position at any time.

93. The multi-beam apparatus of any one of clauses 85-92, further comprising an objective lens, wherein the downstream position is near or in the objective lens.

94. The multi-beam apparatus of any one of clauses 85-93, wherein the first cluster cavity is provided with a first dynamic electric field, and the second cluster cavity is provided with a second dynamic electric field.

95. The multi-beam apparatus of clause 94, wherein the controller is further configured to:
coordinate the first dynamic electric field and the second dynamic electric field to change.

96. The multi-beam apparatus of any one of clauses 94-95, wherein the controller is further configured to:
change a direction of the first dynamic electric field parallel to a direction of the first cluster, and a direction of the second dynamic electric field parallel to a direction of the second cluster.

97. The multi-beam apparatus of clause 96, wherein the controller is further configured to:
change at least one of the direction of the first dynamic electric field or the direction of the second dynamic electric field in a first cycle.

98. The multi-beam apparatus of clause 96, wherein the controller is further configured to:
determine the first cycle based on at least one of a scan frequency of the multi-beam apparatus or a number of beams.

99. The multi-beam apparatus of any one of clauses 94-98, wherein the controller is further configured to:
cause the first dynamic electric field to decelerate a first charged particle before a second charged particle enters the first cluster cavity, wherein the at least two charged particles comprise the first charged particle and the second charged particle; and
when the second charged particle enters the first cluster cavity, control the first dynamic electric field for causing the second charged particle to move faster than the first charged particle.

100. The multi-beam apparatus of clause 99, wherein the controller configured to control the first dynamic electric field is further configured to perform one of:
accelerating the second charged particle;
neither accelerating nor decelerating the second charged particle; or
decelerating the second charged particle in a lesser degree than decelerating the first charged particle.

101. The multi-beam apparatus of any one of clauses 99-100, further comprising:
a third cluster cavity downstream from the first cluster cavity and being provided with a third dynamic electric field, configured to receive the first cluster, wherein
the controller is further configured to cause, using the third dynamic electric field, the first charged particle and the second charged particle to move in a substantially similar speed.

102. The multi-beam apparatus of clause 101 wherein the controller is further configured to:
cause the third dynamic electric field to decelerate the second charged particle to move at the substantially similar speed.

103. The multi-beam apparatus of any one of clauses 101-102, wherein the controller is further configured to:
coordinate the third dynamic electric field and the first dynamic electric field to change.

104. The multi-beam apparatus of any one of clauses 101-103, wherein the controller is further configured to:
change a direction of the third dynamic electric field parallel to a direction of the first cluster.

105. The multi-beam apparatus of clause 104 wherein the controller is further configured to:
change the direction of the third dynamic electric field in a second cycle.

106. The multi-beam apparatus of clause 105, wherein the controller is further configured to:
determine the second cycle based on at least one of the scan frequency of the multi-beam apparatus, the number of the beams, or the first cycle.

107. The multi-beam apparatus of any one of clauses 94-106, further comprising:
a filter cavity downstream from the first cluster cavity and being provided with a dynamic electromagnetic field, wherein the filter cavity is configured to receive the first cluster and a first stray charged particle, the dynamic electromagnetic field comprising at least one of a third dynamic electric field or a dynamic magnetic field; wherein
the controller is further configured to control the filter cavity to filter the first stray charged particle using the dynamic electromagnetic field.

108. The multi-beam apparatus of clause 107, wherein the controller is further configured to:
change a direction of the dynamic electromagnetic field perpendicular to the direction of the first cluster.

109. The multi-beam apparatus of any one of clauses 107-108, wherein the controller is further configured to:
when the first cluster is in the filter cavity, cause the dynamic electromagnetic field not to direct the first cluster; and when the first cluster is not in the filter cavity, cause the dynamic electromagnetic field to direct the first stray charged particle away from the direction of the first cluster.

110. The multi-beam apparatus of any one of clauses 107-109, wherein the controller is further configured to:
coordinate the dynamic electromagnetic field and the first dynamic electric field to change.

111. The multi-beam apparatus of any one of clauses 108-110, wherein the controller is further configured to:
change the direction of the dynamic electromagnetic field in a third cycle.

112. The multi-beam apparatus of clause 111, wherein the controller is further configured to:
determine the third cycle based on at least one of the scan frequency of the multi-beam apparatus, the number of the beams, the first cycle, or the second cycle.

113. The multi-beam apparatus of any one of clauses 107-112, further comprising:
an aperture plate downstream from the filter cavity and configured to filter a second stray charged particle.

114. The multi-beam apparatus of any one of clauses 111-113, wherein the filter cavity and the aperture plate are upstream from or downstream from the third cluster cavity.

115. The multi-beam apparatus of any one of clauses 111-113, wherein the third cluster cavity is between the filter cavity and the aperture plate.

116. The multi-beam apparatus of any one of clauses 85-115, wherein the controller is further configured to:
cause the first cluster to exit the first cluster cavity and the second cluster to exit the second cluster cavity in an alternate manner, wherein the first cluster and the second cluster pass the downstream position in the alternate manner.

117. A method for reducing interaction of charged particles in a charged-particle beam of a multi-beam apparatus, the method comprising:
receiving a first set of charged particles in a first cluster cavity to form a first cluster of charged particles;
receiving a second set of charged particles in a second cluster cavity to form a second cluster of charged particles; and
causing the first cluster and the second cluster to pass a downstream position in a predetermined time-space order.

118. The method of clause 117, wherein the first set of charged particles and the second set of charged particles comprise charged-particle pulses.

119. The method of clause 117 wherein the first set of charged particles and the second set of charged particles comprise a continuous charged-particle stream.

120. The method of any of clauses 117-119, wherein the predetermined time-space order comprises that the first cluster and the second cluster pass the downstream position in sequence.

121. The method of clause 120 wherein the predetermined time-space order comprises that at most one of the first cluster and the second cluster passes the downstream position at any time.

122. The method of any of clauses 117-121, further comprising:
receiving respective sets of charged particles in each cluster cavity of a plurality of cluster cavities to form a plurality of beams, each beam comprising clusters of charged particles; and
causing the clusters of the plurality of beams to pass the downstream position in the predetermined time-space order.

123. The method of clause 122, wherein the predetermined time-space order comprises that the clusters of the plurality of beams pass the downstream position in non-overlapping sequence.

124. The method of clause 123, wherein the predetermined time-space order comprises that at most one of the clusters of the plurality of beams passes the downstream position at any time.

125. The method of any one of clauses 117-124, wherein the downstream position is near or in an objective lens in the multi-beam apparatus.

126. The method of any one of clauses 117-125, wherein the first cluster cavity is provided with a first dynamic electric field, and the second cluster cavity is provided with a second dynamic electric field.

127. The method of clause 126, further comprising:
coordinating the first dynamic electric field and the second dynamic electric field to change.

128. The method of any one of clauses 126-127, further comprising:
changing a direction of the first dynamic electric field parallel to a direction of the first cluster, and a direction of the second dynamic electric field parallel to a direction of the second cluster.

129. The method of clause 128, further comprising:
changing at least one of the direction of the first dynamic electric field or the direction of the second dynamic electric field in a first cycle.

130. The method of clause 129, further comprising:
determining the first cycle based on at least one of a scan frequency of the multi-beam apparatus or a number of beams.

131. The method of any one of clauses 126-130, wherein the receiving the first set of pulses of charged particles in the first cluster cavity to form the first cluster of charged particles comprises:
causing the first dynamic electric field to decelerate a first charged particle before a second charged particle enters the first cluster cavity, wherein the at least two charged particles comprise the first charged particle and the second charged particle; and
when the second charged particle enters the first cluster cavity, controlling the first dynamic electric field for causing the second charged particle to move faster than the first charged particle.

132. The method of clause 131, wherein controlling the first dynamic electric field for causing the second charged particle to move faster than the first charged particle comprises one of:
accelerating the second charged particle;
neither accelerating nor decelerating the second charged particle; or
decelerating the second charged particle in a lesser degree than decelerating the first charged particle.

133. The method of any one of clauses 131-132, wherein the forming the first cluster of charged particles comprises:
receiving the first cluster in a third cluster cavity downstream from the first cluster cavity; and
causing, using a third dynamic electric field in the third cluster cavity, the first charged particle and the second charged particle to move in a substantially similar speed.

134. The method of clause 133, wherein the causing the first charged particle and the second charged particle to move in the substantially similar speed comprises:
causing the third dynamic electric field to decelerate the second charged particle to move at the substantially similar speed.

135. The method of any one of clauses 133-134, further comprising:
coordinating the third dynamic electric field and the first dynamic electric field to change.

136. The method of any one of clauses 133-135, further comprising:
changing a direction of the third dynamic electric field parallel to a direction of the first cluster.

137. The method of clause 136, further comprising:
changing the direction of the third dynamic electric field in a second cycle.

138. The method of clause 137, further comprising:
determining the second cycle based on at least one of the scan frequency of the multi-beam apparatus, the number of the beams, or the first cycle.

139. The method of any one of clauses 126-138, wherein the receiving the first set of pulses of charged particles in the first cluster cavity to form the first cluster of charged particles further comprises:
receiving the first cluster and a first stray charged particle in a filter cavity downstream from the first cluster cavity; and
filtering the first stray charged particle using a dynamic electromagnetic field in the filter cavity, the dynamic electromagnetic field comprising at least one of a third dynamic electric field or a dynamic magnetic field.

140. The method of clause 139, further comprising:
changing a direction of the dynamic electromagnetic field perpendicular to the direction of the first cluster.

141. The method of any one of clauses 139-140, wherein the filtering the first stray charged particle comprises:
when the first cluster is in the filter cavity, causing the dynamic electromagnetic field not to direct the first cluster; and
when the first cluster is not in the filter cavity, causing the dynamic electromagnetic field to direct the first stray charged particle away from the direction of the first cluster.

142. The method of any one of clauses 139-141, further comprising:
coordinating the dynamic electromagnetic field and the first dynamic electric field to change.

143. The method of any one of clauses 140-142, further comprising:
changing the direction of the dynamic electromagnetic field in a third cycle.

144. The method of clause 143, further comprising:
determining the third cycle based on at least one of the scan frequency of the multi-beam apparatus, the number of the beams, the first cycle, or the second cycle.

145. The method of any one of clauses 139-144, wherein the forming the first cluster of charged particles further comprises:
filtering a second stray charged particle using an aperture plate downstream from the filter cavity.

146. The method of any one of clauses 133-145, wherein the filter cavity and the aperture plate are upstream from or downstream from the third cluster cavity.

147. The method of any one of clauses 133-145, wherein the third cluster cavity is between the filter cavity and the aperture plate.

148. The method of any one of clauses 117-147, wherein the causing the first cluster and the second cluster to pass the downstream position comprises:
causing the first cluster to exit the first cluster cavity and the second cluster to exit the second cluster cavity in an alternate manner, wherein the first cluster and the second cluster pass the downstream position in the alternate manner.

149. A non-transitory computer readable medium storing a set of instructions that is executable by one or more processors of a multi-beam apparatus to cause the multi-beam apparatus to perform a method for reducing interaction of charged particles in a charged-particle beam, the method comprising:
receiving a first set of charged particles in a first cluster cavity to form a first cluster of charged particles;
receiving a second set of charged particles in a second cluster cavity to form a second cluster of charged particles; and
causing the first cluster and the second cluster to pass a downstream position in a predetermined time-space order.

150. A multi-beam apparatus, the multi-beam apparatus comprising:
a first charged-particle source;
a second charged-particle source; and
at least one deflector system downstream from the first charged-particle source and the second charged-particle source, configured to:
receive a first beam of pulsed charged particles from the first charged-particle source and a second beam of pulsed charged particles from the second charged-particle source; and
direct the first beam and the second beam in a predetermined time-space order,
wherein the first beam and the second beam pass a downstream position in sequence.

151. The multi-beam apparatus of clause 150, wherein the first charged-particle source and the second charged-particle source are charged-particle pulse generators.

152. The multi-beam apparatus of clause 151, wherein a pulse generator comprises a charged-particle emitter and a pulse laser generator.

153. The multi-beam apparatus of any one of clauses 150-152, wherein the first beam and the second beam are beams of clustered charged particles.

154. The multi-beam apparatus of any one of clauses 150-153, wherein the at least one deflector system comprises a radio-frequency cavity deflector.

155. The multi-beam apparatus of any one of clauses 150-154, wherein the at least one deflector system comprises a first deflector receiving the first beam and a second deflector receiving the second beam.

156. The multi-beam apparatus of any one of clauses 150-154, wherein the at least one deflector system comprises a deflector receiving the first beam and the second beam.

157. The multi-beam apparatus of any one of clauses 155-156, wherein the first deflector and the second deflector are arranged to be on a same plane.

158. The multi-beam apparatus of any one of clauses 155-157, wherein the first deflector and the second deflector are arranged to be on different planes.

159. The multi-beam apparatus of any one of clauses 150-158, wherein the at least one deflector system is further configured to:
release the first beam and the second beam in sequence.

160. The multi-beam apparatus of any one of clauses 150-159, wherein the at least one deflector system is further configured to:
direct the first beam in a first direction and the second beam in a second direction.

161. The multi-beam apparatus of any one of clauses 150-160, wherein the predetermined time-space order comprises that a distance between the first beam and the second beam decreases after the at least one deflector system releases the first beam and the second beam.

162. The multi-beam apparatus of any one of clauses 150-161, wherein the predetermined time-space order comprises that the first beam and the second beam are parallel after the at least one deflector system releases the first beam and the second beam.

163. The multi-beam apparatus of any one of clauses 150-162, further comprising:
an aperture plate downstream from the at least one deflector system, comprising a first aperture and a second aperture, wherein the first aperture receives the first beam, and the second aperture receives the second beam.

164. The multi-beam apparatus of any one of clauses 150-163, wherein the at least one deflector system is further configured to:
form a first cluster of charged particles using the first beam and a second cluster of charged particles using the second beam; and
release the first cluster and the second cluster in the predetermined time-space order.

165. The multi-beam apparatus of clause 164, wherein the at least one deflector system is further configured to:
release the first cluster and the second cluster in sequence, wherein the first cluster and the second cluster pass the downstream position in sequence.

166. A method for providing multiple charged-particle beams in a multi-beam apparatus, the method comprises:
receiving, in at least one deflector system, a first beam of pulsed charged particles from a first charged-particle source and a second beam of pulsed charged particles from a second charged-particle source; and
directing the first beam and the second beam in a predetermined time-space order, wherein the first beam and the second beam pass a downstream position in sequence.

167. The method of clause 166, wherein the first charged-particle source and the second charged-particle source are charged-particle pulse generators.

168. The method of clause 167, wherein a pulse generator comprises a charged-particle emitter and a pulse laser generator.

169. The method of any one of clauses 166-168, wherein the first beam and the second beam are beams of clustered charged particles.

170. The method of any one of clauses 166-169, wherein the at least one deflector system comprises a radio-frequency cavity deflector.

171. The method of any one of clauses 166-170, wherein the receiving the first beam and the second beam comprises:
receiving the first beam in a first deflector and the second beam in a second deflector, wherein the at least one deflector system comprises the first deflector and the second deflector.

172. The method of any one of clauses 166-170, wherein the receiving the first beam and the second beam comprises:
receiving the first beam and the second beam in a deflector, wherein the at least one deflector system comprises the deflector.

173. The method of any one of clauses 171-172, wherein the first deflector and the second deflector are arranged to be on a same plane.

174. The method of any one of clauses 171-173, wherein the first deflector and the second deflector are arranged to be on different planes.

175. The method of any one of clauses 166-174, wherein the directing the first beam and the second beam in the predetermined time-space order comprises:
releasing the first beam and the second beam in sequence.

176. The method of any one of clauses 166-175, wherein the directing the first beam and the second beam in the predetermined time-space order comprises:
directing the first beam in a first direction and the second beam in a second direction.

177. The method of any one of clauses 166-176, wherein the predetermined time-space order comprises that a distance between the first beam and the second beam decreases after the at least one deflector system releases the first beam and the second beam.

178. The method of any one of clauses 166-177, wherein the predetermined time-space order comprises that the first beam and the second beam are parallel after the first beam and the second beam are released.

179. The method of any one of clauses 166-178, further comprising:
receiving the first beam by a first aperture and the second beam by a second aperture, wherein the first aperture and the second aperture are in an aperture plate downstream from the at least one deflector system.

180. The method of any one of clauses 166-179, wherein the directing the first beam and the second beam in the predetermined time-space order comprises:
forming a first cluster of charged particles using the first beam and a second cluster of charged particles using the second beam; and
releasing the first cluster and the second cluster in the predetermined time-space order.

181. The method of clause 180, wherein the releasing the first cluster and the second cluster in the predetermined time-space order comprises:
releasing the first cluster and the second cluster in sequence, wherein the first cluster and the second cluster pass the downstream position in sequence.

182. A non-transitory computer readable medium storing a set of instructions that is executable by one or more processors of a multi-beam apparatus to cause the multi-beam apparatus to perform a method for providing multiple charged-particle beams, the method comprising:
receiving, in at least one deflector system, a first beam of pulsed charged particles from a first charged-particle source and a second beam of pulsed charged particles from a second charged-particle source; and
directing the first beam and the second beam in a predetermined time-space order, wherein the first beam and the second beam pass a downstream position in sequence.

The controller may comprise switching circuits, timing control circuits, processors, data storage modules, analog and digital circuit components, input and output ports, a communication module, etc.

A non-transitory computer readable medium may be provided that stores instructions for a processor to carry out pulse generation, pulse detection, image inspection, image acquisition, stage positioning, beam focusing, electric field adjustment, beam bending, etc. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

It will be appreciated that the embodiments of the present disclosure are not limited to the exact construction that has been described above and illustrated in the accompanying drawings, and that various modifications and changes may be made without departing from the scope thereof. The present disclosure has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

The invention claimed is:

1. An apparatus for observing a sample, comprising:
   a deflector configured to form a plurality of deflected charged-particle beams from a primary charged-particle beam comprising a plurality of pulses of charged particles and deflect the plurality of pulses of charged particles to a plurality of probe spots on a sample;
   a detector configured to detect a plurality of signals from the sample that result from the plurality of pulses interacting with the sample; and
   a controller configured to correlate a particular detected signal to a particular probe spot on the sample based on a correlation between a time that the particular signal generated from the particular probe spot was detected and a time associated with a time that a particular charged particle pulse forming the particular probe spot was deflected.

2. The apparatus of claim 1, further comprising a charged-particle source, an acceleration cavity, and a bunching cavity.

3. The apparatus of claim 2, wherein the charged-particle source comprises a pulsed radio-frequency source having a source frequency in a range of 100 MHz to 10 GHz.

4. The apparatus of claim 1, wherein the deflector comprises one or more charged-particle deflectors, each of the one or more charged-particle deflectors deflecting the plurality of pulses of charged particles based on an operating frequency.

5. The apparatus of claim 3, wherein the deflector is synchronized with the charged-particle source such that an operating frequency and the source frequency are related by an equation:

$$v1 = \frac{1}{n}(v2)$$

where v1 is the operating frequency, v2 is the source frequency, and n is a positive integer.

6. The apparatus of claim 1, further comprising:
   an electron optical system; and
   a charged-particle beam scanning system configured to scan each of the plurality of deflected pulses of charged particles on the sample.

7. The apparatus of claim 6, wherein the electron optical system comprises one of a single-lens system or a multiple-lens system.

8. The apparatus of claim 6, wherein the controller is further configured to communicate with at least one of the deflector, the charged-particle beam scanning system, and the detector.

9. A method of observing a sample in a multi-beam apparatus, the method comprising:
   forming, using a deflector, a plurality of deflected charged-particle beams from a primary charged-particle beam comprising a plurality of charged-particle pulses;
   detecting, using a detector, a plurality of signals generated from a plurality of probe spots formed by the plurality of deflected charged-particle beams;
   obtaining, using a controller, a first timing information related with formation of a deflected charged-particle beam of the plurality of charged-particle beams, and a second timing information related with detection of a signal of the plurality of signals; and
   associating, using the controller, the signal with the deflected charged-particle beam based on the obtained first and second timing information.

10. The method of claim 9, wherein a pulsed radio-frequency charged-particle source is configured to generate the plurality of charged-particle pulses having a source frequency in a range of 100 MHz to 10 GHz.

11. The method of claim 9, wherein the deflector comprises one or more charged-particle deflectors, each of the one or more charged-particle deflectors forming the plurality of deflected charged-particle beams based on an operating frequency.

12. The method of claim 10, wherein the deflector is synchronized with the charged-particle source such that an operating frequency and the source frequency are related by an equation:

$$v1 = \frac{1}{n}(v2)$$

where v1 is the operating frequency, v2 is the source frequency, and n is a positive integer.

13. The method of claim 9, further comprising focusing the plurality of deflected charged-particle beams on the sample using an electron optical system.

14. The method of claim 9, further comprising scanning each of the plurality of deflected charged-particle beams on the sample using a charged-particle beam scanning system.

15. The method of claim 14, further comprising communicating, via the controller, with at least one of the deflector, the charged-particle beam scanning system, and the detector.

* * * * *